United States Patent
Kato et al.

(10) Patent No.: US 9,416,448 B2
(45) Date of Patent: *Aug. 16, 2016

(54) FILM DEPOSITION APPARATUS, SUBSTRATE PROCESSING APPARATUS, FILM DEPOSITION METHOD, AND COMPUTER-READABLE STORAGE MEDIUM FOR FILM DEPOSITION METHOD

(75) Inventors: Hitoshi Kato, Oshu (JP); Manabu Honma, Oshu (JP); Kohichi Orito, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 825 days.

This patent is subject to a terminal disclaimer.

(21) Appl. No.: 12/547,545

(22) Filed: Aug. 26, 2009

(65) Prior Publication Data

US 2010/0055297 A1    Mar. 4, 2010

(30) Foreign Application Priority Data

Aug. 29, 2008  (JP) .................................. 2008-222723
Aug. 29, 2008  (JP) .................................. 2008-222728
Jul. 14, 2009  (JP) .................................. 2009-165984

(51) Int. Cl.
*C23C 16/455*  (2006.01)
*C23C 16/458*  (2006.01)
*C23C 16/52*   (2006.01)

(52) U.S. Cl.
CPC ....... *C23C 16/45551* (2013.01); *C23C 16/4584* (2013.01); *C23C 16/45557* (2013.01); *C23C 16/52* (2013.01)

(58) Field of Classification Search
CPC .................. C23C 16/45551; C23C 16/45557; C23C 16/4584; C23C 16/52
See application file for complete search history.

(56) References Cited

U.S. PATENT DOCUMENTS

| | | | | |
|---|---|---|---|---|
| 4,854,266 A * | 8/1989 | Simson et al. | ................ | 118/728 |
| 5,281,274 A * | 1/1994 | Yoder | ............................ | 118/697 |
| 5,620,523 A * | 4/1997 | Maeda et al. | ............ | 118/723 IR |
| 5,744,049 A * | 4/1998 | Hills et al. | ...................... | 216/67 |
| 5,849,088 A | 12/1998 | DeDontney et al. | | |
| 5,906,354 A * | 5/1999 | Gilbert et al. | ................ | 251/214 |
| 6,279,503 B1 * | 8/2001 | Choi et al. | .................... | 118/715 |
| 6,340,501 B1 | 1/2002 | Kamiyama et al. | | |
| 6,634,314 B2 | 10/2003 | Hwang et al. | | |
| 7,153,542 B2 | 12/2006 | Nguyen et al. | | |
| 8,034,723 B2 * | 10/2011 | Ohizumi | ........... | C23C 16/45551 118/712 |
| 8,092,598 B2 | 1/2012 | Baek et al. | | |
| 8,372,202 B2 * | 2/2013 | Kato | ................ | H01L 21/02104 118/719 |
| 8,465,591 B2 * | 6/2013 | Kato | ..................... | C23C 16/402 118/719 |
| 8,465,592 B2 * | 6/2013 | Kato | ..................... | C23C 16/402 118/719 |
| 8,518,183 B2 * | 8/2013 | Honma | ............. | C23C 16/45551 118/715 |

(Continued)

FOREIGN PATENT DOCUMENTS

CN    1269046 A    10/2000
CN    101076878 A    11/2007

(Continued)

*Primary Examiner* — Jeffrie R Lund
(74) *Attorney, Agent, or Firm* — IPUSA, PLLC

(57) ABSTRACT

There is disclosed a film deposition apparatus and a film deposition method for depositing a film on a substrate by carrying out cycles of supplying in turn at least two source gases to the substrate in order to form a layer of a reaction product, and a computer readable storage medium storing a computer program for causing the film deposition apparatus to carry out the film deposition method.

27 Claims, 50 Drawing Sheets

(56) References Cited

U.S. PATENT DOCUMENTS

| | | | | |
|---|---|---|---|---|
| 8,673,079 B2* | 3/2014 | Kato | ..................... | C23C 16/401 118/719 |
| 8,673,395 B2* | 3/2014 | Kato | ................. | H01L 21/02104 427/248.1 |
| 8,721,790 B2* | 5/2014 | Kato | .................. | C23C 16/4412 118/715 |
| 8,746,170 B2* | 6/2014 | Orito | ................. | C23C 16/45502 118/663 |
| 8,808,456 B2* | 8/2014 | Kato | .................. | C23C 16/401 118/716 |
| 8,835,332 B2* | 9/2014 | Kato | ..................... | H01L 21/30 438/787 |
| 8,840,727 B2* | 9/2014 | Kato | ................. | C23C 16/45544 118/719 |
| 8,845,857 B2* | 9/2014 | Ohizumi | ........... | C23C 16/45546 118/728 |
| 8,854,449 B2* | 10/2014 | Aikawa | .................. | C23C 16/44 348/87 |
| 8,882,915 B2* | 11/2014 | Kato | ..................... | C23C 16/402 118/715 |
| 8,882,916 B2* | 11/2014 | Kumagai | .......... | C23C 16/45536 118/719 |
| 8,906,246 B2* | 12/2014 | Kato | ................. | H01L 21/02164 156/345.44 |
| 8,951,347 B2* | 2/2015 | Kato | ................. | C23C 16/45519 118/715 |
| 8,961,691 B2* | 2/2015 | Kato | ................. | C23C 16/45521 118/666 |
| 8,962,495 B2* | 2/2015 | Ikegawa | ............. | H01L 21/0262 118/719 |
| 8,992,685 B2* | 3/2015 | Kato | ................. | H01L 21/67109 118/719 |
| 9,023,738 B2* | 5/2015 | Kato | ..................... | H01L 21/30 438/787 |
| 9,040,434 B2* | 5/2015 | Kato | ................. | H01L 21/02263 118/724 |
| 9,053,909 B2* | 6/2015 | Kato | ..................... | C23C 16/452 |
| 9,103,030 B2* | 8/2015 | Kato | ..................... | C23C 16/402 |
| 9,111,747 B2* | 8/2015 | Yamawaku | ....... | H01L 21/02104 |
| 9,136,133 B2* | 9/2015 | Oshimo | .................. | C23C 16/34 |
| 2002/0195056 A1 | 12/2002 | Sandhu et al. | ................ | 118/719 |
| 2004/0052972 A1* | 3/2004 | Schmitt | ........................ | 427/569 |
| 2005/0189074 A1* | 9/2005 | Kasai | ................ | G05D 16/2026 156/345.33 |
| 2006/0177579 A1* | 8/2006 | Shin et al. | ........................ | 427/248.1 |
| 2006/0196538 A1* | 9/2006 | Kubista et al. | .................. | 137/14 |
| 2007/0079758 A1* | 4/2007 | Holland | ............. | C23C 16/4412 118/715 |
| 2007/0151668 A1* | 7/2007 | Mizusawa | ......... | C23C 16/45557 156/345.29 |
| 2007/0215036 A1* | 9/2007 | Park et al. | ....................... | 117/88 |
| 2007/0218701 A1 | 9/2007 | Shimizu et al. | | |
| 2007/0218702 A1* | 9/2007 | Shimizu et al. | .............. | 438/758 |
| 2008/0208385 A1* | 8/2008 | Sakamoto et al. | ............ | 700/121 |
| 2008/0216864 A1* | 9/2008 | Sexton et al. | .................. | 134/1.2 |
| 2009/0272402 A1* | 11/2009 | Kim et al. | ..................... | 134/1.2 |
| 2009/0324826 A1* | 12/2009 | Kato | ................. | C23C 16/45551 427/255.28 |
| 2009/0324828 A1* | 12/2009 | Kato | .................... | C23C 16/402 427/255.28 |
| 2010/0050942 A1* | 3/2010 | Kato | .................... | C23C 16/401 118/730 |
| 2010/0050943 A1* | 3/2010 | Kato | .................... | C23C 16/401 118/730 |
| 2010/0050944 A1* | 3/2010 | Kato | .................... | C23C 16/401 118/730 |
| 2010/0055297 A1* | 3/2010 | Kato | .................... | C23C 16/45551 427/8 |
| 2010/0055312 A1* | 3/2010 | Kato | .................... | C23C 16/45502 427/255.26 |
| 2010/0055314 A1* | 3/2010 | Kato | ................. | H01L 21/02104 427/255.28 |
| 2010/0055315 A1* | 3/2010 | Honma | ............. | C23C 16/45551 427/255.28 |
| 2010/0055316 A1* | 3/2010 | Honma | ............. | C23C 16/45551 427/255.28 |
| 2010/0055319 A1* | 3/2010 | Kato | ................. | C23C 16/45544 427/255.28 |
| 2010/0055320 A1* | 3/2010 | Honma | ............. | C23C 16/45544 427/255.28 |
| 2010/0055347 A1* | 3/2010 | Kato | .................... | C23C 16/452 427/569 |
| 2010/0055351 A1* | 3/2010 | Kato | ................. | C23C 16/45521 427/595 |
| 2010/0116210 A1* | 5/2010 | Kato | .................... | C23C 16/4584 118/730 |
| 2010/0124610 A1* | 5/2010 | Aikawa | ............... | C23C 16/4584 427/255.28 |
| 2010/0132614 A1* | 6/2010 | Kato | .................... | C23C 16/402 118/723 R |
| 2010/0132615 A1* | 6/2010 | Kato | .................... | C23C 16/402 118/725 |
| 2010/0136795 A1* | 6/2010 | Honma | ............. | C23C 16/45551 438/758 |
| 2010/0151131 A1* | 6/2010 | Obara | ............... | C23C 16/4412 427/255.28 |
| 2010/0227046 A1* | 9/2010 | Kato | .................... | C23C 16/402 427/10 |
| 2010/0227059 A1* | 9/2010 | Kato | ................. | C23C 16/45551 427/255.28 |
| 2010/0260935 A1* | 10/2010 | Kato | .................... | C23C 16/402 427/255.28 |
| 2010/0260936 A1* | 10/2010 | Kato | ................. | H01L 21/67109 427/255.28 |
| 2011/0039026 A1* | 2/2011 | Kato | .................... | C23C 16/402 427/255.26 |
| 2011/0048326 A1* | 3/2011 | Kato | .................... | C23C 16/402 118/723 R |
| 2011/0100489 A1* | 5/2011 | Orito | ................. | C23C 16/45502 137/560 |
| 2011/0104395 A1* | 5/2011 | Kumagai | ............... | C23C 16/402 427/554 |
| 2011/0126985 A1* | 6/2011 | Ohizumi | ........... | C23C 16/45546 156/345.55 |
| 2011/0139074 A1* | 6/2011 | Kato | .................... | C23C 16/4412 118/730 |
| 2011/0151122 A1* | 6/2011 | Kato | .................... | C23C 16/402 427/255.23 |
| 2011/0155056 A1* | 6/2011 | Kato | ................. | C23C 16/45538 118/719 |
| 2011/0155057 A1* | 6/2011 | Kato | ................. | C23C 16/45519 118/719 |
| 2011/0159187 A1* | 6/2011 | Kato | ................. | C23C 16/45544 427/255.26 |
| 2011/0159188 A1* | 6/2011 | Kato | ........................ | C23C 16/34 427/255.394 |
| 2011/0159702 A1* | 6/2011 | Ohizumi | ........... | C23C 16/45551 438/778 |
| 2011/0214611 A1* | 9/2011 | Kato | ................. | C23C 16/45519 118/719 |
| 2011/0236598 A1* | 9/2011 | Kumagai | .......... | C23C 16/45536 427/569 |
| 2012/0075460 A1* | 3/2012 | Aikawa | .................. | C23C 16/44 348/87 |
| 2012/0076937 A1* | 3/2012 | Kato | ................. | C23C 16/45551 427/248.1 |
| 2012/0222615 A1* | 9/2012 | Kato | ................. | H01L 21/68764 118/719 |
| 2012/0267341 A1* | 10/2012 | Kato | ................. | H01L 21/02164 216/37 |
| 2013/0059415 A1* | 3/2013 | Kato | .................... | C23C 16/345 438/106 |
| 2013/0122718 A1* | 5/2013 | Kato | ................. | H01L 21/02104 438/758 |
| 2013/0164942 A1* | 6/2013 | Kato | ..................... | H01L 21/30 438/758 |
| 2013/0251904 A1* | 9/2013 | Kato | .................... | C23C 16/402 427/255.7 |
| 2013/0337635 A1* | 12/2013 | Yamawaku | ....... | H01L 21/02104 438/466 |
| 2013/0337658 A1* | 12/2013 | Ikegawa | ............. | H01L 21/0262 438/782 |

(56) References Cited

U.S. PATENT DOCUMENTS

| | | | |
|---|---|---|---|
| 2014/0017909 A1* | 1/2014 | Kato | H01L 21/02263 438/787 |
| 2014/0170859 A1* | 6/2014 | Yamawaku | H01L 21/68764 438/778 |
| 2014/0174351 A1* | 6/2014 | Aikawa | C23C 16/44 118/713 |
| 2014/0199856 A1* | 7/2014 | Kato | H01L 21/68771 438/782 |
| 2014/0213068 A1* | 7/2014 | Kato | C23C 16/45544 438/765 |
| 2014/0220260 A1* | 8/2014 | Yamawaku | C23C 16/45519 427/569 |
| 2014/0345523 A1* | 11/2014 | Kikuchi | C23C 16/45551 118/712 |
| 2014/0349032 A1* | 11/2014 | Kato | H01L 21/30 427/569 |
| 2015/0011087 A1* | 1/2015 | Oshimo | C23C 16/34 438/680 |
| 2015/0024143 A1* | 1/2015 | Kumagai | C23C 16/45536 427/535 |
| 2015/0078864 A1* | 3/2015 | Sato | H01L 21/68742 414/222.08 |
| 2015/0079807 A1* | 3/2015 | Tamura | H01L 21/02164 438/787 |
| 2015/0184293 A1* | 7/2015 | Kato | C23C 16/402 438/788 |
| 2015/0184294 A1* | 7/2015 | Kato | C23C 16/34 118/697 |
| 2015/0214029 A1* | 7/2015 | Hane | H01L 21/0228 438/782 |
| 2015/0225849 A1* | 8/2015 | Kato | C23C 16/4584 438/793 |

FOREIGN PATENT DOCUMENTS

| | | |
|---|---|---|
| JP | 04-287912 | 10/1992 |
| JP | 3144664 | 3/2001 |
| JP | 2001-254181 | 9/2001 |
| JP | 2007-247066 | 9/2007 |

* cited by examiner

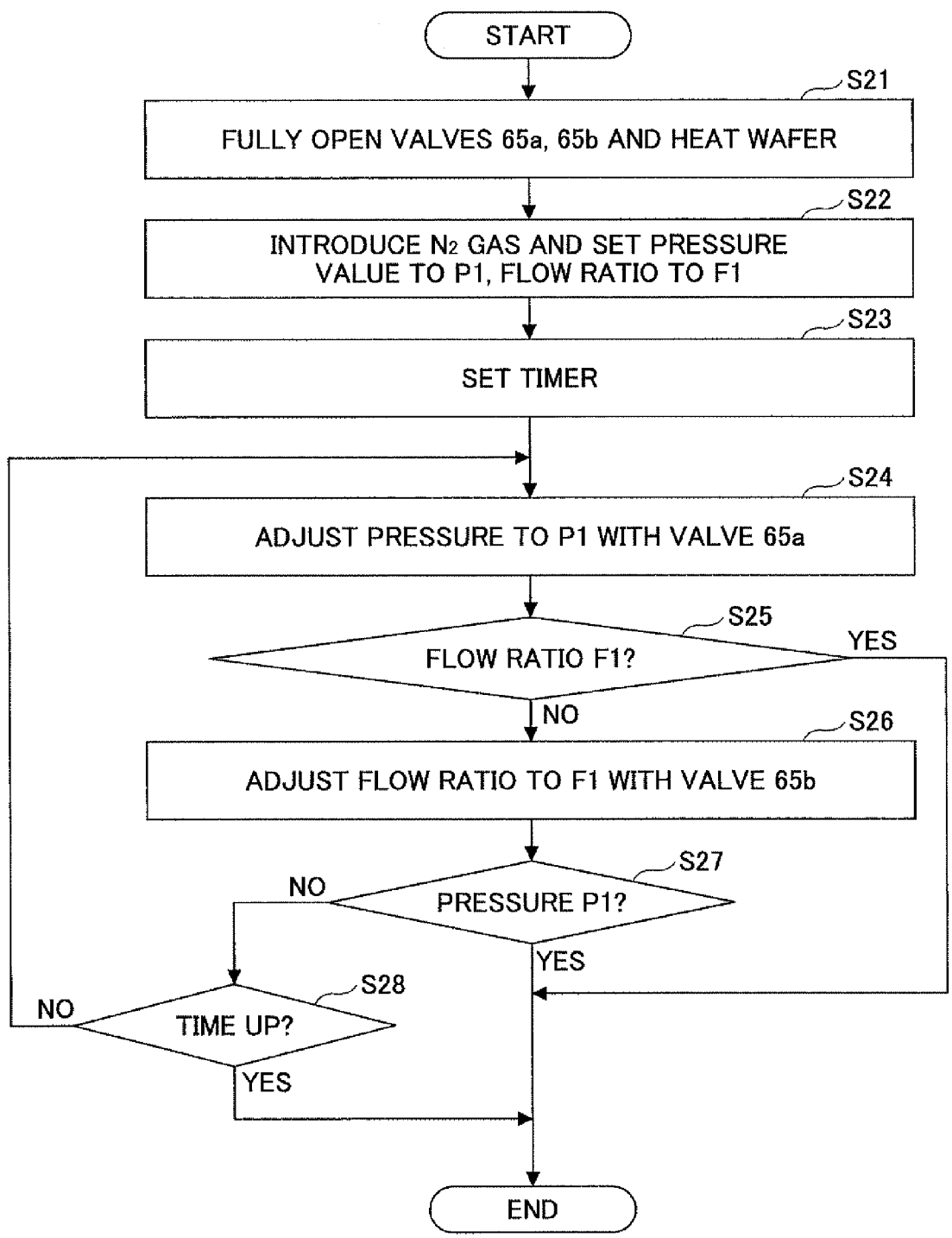

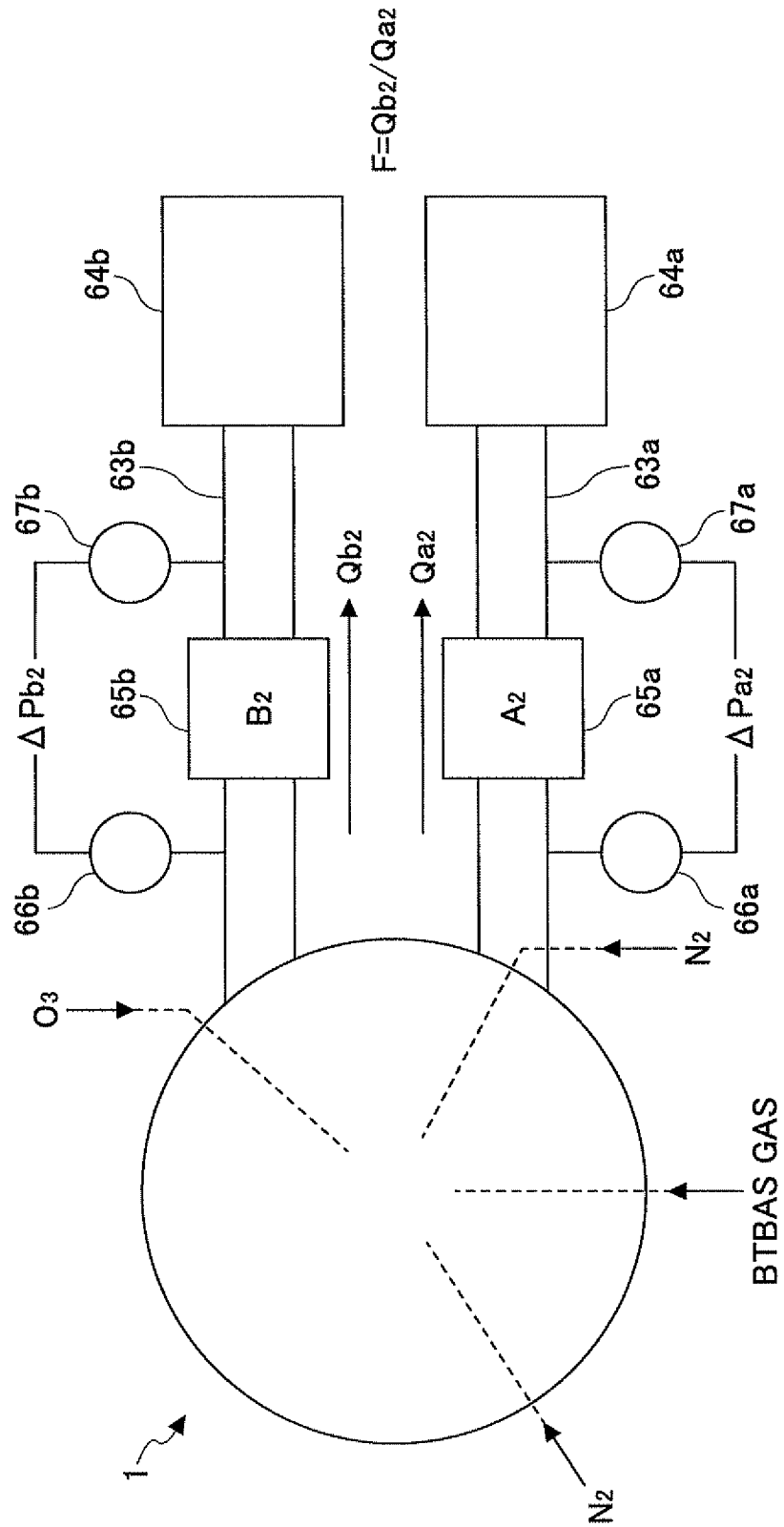

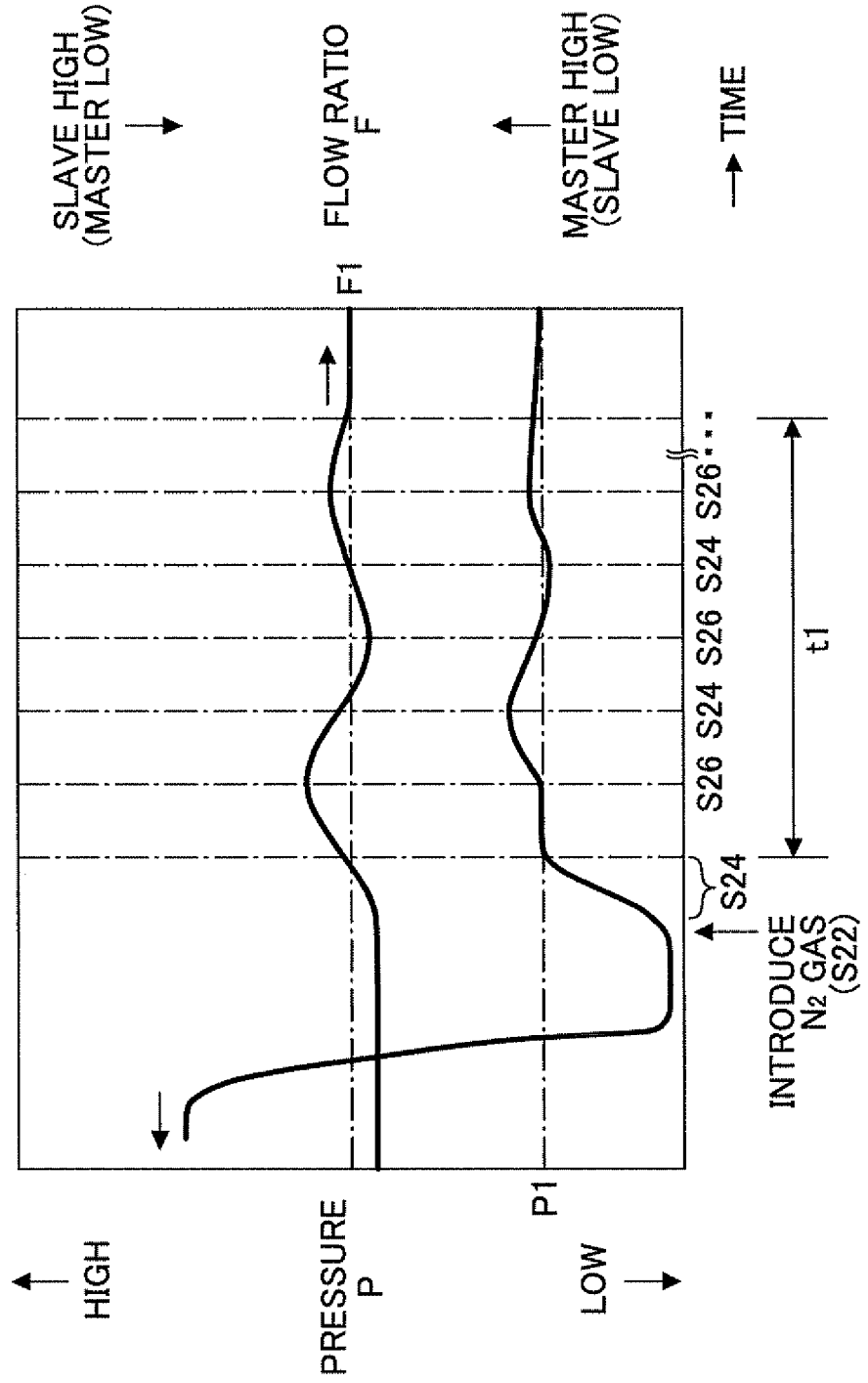

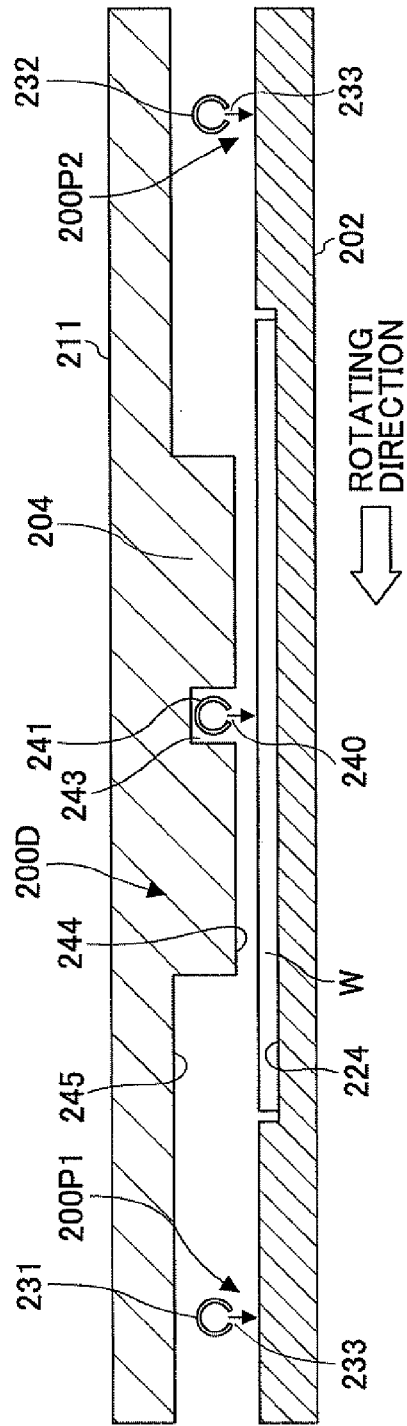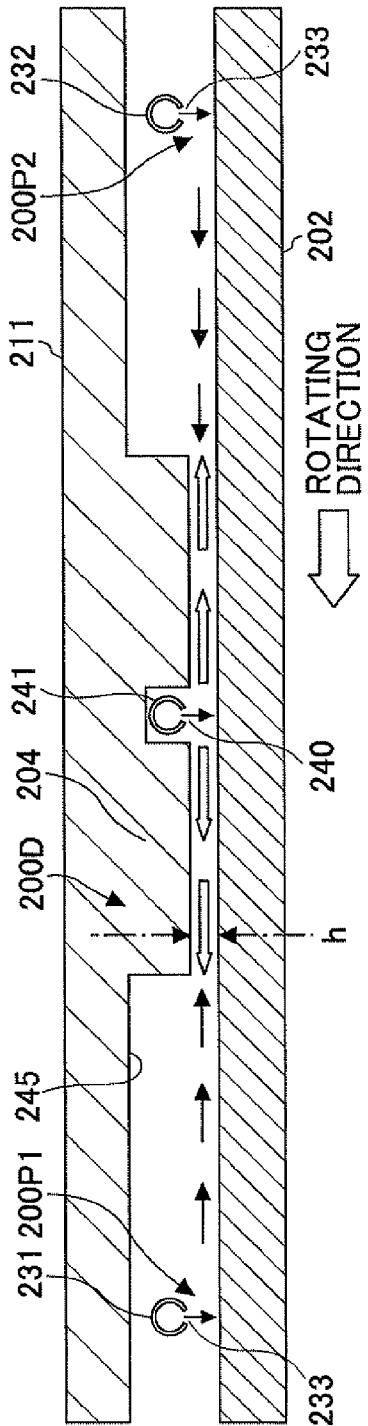

FILM DEPOSITION APPARATUS, SUBSTRATE PROCESSING APPARATUS, FILM DEPOSITION METHOD, AND COMPUTER-READABLE STORAGE MEDIUM FOR FILM DEPOSITION METHOD

CROSS-REFERENCE TO RELATED APPLICATION

This application is a continuation-in-part of and claims the benefit of priority of Japanese Patent Applications Nos. 2008-222723, 2008-222728, and No. 2009-165984, filed on Aug. 29, 2008, Aug. 29, 2008, and Jul. 14, 2009, with the Japanese Patent Office, the entire contents of which are hereby incorporated by reference.

BACKGROUND OF THE INVENTION

1. Field of the Invention

The present invention relates to a film deposition apparatus and a film deposition method for depositing a film on a substrate by carrying out cycles of supplying in turn at least two source gases to the substrate in order to form a layer of a reaction product, and a computer readable storage medium storing a computer program for causing the film deposition apparatus to carry out the film deposition method.

2. Description of the Related Art

As a film deposition technique in a semiconductor fabrication process, there is a technique in which a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer; and such an alternating adsorption of the gases is repeated plural times, thereby depositing a film on the wafer. This technique is referred to, for example, Atomic Layer Deposition (ALD) or Molecular Layer Deposition (MLD). This technique is advantageous in that the film thickness can be controlled at higher accuracy by the number of times alternately supplying the gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis(tertiary-butylamino) silane (BTBAS) gas or the like is used as a first reaction gas (source gas) and ozone gas or the like is used as a second gas (oxidation gas).

In order to carry out such a deposition method, use of a single-wafer deposition apparatus is being considered. The single-wafer deposition apparatus includes a vacuum chamber having a pedestal provided therein and a shower head placed at a top portion of the vacuum chamber facing the pedestal. With such a deposition method using the deposition apparatus, reaction gases are supplied from the shower head to a wafer placed on the pedestal, and unreacted gases and by-products are evacuated from a bottom portion of the chamber. In this case, when plural reaction gases are mixed inside the vacuum chamber, reaction products are generated. This results in the formation of particles. With this deposition apparatus, it is necessary to supply, for example, inert gas as purge gas to replace one reaction gas with another. Replacing of reaction gases takes a long time and the number of cycles may reach several hundred. This results in a problem of an extremely long process time. Therefore, a deposition method and apparatus that enable high throughput is desired.

Under these circumstances, use of an apparatus disclosed in Patent Documents 1-4 is being considered. In schematically describing this apparatus, the apparatus has a vacuum chamber including a pedestal for placing plural wafers arranged in a circumferential direction (rotation direction) and a gas supplying part being placed above the vacuum chamber facing the pedestal for supplying process gas to the wafers. The gas supplying part is arranged, for example, in plural areas in a circumferential direction so that they correspond to the arrangement of wafers on the pedestal.

In order to decompress the inside of the vacuum chamber having wafers placed on the pedestal at a predetermined process pressure, the pedestal and the plural gas supplying parts are relatively rotated around a vertical axis along with heating the wafers and supplying plural kinds of gases (the above-described first and second reaction gases) on the surface of the wafers from each of the gas supplying parts. Further, in order to prevent reaction gases from mixing inside the vacuum chamber, a process area formed by the first process gas and another process area formed by the second process gas are partitioned inside the vacuum chamber by providing physical partition walls between the gas supplying parts or forming a gas curtain with inert gas.

Accordingly, although plural kinds of gases are simultaneously supplied into the same vacuum chamber, because the process areas are partitioned for preventing reaction gases from mixing, the first and second reaction gases, from the standpoint of the rotating wafer, can be alternately supplied via the partition walls or the gas curtain. Therefore, a film deposition process is performed using the above-described method. Accordingly, benefits such as being able to perform film deposition in a short time owing to no need for gas replacement and being able to reduce the consumption amount of inert gas (e.g., purge gas) can be attained.

In introducing plural kinds of reaction gases into the same vacuum chamber, this apparatus not only needs to prevent the reaction gases from mixing with each other in the vacuum chamber but also needs to maintain a constant gas flow with respect to the wafers by strictly controlling the gas flow of the reaction gases in the vacuum chamber. In other words, because this apparatus has plural process areas formed in the vacuum chamber, turbulence of the gas flow to the wafers causes the size of the process areas, that is, the reaction time between the wafer and the reaction gases, to change. This may affect the quality of the thin film formed by the film deposition.

In a case where turbulence of gas flow of reaction gases inside the vacuum containers is caused in an in-plane part or a space between the surfaces of the wafers (e.g., a case where a necessary amount of reaction gas is not supplied to the wafers), there is a risk of the film thickness becoming reduced due to insufficient attraction of the reaction gases or degrading of film quality due to, for example, insufficient progress of an oxidation reaction. Further, in a case where reaction gases are mixed via the partition walls or the gas curtain due to turbulence of gas flow, reaction products are generated. The generation of the reaction products causes the formation of particles. Thus, although it is necessary to strictly control the gas flow of the reaction gases, the above-described partition walls or gas curtain is insufficient. Further, even in a case where there is a turbulence of gas flow during processing, such turbulence cannot be recognized.

Furthermore, because this apparatus processes the wafers while maintaining the inside of the vacuum chamber at a predetermined degree of vacuum (pressure), it is necessary to control both the degree of vacuum inside the vacuum chamber and the gas flow of the reaction gases in the vacuum chamber. Therefore, control of the gas flow is extremely difficult. Furthers because the degree of vacuum inside the vacuum chamber or the flow rate of the reaction gases changes according to the recipe of the process performed on the wafers, it is necessary to control the degree of vacuum or the gas flow of the reaction gases with respect to each recipe. This further makes the control difficult. Nevertheless, no consideration is made regarding the control of the gas flow in the above-described Patent Documents.

Patent Document 5 discloses a method of separating a vacuum chamber into a left-side area and a right-side area, forming a gas supply opening and an evacuation opening in each of the areas, supplying different gases in each of the areas, and evacuating gases from each of the areas. However, there is no mention regarding the gas flow inside the vacuum chamber, that is, regarding the flow rate of, for example, the gas evacuated from each evacuation opening. Therefore, even in a case where evacuation flow rate changes with time (e.g., due to accumulation of particles in the evacuation passage) and results in a loss of balance of the evacuation flow rate between the left and right areas (one side evacuation), such loss of balance cannot be recognized. Further, in a case where an evacuation pump is provided to each of plural evacuation channels, a difference of evacuation performance among the evacuation pumps may occur depending on the status of each evacuation pump. However, there is no mention in Patent Document 5 regarding such difference.

Furthermore, Patent Documents 6 through 8 disclose a film deposition apparatus preferably used for an Atomic Layer CVD method that causes plural gases to be alternately adsorbed on a target (a wafer). In this apparatus, a susceptor that holds the wafer is rotated, while source gases and purge gases are supplied to the susceptor from above. In this apparatus, a gas curtain is formed by inert gas, and the source gases and purge gases are separately evacuated from evacuation channels 30a and 30b. However, as with the Patent Document 5, there is no mention regarding the flow rate of the gas evacuated from each of the evacuation channels 30a, 30b.

Furthermore, there is known a method of providing an evacuation channel with a valve that can have its opening adjusted and estimating the flow rate of evacuation gas flowing in an evacuation channel from the opening of the valve. This method, however, does not measure the actual flow rate of evacuation gas. Therefore, the actual flow rate of evacuation cannot be recognized in a case where, for example, there is a change in the evacuation performance of the evacuation pump as described above.

Patent Document 1: U.S. Pat. No. 6,634,314
Patent Document 2: Japanese Patent Application Laid-Open Publication No. 2001-254181 (FIGS. 1, 2)
Patent Document 3: Japanese Patent Publication No. 3,144,664 (FIGS. 1, 2, claim 1)
Patent Document 4: Japanese Patent Application Laid-Open Publication No. H4-287912
Patent Document 5: U.S. Pat. No. 7,153,542 (FIGS. 6A, 6B)
Patent Document 6: Japanese Patent Application Laid-Open Publication No. 2007-247066 (paragraphs 0023 through 0025, 0058, FIGS. 12 and 18)
Patent Document 7: United States Patent Publication No. 2007-218701
Patent Document 8: United States Patent Publication No. 2007-218702

SUMMARY OF THE INVENTION

The present invention has been made in view of the above circumstances, and is directed to a film deposition apparatus, a film deposition method, and a computer-readable storage medium storing a computer program that causes the film deposition apparatus to carry out the film deposition method, which enable film deposition by alternately supplying plural reaction gases to a substrate in a vacuum chamber to produce plural layers of the reaction products of the reaction gases on the substrate and reduce the amount of separation gas supplied to separation areas provided along a circumferential direction of a rotation table on which the substrate is placed to separate a first process area to which a first reaction gas is supplied and a second process area to which a second reaction gas is supplied.

In order to achieve the above objective, a first aspect of the present invention provides a film deposition apparatus for depositing a film on a substrate by carrying out a cycle of alternately supplying at least two kinds of reaction gases that react with each other to the substrate to produce a layer of a reaction product in a chamber, the film deposition apparatus including: a rotation table provided in the chamber, the rotation table having a substrate receiving area for mounting the substrate thereon; a first reaction gas supplying part configured to supply a first reaction gas to one surface of the rotation table on which the substrate receiving area is provided; a second reaction gas supplying part configured to supply a second reaction gas to the one surface, the second reaction gas supplying part being separated from the first reaction gas supplying part along a circumferential direction of the rotation table; a separation area located along the circumferential direction between a first process area to which the first reaction gas is supplied and a second process area to which the second reaction gas is supplied, the separation area including a separation gas supplying part from which a separation gas is supplied; a first evacuation channel having an evacuation port between the first process area and the separation area; a second evacuation channel having an evacuation port between the second process area and the separation area; a first evacuation part connected to the first evacuation channel via a first valve; a second evacuation part connected to the second evacuation channel via a second valve; a first pressure detecting part interposed between the first valve and the first evacuation part; a second pressure detecting part interposed between the second valve and the second evacuation part; a process pressure detecting part provided in at least one of the first and second valves; and a control part configured to output a control signal for controlling opening of the first and second valves based on a pressure detection value detected from each of the first and second pressure detecting parts so that each of the pressure inside the chamber and the flow ratio between the gases flowing in the first and second evacuation channels becomes a predetermined value, respectively.

A second aspect of the present invention provides a film deposition apparatus for depositing a film on a substrate by carrying out a cycle of alternately supplying at least two kinds of reaction gases that react with each other to the substrate to produce a layer of a reaction product in a chamber, the film deposition apparatus including: a rotation table provided in the chamber, the rotation table having a substrate receiving area for mounting the substrate thereon; a first reaction gas supplying part configured to supply a first reaction gas to one surface of the rotation table on which the substrate receiving area is provided; a second reaction gas supplying part configured to supply a second reaction gas to the one surfacer the second reaction gas supplying part being separated from the first reaction gas supplying part along a circumferential direction of the rotation table; a separation area located along the circumferential direction between a first process area to which the first reaction gas is supplied and a second process area to which the second reaction gas is supplied, the separation area including a separation gas supplying part from which a separation gas is supplied; a first evacuation channel having an evacuation port between the first process area and the separation area; a second evacuation channel having an evacuation port between the second process area and the separation area; a first evacuation part connected to the first evacuation channel via a first valve; a second evacuation part connected to the second evacuation channel via a second valve; a first process pressure detecting part interposed between the first valve and the first evacuation part; a second process pressure detecting part interposed between the second valve and the second evacuation part; and a control part configured to output a control signal for controlling opening of the first and second valves based on a pressure detection value detected from each of the first and second pressure detecting parts so that each of the pressure inside the chamber and the pressure difference between the first and second process areas becomes a predetermined value, respectively.

A third aspect of the present invention provides a film deposition method for depositing a film on a substrate by carrying out a cycle of alternately supplying at least two kinds of reaction gases that react with each other to the substrate to produce a layer of a reaction product in a chamber, the film deposition method including the steps of: mounting the substrate substantially horizontally onto a rotation table provided inside the chamber; rotating the rotation table; supplying a first reaction gas to one surface of the rotation table on which a substrate receiving area is provided, from a first reaction gas supplying part; supplying a second reaction gas to the one surface from a second reaction gas supplying part, the second reaction gas supplying part being separated from the first reaction gas supplying part along a circumferential direction of the rotation table; supplying a separation gas from a separation gas supplying part provided in a separation area located between the first reaction gas supplying part and the second reaction gas supplying part; evacuating the first reaction gas of the first process area from a first evacuation part via a first evacuation channel having an evacuation port between the first process area and the separation area; evacuating the second reaction gas of the second process area from a second evacuation part via a second evacuation channel having an evacuation port between the second process area and the separation area; detecting the pressure inside the chamber, a first pressure between a first valve of the first evacuation channel and the first evacuation part, and a second pressure between a second valve of the second evacuation channel and the second evacuation port; and adjusting opening of the first and second valves based on pressure detection values detected in the detecting step so that each of the pressure inside the chamber and the flow ratio between the gases flowing in the first and second evacuation channels becomes a predetermined value, respectively.

A fourth aspect of the present invention provides a film deposition method for depositing a film on a substrate by carrying out a cycle of alternately supplying at least two kinds of reaction gases that react with each other to the substrate to produce a layer of a reaction product in a chamber, the film deposition method including the steps of: mounting the substrate substantially horizontally onto a rotation table provided inside the chamber; rotating the rotation table; supplying a first reaction gas to one surface of the rotation table on which a substrate receiving area is provided, from a first reaction gas supplying part; supplying a second reaction gas to the one surface from a second reaction gas supplying part, the second reaction gas supplying part being separated from the first reaction gas supplying part along a circumferential direction of the rotation table; supplying a separation gas from a separation gas supplying part provided in a separation area located between the first reaction gas supplying part and the second reaction gas supplying part; evacuating the first process area from a first evacuation part via a first evacuation channel having an evacuation port between the first process area and the separation area; evacuating the second process area from a second evacuation part via a second evacuation channel having an evacuation port between the second process area and the separation area; detecting a first pressure between a first valve of the first evacuation channel and the first evacuation part and a second pressure between a second valve of the second evacuation channel and the second evacuation port; and adjusting opening of the first and second valves based on pressure detection values detected in the detecting step so that each of the pressure inside the chamber and the pressure difference between the first process area and the second process area becomes a predetermined value, respectively.

A fifth aspect of the present invention provides a film deposition apparatus for depositing a film on a substrate by carrying out a cycle of alternately supplying at least two kinds of reaction gases that react with each other to the substrate to produce a layer of a reaction product in a chamber, the film deposition apparatus including: a rotation table provided in the chamber, the rotation table having a substrate receiving area for mounting the substrate thereon; a first reaction gas supplying part configured to supply a first reaction gas to one surface of the rotation table on which the substrate receiving area is provided; a second reaction gas supplying part configured to supply a second reaction gas to the one surface, the second reaction gas supplying part being separated from the first reaction gas supplying part along a circumferential direction of the rotation table; a separation area located along the circumferential direction between a first process area to which the first reaction gas is supplied and a second process area to which the second reaction gas is supplied, the separation area including a separation gas supplying part from which a separation gas is supplied; a ceiling surface located on both sides of the separation gas supplying part relative to a rotation direction for forming a narrow space between the rotation table and the ceiling surface for allowing the separation gas to flow from the separation area to the first and second process areas; a center portion area located at a center part of the chamber, the center portion area having an ejecting port for ejecting the separation gas to the one surface of the rotation table; a first evacuation channel having an evacuation port between the first process area and the separation area; a second evacuation channel having an evacuation port between the second process area and the separation area; a first evacuation part connected to the first evacuation channel; and a second evacuation part connected to the second evacuation channel.

A sixth aspect of the present invention provides a film deposition method for depositing a film on a substrate by carrying out a cycle of alternately supplying at least two kinds of reaction gases that react with each other to the substrate to produce a layer of a reaction product in a chamber, the film deposition method including the steps of: mounting the substrate substantially horizontally onto a rotation table provided inside the chamber; rotating the rotation table; supplying a first reaction gas to one surface of the rotation table on which a substrate receiving area is provided, from a first reaction gas supplying part; supplying a second reaction gas to the one surface from a second reaction gas supplying part, the second reaction gas supplying part being separated from the first reaction gas supplying part along a circumferential direction of the rotation table; supplying a separation gas from a separation gas supplying part provided in a separation area located between the first reaction gas supplying part and the second reaction gas supplying part; diffusing the separation gas in a narrow space between the rotation table and a ceiling surface provided on both sides of the separation gas supplying part in a manner facing the rotation table by supplying the separation gas from the separation gas supplying part provided in the separation area between the first and second reaction gas supplying parts; ejecting the separation gas to the one surface of the rotation table from an ejection port formed in a center portion area located at a center part of the chamber; evacuating the separation gas and the first reaction gas from the first process area and evacuating the separation gas and the second reaction gas from the second process area by evacuating the separation gas and the first reaction gas via a first evacuation channel having an evacuation port between the first process area and the separation area and evacuating the separation gas and the second reaction gas via a second evacuation channel having an evacuation port between the second process area and the separation area; evacuating the separation gas and the first reaction gas from a first evacuation part connected to the first evacuation channel; and evacuating the separation gas and the second reaction gas from a second evacuation part connected to the second evacuation channel.

BRIEF DESCRIPTION OF THE DRAWINGS

Other objects, features and advantages of the present invention will become more apparent from the following detailed description when read in conjunction with the accompanying drawings, in which:

FIG. 11 is a flowchart illustrating an example in a case of adjusting an evacuation flow rate with the film deposition apparatus according to the first embodiment of the present invention;

FIGS. 12A-12C are schematic diagrams illustrating, for example, the flow rate of gas flowing in the evacuation channels of the film deposition apparatus according to the first embodiment of the present invention;

FIG. 13 is a schematic diagram illustrating a state of adjusting the flow rate of gas flowing in the evacuation channels of the film deposition apparatus according to the first embodiment of the present invention;

FIGS. 35A and 35B are vertical cross-sectional views illustrating process areas and a separation area of the film deposition apparatus according to the third embodiment of the present invention;

DETAILED DESCRIPTION OF THE PREFERRED EMBODIMENT

Figure 1:
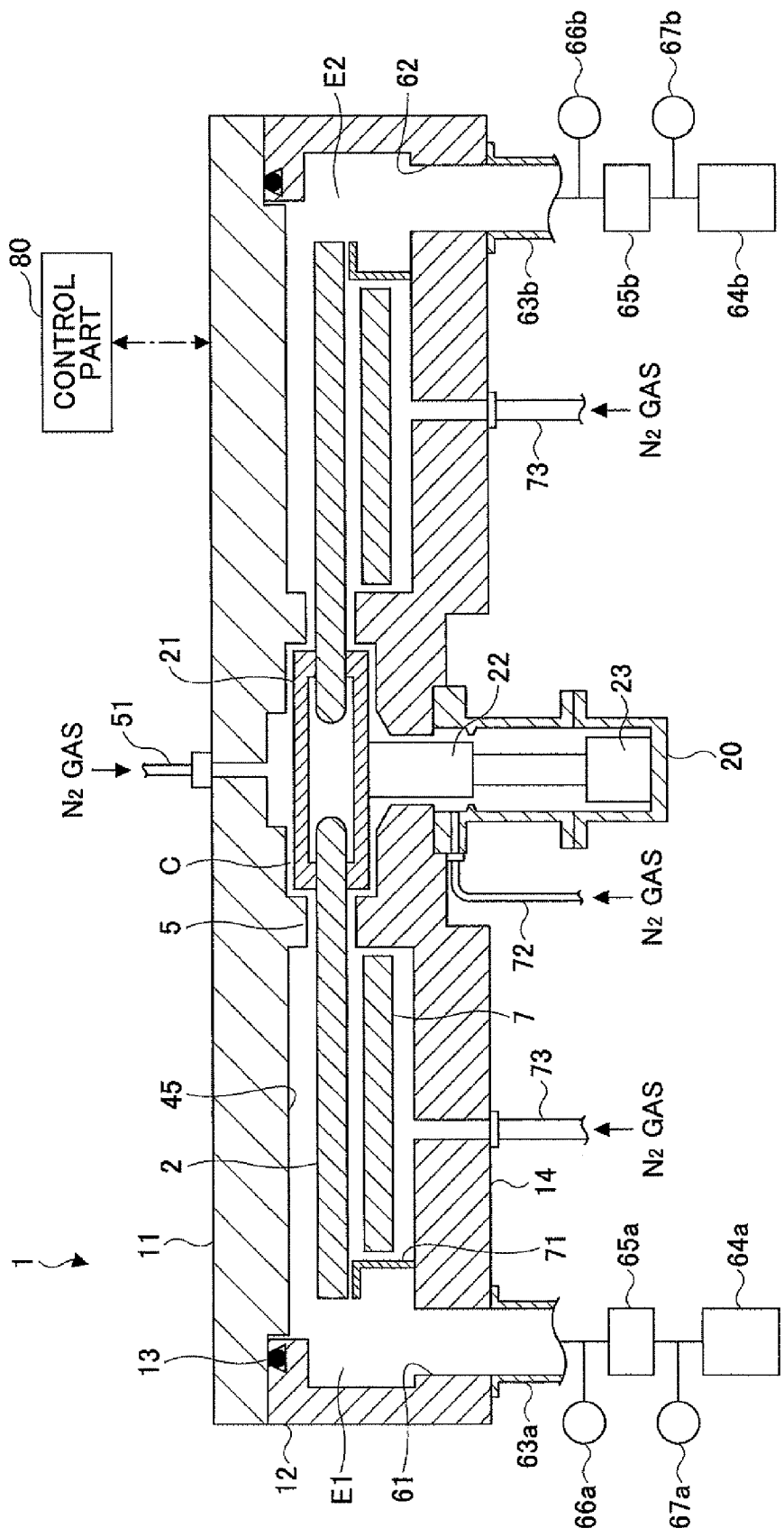
FIG. 1 is a vertical cross-sectional diagram of a film deposition apparatus according to a first embodiment of the present invention.

Non-limiting, exemplary embodiments of the present invention will now be described with reference to the accompanying drawings. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

According to the below-described embodiments of the present invention, process areas for processing plural reaction gases, which react with each other, are formed in the same vacuum chamber along a rotation direction of a rotation table. In performing thin film deposition by forming plural layers of a reaction product in the plural process areas by alternately passing a substrate through the plural process areas by using the rotation table, separation areas for supplying separation gas are provided between the process areas along with providing first and second evacuation channels with evacuation openings for separately evacuating the different reaction gases. Further, valves provided to each of the evacuation channels are adjusted so that the pressure in the vacuum chamber becomes a predetermined value, and the flow rate of the gas evacuated from each evacuation channel or the pressure difference between the process areas becomes a predetermined value. Accordingly, a suitable gas flow can be stably provided in both sides of the separation areas. Thus, because the gas flow of reaction gases on the surface of the substrate can be uniform, a thin film can be provided with a uniform film thickness and an even film quality with respect to an in-plane direction or in-between surfaces of the substrate. Further, bias of evacuation between the separation areas on both sides can be prevented. Therefore, the reaction gases can be prevented from passing through the separation areas and mixing with each other. Accordingly, reaction products can be prevented from being formed on areas other than the surface of the substrate. Thus, formation of particles can be prevented.

First Embodiment

Figure 3:
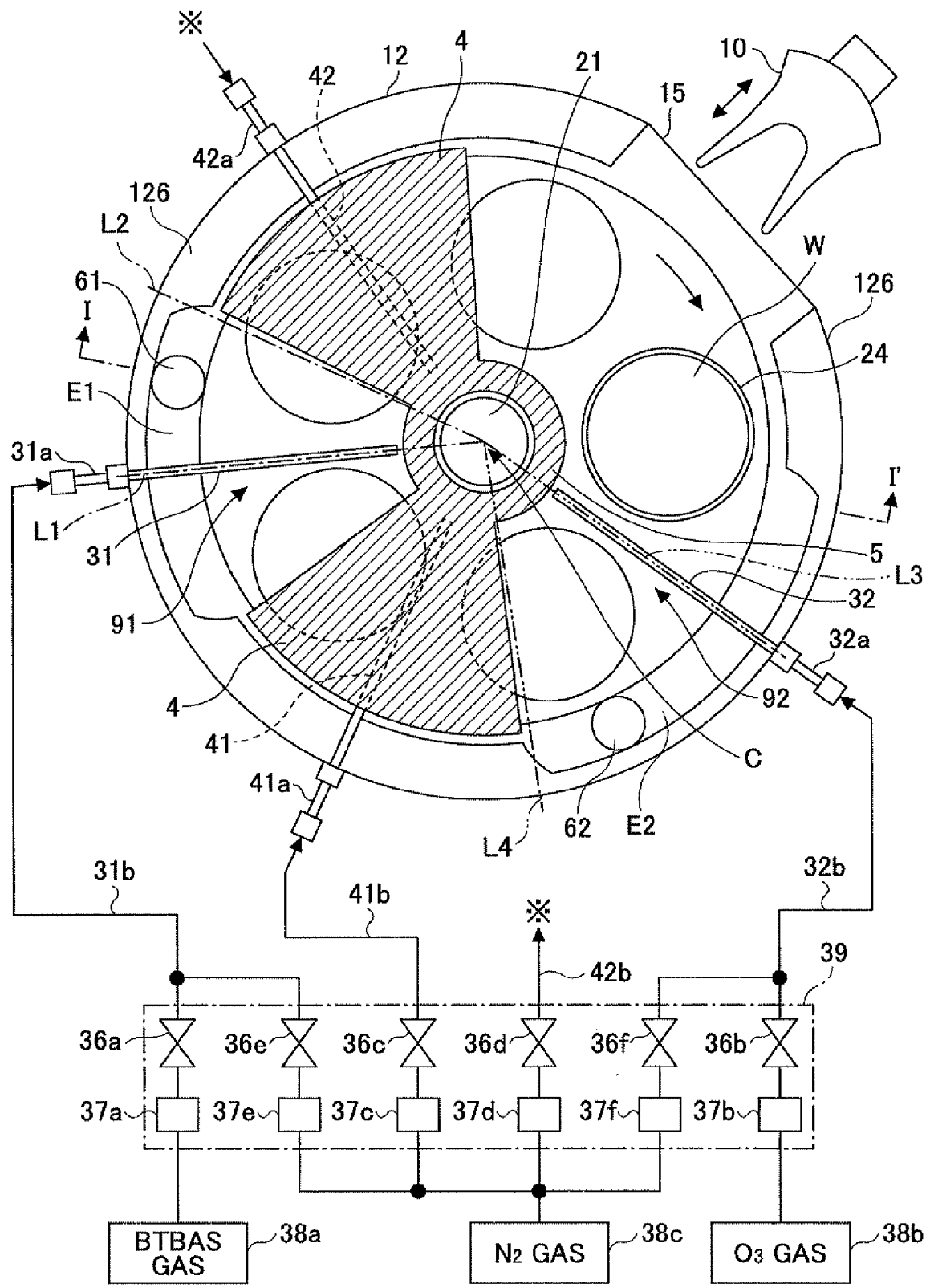
FIG. 3 is a horizontal plan view of the film deposition apparatus according to the first embodiment of the present invention.

Referring to FIG. 1, which is a cut-away diagram taken along I-I' line in FIG. 3, a film deposition apparatus according to an embodiment of the present invention has a vacuum chamber 1 having a flattened cylinder shape, and a rotation table 2 that is located inside the chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a ceiling member such as an O ring 13, so that the vacuum chamber 1 is hermetically sealed. On the other hand, the ceiling plate 11 can be raised by a driving mechanism (not shown) when the ceiling plate 11 has to be removed from the chamber body 12.

The rotation table 2 is fixed onto a cylindrically shaped core portion 21. The core portion 21 is fixed on a top end of a rotational shaft 22 that extends in a vertical direction. The rotational shaft 22 penetrates a bottom portion 14 of the vacuum chamber 1 and is fixed at the lower end to a driving mechanism 23 that can rotate the rotational shaft 22 clockwise, in this embodiment. The rotation shaft 22 and the driving mechanism 23 are housed in a cylindrical case body 20 having an open upper surface. The case body 20 is hermetically fixed to a bottom surface of the bottom portion 14 via a flanged portion, which isolates an inner environment of the case body 20 from an outer environment.

Figure 2:
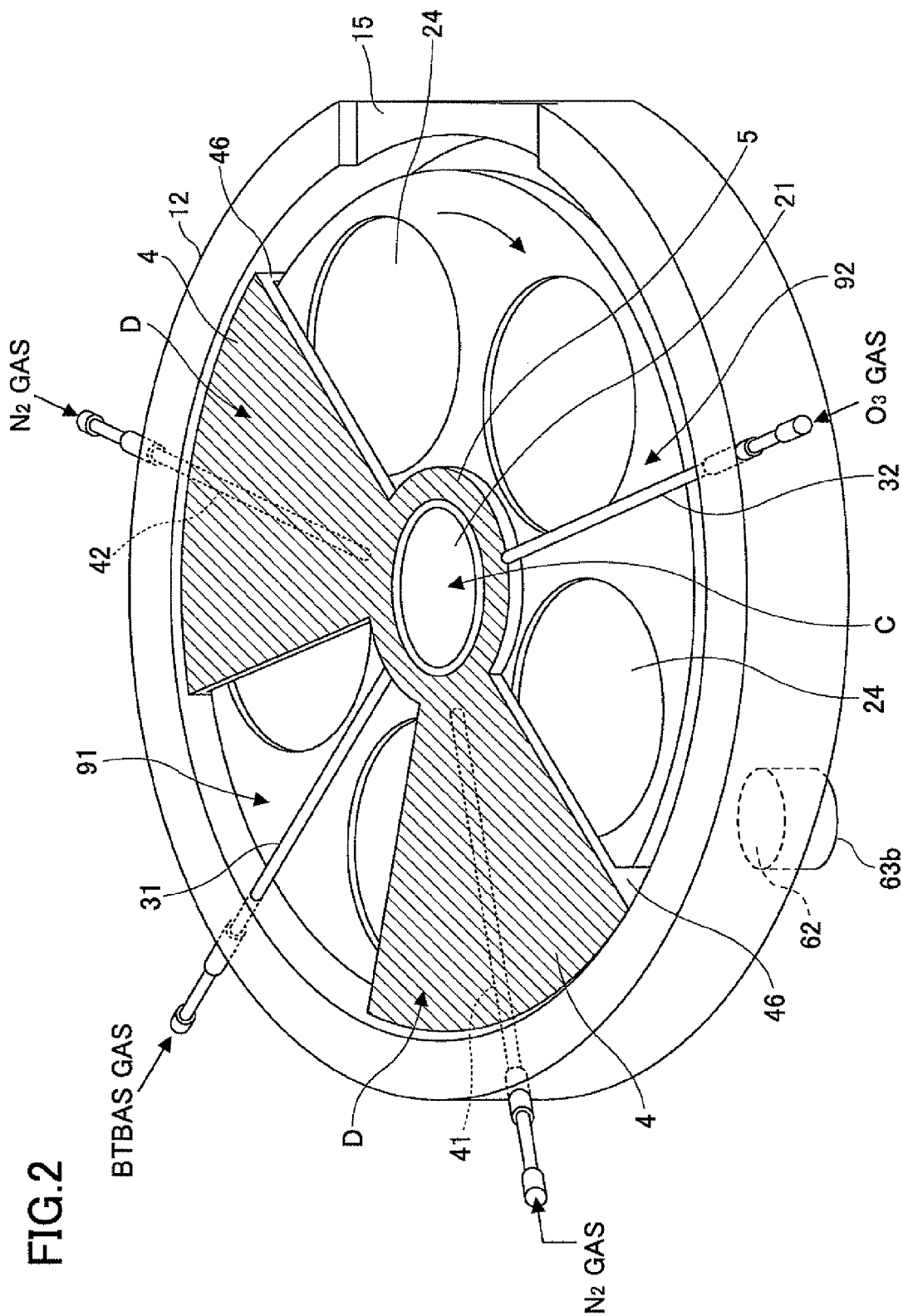
FIG. 2 is a perspective view illustrating a configuration of the inside of a film deposition apparatus according to the first embodiment of the present invention.

As shown in FIGS. 2 and 3, plural (five in the illustrated example) circular concave portions 24, each of which receives a semiconductor wafer (hereinafter referred to as "wafer") W, are formed along a rotation direction (circumferential direction) in a top surface of the rotation table 2, although only one wafer W is illustrated in FIG. 3. FIGS. 4A and 4B are expanded views of the rotation table 2 being cut across and horizontally expanded along its concentric circle. As shown in FIG. 4A, the concave portion 24 has a diameter slightly larger, for example, by 4 mm than the diameter of the wafer W and a depth equal to a thickness of the wafer W. Therefore, when the wafer W is placed in the concave portion 24, a surface of the wafer W is at the same elevation of a surface of the rotation table 2 (an area of the rotation table where the wafer W is not placed). If there is a relatively large difference in height between the surface of the wafer W and the surface of the rotation table 2, a change of pressure occurs at the portion of the difference. Therefore, from the aspect of attaining uniformity of film thickness in the in-plane direction, it is preferable to match the elevation of the surface of the wafer W and the elevation of the surface of the rotation table 2. While matching the elevation of the surface of the wafer W and the height of the surface of the rotation table 2 may signify that the height difference of the surfaces of the wafer W and the rotation table is less than or equal to approximately 5 mm, the difference has to be as close to zero as possible to the extent allowed by machining accuracy. In the bottom of the concave portion 24 there are formed three through holes (not shown) through which three corresponding elevation pins (see FIG. 8) are raised/lowered. The elevation pins support a back surface of the wafer W and raises/lowers the wafer W.

The concave portions 24 are substrate receiving areas (wafer W receiving areas) provided to position the wafers W and prevent the wafers W from being thrown out by centrifugal force caused by rotation of the rotation table 2. However, the wafer W receiving areas are not limited to the concave portions 24, but may be performed by guide members that are provided along a circumferential direction on the surface of the rotation table 2 to hold the edges of the wafers W. In a case where the rotation table 2 is provided with a chuck mechanism (e.g., electrostatic chucks) for attracting the wafer W, the areas on which the wafers W are received by the attraction serve as the substrate receiving areas.

Referring again to FIGS. 2 and 3, the chamber 1 includes a first reaction gas nozzle 31, a second reaction gas nozzle 32, and separation gas nozzles 41, 42 above the rotation table 2, all of which extend in radial directions and are arranged at predetermined angular intervals in a circumferential direction of the chamber 1. With this configuration, the concave portions 24 can move through and below the nozzles 31, 32, 41, and 42. In the illustrated example, the second reaction gas nozzle 32, the separation gas nozzle 41, the first reaction gas nozzle 31, and the separation gas nozzle 42 are arranged clockwise in this order. These gas nozzles 31, 32, 41, and 42 penetrate the circumferential wall portion of the chamber body 12 and are supported by attaching their base ends, which are gas inlet ports 31a, 32a, 41a, 42a, respectively, on the outer circumference of the wall portion.

Although the gas nozzles 31, 32, 41, 42 are introduced into the chamber 1 from the circumferential wall portion of the chamber 1 in the illustrated example, these nozzles 31, 32, 41, 42 may be introduced from a ring-shaped protrusion portion 5 (described later). In this case, an L-shaped conduit may be provided in order to be open on the outer circumferential surface of the protrusion portion 5 and on the outer top surface of the ceiling plate 11. With such an L-shaped conduit, the nozzle 31 (32, 41, 42) can be connected to one opening of the L-shaped conduit inside the chamber 1 and the gas inlet port 31a (32a, 41a, 42a) can be connected to the other opening of the L-shaped conduit outside the chamber 1.

As illustrated in FIG. 3, the reaction gas nozzle 31 is connected to a first gas supplying source 38a of bis(tertiary-butylamino) silane (BTBAS) (which is a first source gas) via a gas supply pipe 31b including a valve 36a and a flow rate adjusting part 37a. The reaction gas nozzle 32 is connected to a second gas supplying source 38b of O3 (ozone) gas (which is a second source gas) via a gas supply pipe 31b including a valve 36b and a flow rate adjusting part 37b. Further, the separation gas nozzle 41 is connected to a N2 gas supplying source 38c of N2 (nitrogen) (which is a separation gas as well as an inert gas) via a gas supply pipe 41b including a valve 36c and a flow rate adjusting part 37c. The separation gas nozzle 42 is also connected to the N2 gas supplying source 38c via a gas supplying pipe 42b including a valve 36d and a flow rate adjusting part 37d.

The gas supply pipe 31b provided between the reaction gas nozzle 31 and the valve 36a is connected to the N2 gas supplying source 38c via a valve 36e and a flow rate adjusting part 38c. As described below, N2 gas is supplied into the chamber 1 from the reaction gas nozzle 31 in a case of adjusting the flow ratio of evacuation gas. Likewise, the gas supply pipe 32b provided between the reaction gas nozzle 32 and the valve 36b is connected to the N2 gas supplying source 38c via the valve 36f and the flow rate adjusting part 37f. The valves 36a-36f and the flow rate adjusting parts 37a-37f constitute a gas supply system 39.

The reaction gas nozzles 31, 32 have ejection holes 33 facing directly downward for ejecting reaction gases below. The ejection holes 33 are arranged at predetermined intervals (e.g., about 10 mm) in longitudinal directions of the reaction gas nozzles 31, 32. The ejection holes 33 have an inner diameter of about 0.5 mm, for example. The reaction gas nozzles 31, 32 are a first reaction gas supplying portion and a second reaction gas supplying portion, respectively, in this embodiment. In addition, an area below the reaction gas nozzle 31 is a first process area 91 in which the BTBAS gas is adsorbed on the wafer W, and an area below the reaction gas nozzle 32 is a second process area 92 in which the O3 gas is adsorbed on the wafer W.

Figure 4:
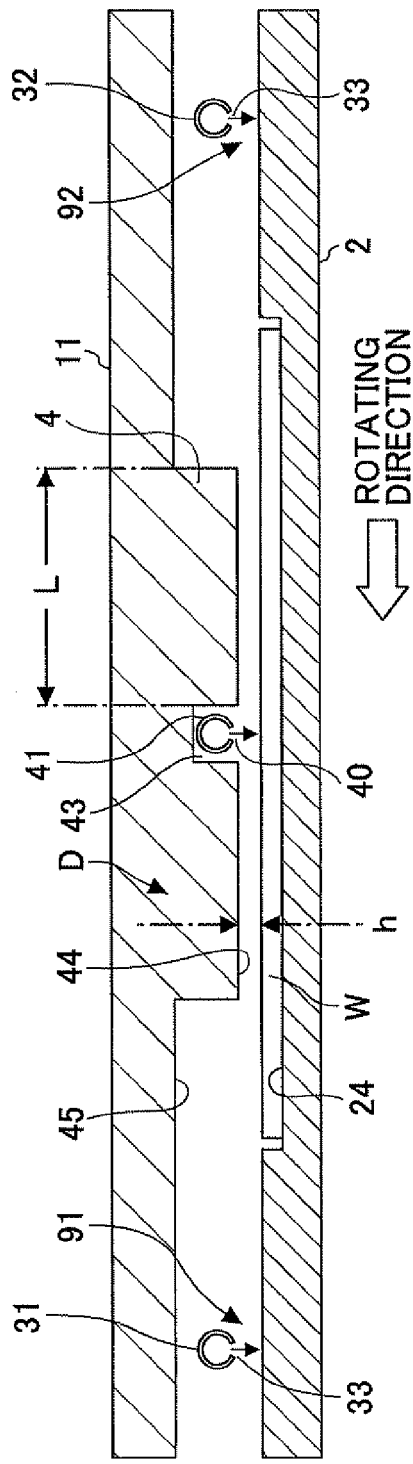
FIGS. 4A and 4B are vertical cross-sectional diagrams illustrating process areas and a separation area of the film deposition apparatus according to the first embodiment of the present invention.

The separation gas nozzles 41, 42 are provided in separation areas D that are configured to separate the first process area 91 and the second process area 92. As shown in FIGS. 2 through 4, in each of the separation areas D, a convex portion 4 is provided in a ceiling plate 11 of the chamber 1 in a manner protruding downwards. The convex portion has a top view shape of a sector. The convex portion 4 is formed by dividing a circle depicted along an inner circumferential wall of the chamber 1. The circle has the rotation center of the rotation table 2 as its center. The convex portion 4 has a groove portion 43 provided at the circumferential center of the circle that extends in the radial direction of the circle. The separation gas nozzle 41 (42) is located in the groove portion 43. The distance between the center axis of the separation gas nozzle 41 (42) and one side of the sector-shaped convex portion 4 (edge of the convex portion 4 towards an upstream side relative to relative to a rotation direction of the rotation table 2) is substantially equal to the distance between the center axis of the separation gas nozzle 41 (42) and the other side (edge of the convex portion 4 towards a downstream side relative to the rotation direction of the rotation table 2) of the sector-shaped convex portion 4.

It is to be noted that, although the groove portion 43 is formed in a manner bisecting the convex portion 4 in this embodiment, the groove portion 42 may be formed so that an upstream side of the convex portion 4 relative to the rotation direction of the rotation table 2 is wider, in other embodiments.

Accordingly, in this embodiment, a flat low ceiling surface (first ceiling surface) 44 is provided as a lower surface of the convex portion 4 on both sides of the separation gas nozzle 41 (42) relative to the rotation direction of the rotation table 2. Further, a high ceiling surface (second ceiling surface) 45, which is positioned higher than the first ceiling surface 44, is provided on both sides of the separation gas nozzle 41 (42) relative to the rotation direction of the rotation table 2. The role of the convex portion 4 is to provide a separation space which is a narrow space between the convex portion 4 and the rotation table 2 for impeding the first and second reaction gases from entering the narrow space and preventing the first and second reaction gases from being mixed.

Taking the separation gas nozzle 41 as an example, the O3 gas from an upstream side of the rotation direction of the rotation table 2 is impeded from entering the space between the convex portion 4 and the rotation table 2. Further, the BTBAS gas from a downstream side of the rotation direction of the rotation table 2 is impeded from entering the space between the convex portion 4 and the rotation table 2. "Impeding the first and second reaction gases from entering" signifies that the N2 gas ejected as the separation gas from the separation gas nozzle 41 diffuses between the first ceiling surfaces 44 and the upper surfaces of the rotation table 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" not only signifies that the gases from the adjacent space below the second ceiling surfaces 45 are completely prevented from entering the space below the convex portion 4, but that the gases from both sides cannot proceed farther toward the space below the convex portion 4 and thus be mixed with each other. Namely, as long as such effect can be attained, the separation area D can achieve the role of separating the first process area 91 and the second process area 92. The narrowness of the narrow space is set so that the pressure difference between the narrow space (space below the convex portion 4) and the space adjacent to the narrow space (e.g., space below the second ceiling surface 45) is large enough to attain the effect of "the gases cannot enter the separation space". The specific measurements of the narrow space differs depending on, for example, the area of the convex portion 4. Further, the gases adsorbed on the wafer W can pass through below the convex portion 4. Therefore, "impeding the first and second reaction gases from entering" signifies that the first and second reaction gases are in a gaseous phase.

In this embodiment, a wafer W having a diameter of about 300 mm is used as the target substrate. In this embodiment, at an area spaced about 140 mm from the rotation center of the rotation table 2 in the outer circumferential direction (border part between the convex portion 4 and the below-described convex portion 5), the convex portion 4 includes a part where the length is about 146 mm in the circumferential direction (length of arc concentric with the rotation table 2). Further, at an area corresponding to an outermost part of the wafer W receiving area (concave part 24), the convex portion includes a part where the length is about 502 mm in the circumferential direction. In the outermost part as illustrated in FIG. 4A, the length L of convex portion 4 on each side of the separation nozzle 41 (42) with respect to the circumferential direction is about 246 mm.

As illustrated in FIG. 4A, the height from a top surface of the rotation table 2 to the lower surface of the convex portion 4 (i.e. first ceiling surface 44) is indicated as "h". The height h ranges from, for example, about 0.5 mm to 10 mm, and more preferably, about 4 mm. In this case, the number of rotations of the rotation table 2 is set to, for example, about 1 rpm-500 rpm. Accordingly, in order to attain a separating function at the separation area D, the size of the convex portion 4 and the height h from the surface of the rotation table 2 to the lower surface of the convex portion 4 (first ceiling surface 44) are to be set based on, for example, experimentation of the applicable range of the number of rotations of the rotation table 2.

Not only nitrogen gas (N2) may be used as the separation gas but also inert gas such as argon (Ar) may be used. Further, other gases such as hydrogen ($H_2$) may be used. As long as the film deposition process is not affected, the kind of gas is not to be limited in particular. Further, not only inert gas such as the above-described N2 gas may be used as the gas for flow rate adjustment but also other gases may be used as long as the gas does not affect the film deposition process. In this embodiment, N2 gas is used as the separation gas as well as the inert gas; therefore, inert gas is not switched when initiating the film deposition process. Alternatively, different kinds of gases may be used for the separation gas and the inert gas.

A protrusion portion 5 is provided on a lower surface of the ceiling plate 11 so that the inner circumference of the protrusion portion 5 faces the outer circumference of the core portion 21. The protrusion portion 5 opposes the rotation table 2 at an outer area of the core portion 21. In addition, a lower surface of the protrusion portion 5 and a lower surface of the convex portion 4 form one plane surface. In other words, a height of the lower surface of the protrusion portion 5 from the rotation table 2 is the same as a height of the lower surface (ceiling surface 44) of the convex portion 4. FIGS. 4A and 4B show the ceiling plate 11 being horizontally cut across an area including a portion substantially lower than the ceiling surface 45 but higher than the separation nozzles 41, 42. The convex portion 4 may not only be formed integrally with the protrusion portion 5 but may also be formed separately from the protrusion portion 5.

The configuration of the combination of the convex portion 4 and the separation nozzle 41 (42) is fabricated by forming the groove portion 43 in a sector-shaped plate to be the convex portion 4, and locating the separation gas nozzle 41 (42) in the groove portion 43 in the above embodiment. However, two sector-shaped plates may be attached on the lower surface of the ceiling plate 11 by screws so that the two sector-shaped plates are located on both sides of the separation gas nozzle 41 (42).

Figure 5:
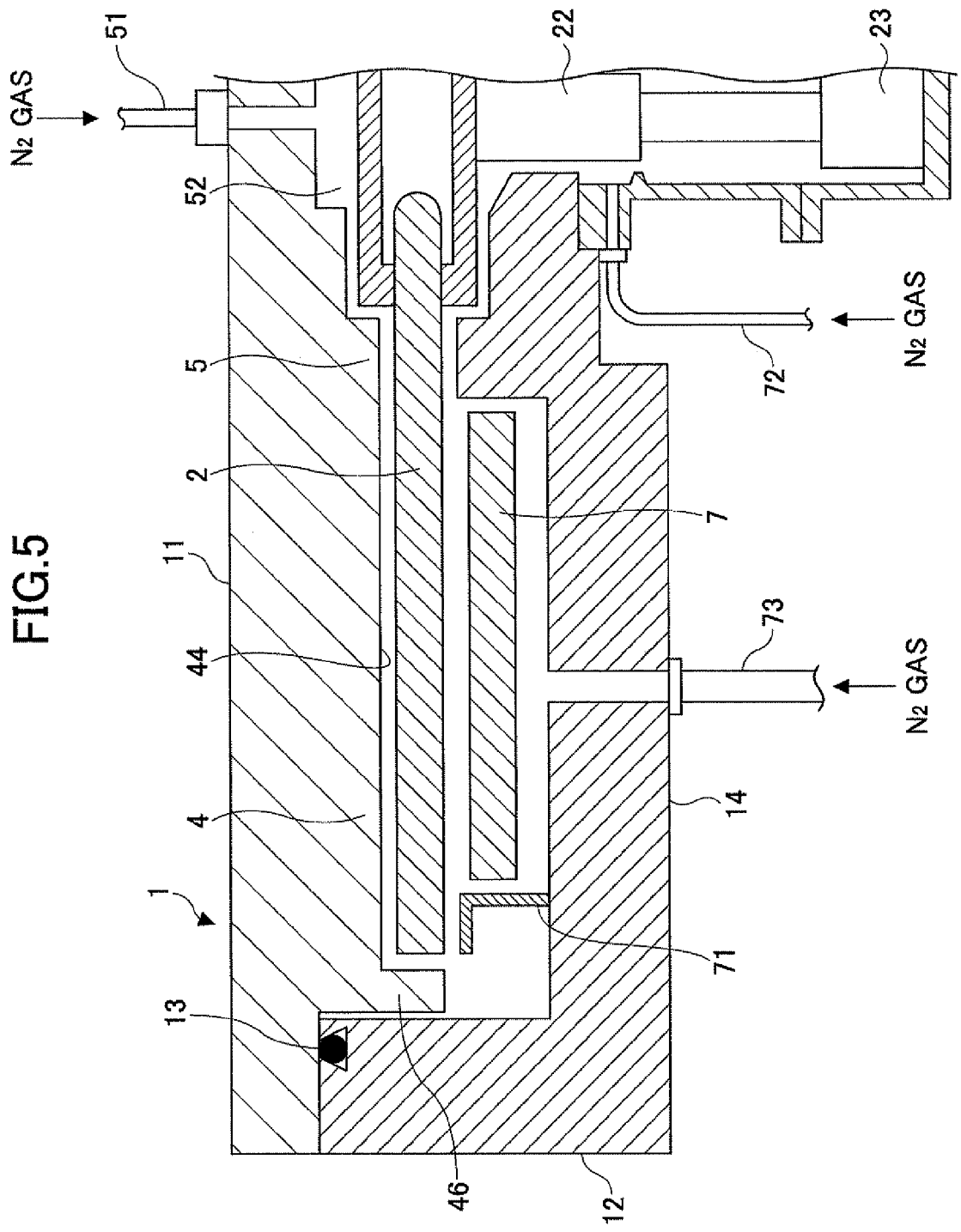
FIG. 5 is a partial cross-sectional view of the film deposition apparatus according to the first embodiment of the present invention.

As described above, the lower surface of the ceiling plate 11 of the chamber 1 (i.e. ceiling when viewed from the wafer receiving area (concave portion 24) of the rotation table 2 includes the first ceiling surface 44 and the second ceiling surface 45 provided in a circumferential direction in a manner where the second ceiling surface 45 is positioned higher than the first ceiling surface 45. FIG. 1 is a vertical cross-sectional view of an area having a high ceiling surface 45. FIG. 5 is a vertical cross-sectional view of an area having a low ceiling surface 44. The convex portion 4 has a bent portion 46 that bends in an L-shape at the outer circumferential edge of the convex portion 4 (area at the outer rim of the chamber 1). The sector-shaped convex portion 4 is provided towards the ceiling plate 11 and is configured to be detachable from the chamber body 12. Therefore, a slight gap(s) is provided between the outer peripheral surface of the bent portion and the chamber body 12. The same as the convex portion 4, the bent portion 46 is also provided for impeding reaction gases from entering and preventing the reaction gases from mixing. The gaps between the bent portion 46 and the rotation table 2 and between the bent portion 46 and the chamber body 12 are set to have substantially the same measurements as the height h of the ceiling surface 44 with respect to the surface of the rotation table 2. In this embodiment, from the standpoint of the surface of the rotation table 2, the inner surface of the bent portion 46 serves as an inner circumferential wall of the chamber 1.

As illustrated in FIG. 5, the chamber body 12 has an inner circumferential wall formed as a vertical surface in the vicinity of the outer circumferential surface of the bent portion 46 in the separation area D. As illustrated in FIG. 1, in an area other than the separation area D, the chamber body 12 has a dented portion (dented towards the outer side) with a notch having a rectangular cross section. The dented portion faces, for example, an area extending from the outer circumferential surface of the rotation table 2 to a bottom surface part 14. In the dented portion, the areas with pressure communication between the first and second process areas 91, 92 are referred to as first and second evacuation areas E1 and E2, respectively. Accordingly, as illustrated in FIGS. 1 and 3, first and second evacuation ports 61 and 62 are formed at corresponding bottom parts of the first and second evacuation areas E1 and E2.

As illustrated in FIG. 1, the first evacuation port 61 is connected to, for example, a vacuum pump (first evacuation part) 64a via a first evacuation channel 63a. A first valve 65a is interposed between the first evacuation channel 63a and the vacuum pump 64a. The first valve 65a includes, for example, an APC (Auto Pressure Controller) that can change the opening (degree in which the first valve 65a is opened). The flow rate of the gas flowing in the first evacuation channel 63a can be adjusted in correspondence with the opening of the first valve 65a. A first process pressure detecting part 66a is connected to an upstream side of the first valve 65a (towards the chamber 1). A first pressure detecting part 67a is connected to a downstream side of the first valve 65a (towards the vacuum pump 64a). The first process pressure detecting part 66a and the first pressure detecting part 67a each includes a pressure gage. The first process pressure detecting part 66a is for measuring the pressure in the chamber 1 (upstream side of the first valve 65a). The first pressure detecting part 67a is for measuring the pressure between the first valve 65a and the vacuum pump 64a. Based on the difference in the values detected by the first process pressure detecting part 66a and the first pressure detecting part 67a, the below-described control part 80 calculates the flow rate of gas flowing inside the first evacuation channel 63a taking the pressure drop at the first evacuation channel 63a or the first valve 65a into consideration. The calculation may be performed using, for example, Bernoulli's law.

Likewise, the second evacuation port 62 is connected to, for example, a vacuum pump (first evacuation part) 64b via a second evacuation channel 63b. A second valve 65b is interposed between the second evacuation channel 63b and the vacuum pump 64b. The same as the first valve 65a, the second valve 65b includes, for example, an APC (Auto Pressure Controller) that can change the opening (degree in which the second valve 65b is opened). The flow rate of the gas flowing in the second evacuation channel 63b can be adjusted in correspondence with the opening of the second valve 65b. A second process pressure detecting part 66b is connected to an upstream side of the second valve 65b (towards the chamber 1). A second pressure detecting part 67b is connected to a downstream side of the second valve 65b (towards the vacuum pump 64b). The second process pressure detecting part 66b and the second pressure detecting part 67b each includes a pressure gage. The second process pressure detecting part 66b is for measuring the pressure in the chamber 1 (upstream side of the second valve 65b). The second pressure detecting part 67b is for measuring the pressure between the second valve 65b and the vacuum pump 64b. Based on the difference in the values detected by the second process pressure detecting part 66b and the second pressure detecting part 67b, the control part 80 calculates the flow rate of gas flowing inside the second evacuation channel 63b taking the pressure drop at the second evacuation channel 63b or the second valve 65b into consideration. Hereinafter, the first valve 65a may also be referred to as "valve M (Master)" and the second valve 65b may also be referred to as "valve S (Slave)".

The first and second evacuation ports 61 and 62 are provided for ensuring a separating effect in the separation area D. When viewing the first and second evacuation ports 61, 62 from a plan position, the first and second evacuation ports 61, 62 are provided on both sides of the separation area D in the rotation direction. For example, when viewing the first evacuation port 61 from the rotation center of the rotation table 2, the first evacuation port 61 is formed between the first process area 91 and the separation area D provided adjacent to the first process area 91 towards the downstream side of the first process area 91 with respect to the rotation direction. When viewing the second evacuation port 62 from the rotation center of the rotation table 2, the second evacuation port 62 is formed between the second process area 92 and another separation area D provided adjacent to the second process area 92 towards the downstream side of the second process area 92. Each of the evacuation ports 61, 62 is dedicated to evacuate a corresponding reaction gas (BTBAS gas and O3 gas). In this embodiment, the first evacuation port 61 is provided between the first reaction gas nozzle 31 and a line extending from an edge (edge towards the first reaction gas nozzle 31) of the separation area D provided towards the downstream side of the first process area 91 with respect to the rotation direction. The second evacuation port 62 is provided between the second reaction gas nozzle 32 and a line extending from an edge (edge towards the second reaction gas nozzle 31) of the separation area D provided towards the downstream side of the second process area 92 with respect to the rotation direction. In other words, as illustrated in FIG. 3, the first evacuation port 61 is provided between a straight line L1 (passing through the center of the rotation table 2 and the first process area 91) and a straight line L2 (passing through the center of the rotation table 2 and an upstream edge of the separation area D provided towards the downstream side of the first process area 91 with respect to the rotation direction). The second evacuation port 62 is provided between a straight line L3 (dash-double-dot line passing through the center of the rotation table 2 and the second process area 92) and a straight line L4 (dash-double-dot line passing through the center of the rotation table 2 and an upstream edge of the separation area D provided towards the downstream side of the second process area 92 with respect to the rotation direction).

Because the pressure detected from both the first process pressure detecting part 66a and the second process pressure detecting part 66b are substantially the same, a pressure value detected from either the first process pressure detecting part 66a or the second process pressure detecting part 66b can be used as the value of the pressure in the area upstream of the valves 65a, 65b for calculating the flow rate in each of the first and second evacuation channels 63a, 63b. Because the pressure of the evacuation channels 63a, 63b located upstream of the valves 65a, 65b is substantially the same as the pressure inside the chamber 1, a pressure value detected from another pressure detecting part provided in the chamber 1 may serve as the pressure value used to calculate the flow rate in each of the first and second evacuation channels 63a, 63b instead of using the pressure values detected by the process pressure detecting parts 66a, 66b.

Although the two evacuation ports 61, 62 are made in the chamber body 12 in this embodiment, three evacuation ports may be provided in other embodiments. For example, an additional evacuation port may be made in an area between the second reaction gas nozzle 32 and the separation area D located upstream relative to the clockwise rotation of the rotation table 2 in relation to the second reaction gas nozzle 32. In addition, a further additional evacuation port may be made somewhere in the chamber body 12. While the evacuation ports 61, 62 are located below the rotation table 2 to evacuate the chamber 1 through an area between the inner circumferential wall of the chamber 1 and the outer circumferential surface of the rotation table 2 in the illustrated example, the evacuation ports may be located at a part other than the bottom portion 14 of the chamber 1. For example, the evacuation ports may be located in the side wall of the chamber body 12. In addition, when the evacuation ports 61, 62 are provided in the side wall of the chamber body 12, the evacuation ports 61, 62 may be located higher than the rotation table 2. In this case, the gases flow along the upper surface of the rotation table 2 into the evacuation ports 61, 62 located higher the rotation table 2. Therefore, it is advantageous in that particles in the chamber 1 are not blown upward by the gases, compared to when the evacuation ports are provided, for example, in the ceiling plate 11.

Figure 6:
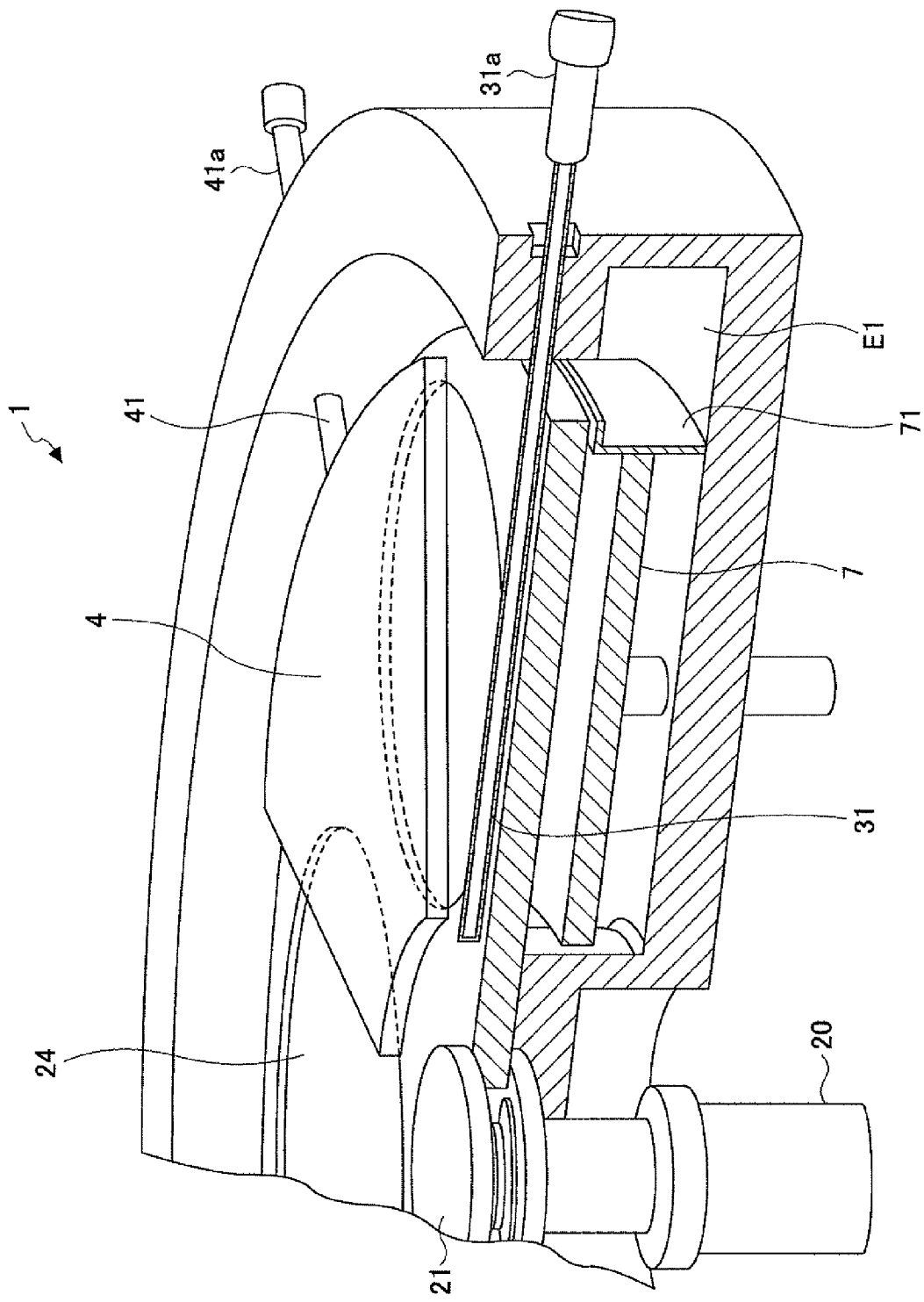
FIG. 6 is a fragmentary perspective view of the film deposition apparatus according to the first embodiment of the present invention.
Figure 7:
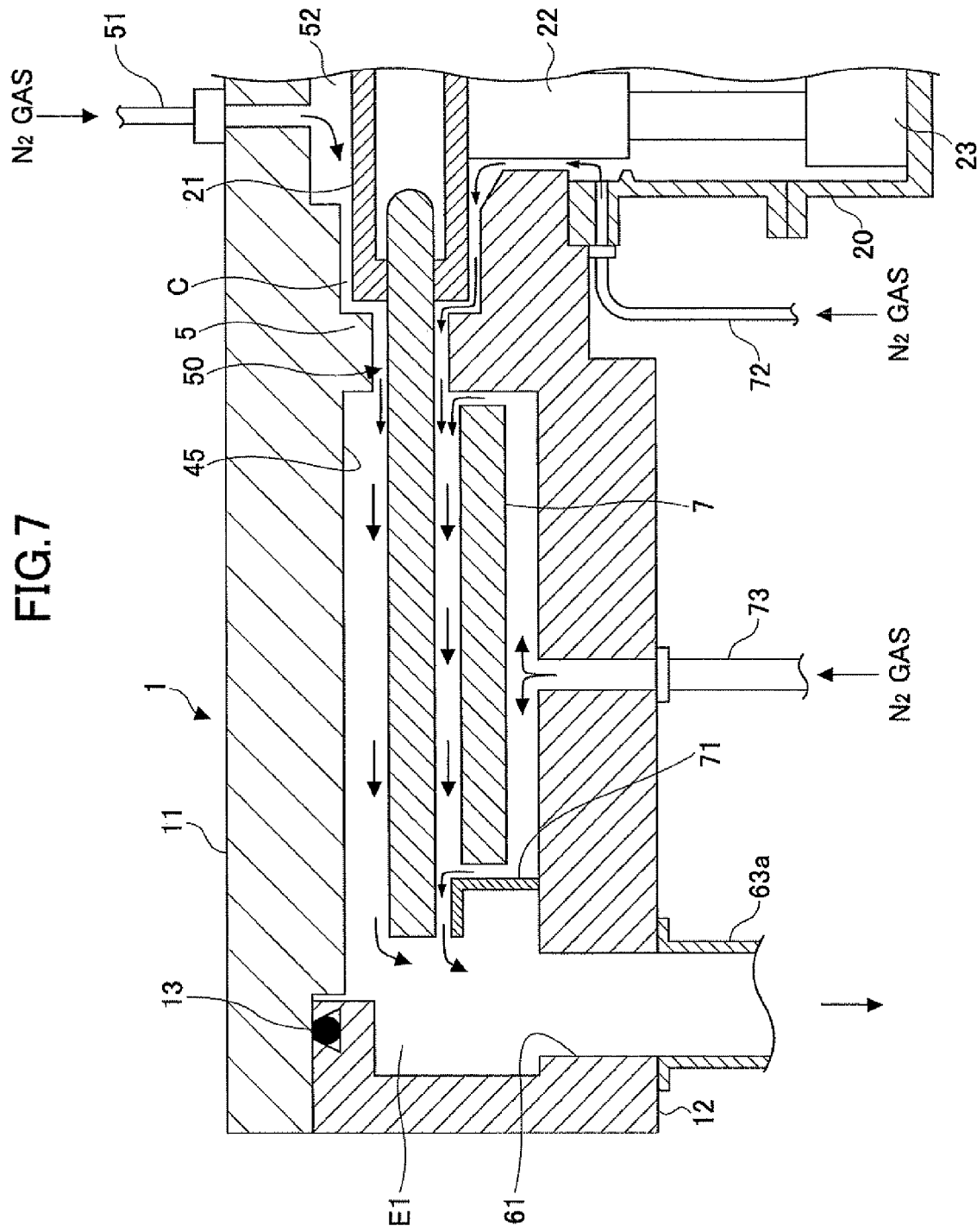
FIG. 7 is a schematic diagram for describing the manner in which separation gas and purge gas flow in the film deposition apparatus according to the first embodiment of the present invention.

As shown in FIGS. 1 and 6, a heater unit (heating portion) 7 is provided in a space between the bottom portion 14 of the chamber 1 and the rotation table 2, so that the wafers W placed on the rotation table 2 are heated through the rotation table 2 at a temperature determined by a process recipe. In addition, a cover member 71 is provided beneath the rotation table 2 and near the outer circumference of the rotation table 2 in order to surround the heater unit 7, so that the space where the heater unit 7 is located is partitioned from the outside area of the cover member 71. The cover member 71 has a flange portion 71a at the top. The flange portion 71a is arranged so that a slight gap is maintained between the back surface of the rotation table 2 and the flange portion in order to prevent gas from flowing inside the cover member 71.

At an area located towards the bottom portion 14 and more towards the rotation center than the space where the heater unit 7 is provided, narrow spaces are provided in the vicinity of the center of the lower surface of the rotation table 2 and the core portion 21. Further, slight gaps, which are provided at a penetration hole through which the rotation shaft 22 passes, are in communication with the inside of the case body 20. A purge gas supplying pipe 72 is connected to the case body for supplying a purge gas such as N2 gas to the aforementioned narrow spaces. Purge gas supplying pipes 73 are connected to plural areas in the circumferential direction at the bottom portion of the chamber 1 for purging the space where the heater unit 7 is provided.

By providing the purge gas supplying pipes 72, 73, N2 gas is purged into the space extending from the inside of the case body 20 to the area where the heater unit 7 is provided. The purge gas is evacuated from the gap between the rotation table 2 and the cover member 71 to the evacuation ports 61, 62 via an evacuation area E. Accordingly, because the BTBAS gas or O3 gas is prevented from circling around from one side of the first process area 91 and the second process area 92 to the other side of the first process area 91 and the second process area 92 via a lower part of the rotation table 2, the purge gas plays the role of a separation gas.

A gas separation supplying pipe 51 is connected to the top center portion of the ceiling plate 11 of the chamber 1, so that N2 gas is supplied as a separation gas to a space 52 between the ceiling plate 11 and the core portion 21. The separation gas, which is supplied to the space 52, is ejected towards the circumferential edges through the thin gap 50 between the protrusion portion 5 and the rotation table 2 and then along the wafer receiving area of the rotation table 2. Because the separation gas fills the space surrounded by the protrusion portion 5, reaction gases (BTBAS gas or O3 gas) can be prevented from mixing via the center portion of the rotation table 2 between the first process area 91 and the second process area 92. That is, the film deposition apparatus according to this embodiment is divided into a rotation center portion of the rotation table 2 and the chamber 1 for separating the atmosphere between the first process area 91 and the second process area 92. Further, the film deposition apparatus according to this embodiment is provided with a center area C having an ejection opening formed along a rotation direction at the center portion of the rotation table 2 for ejecting the separation gas on the surface of the rotation table 2. The ejection opening corresponds to the narrow gap 50 between the protrusion portion 5 and the rotation table 2.

As illustrated in FIGS. 2, 3, and 3, a transfer opening 15 is formed in a side wall of the chamber 1 for transferring a wafer W between an outside transfer arm 10 and the rotation table 2. The transfer opening 15 is provided with a gate valve (not illustrated) by which the transfer opening 15 is opened or closed. When a concave portion (wafer receiving area) 24 of the rotation table 2 is in alignment with the transfer opening 15, the wafer W is transferred into the chamber 1 and placed in the concave portion 24 as a wafer receiving portion of the rotation table 2 from the transfer arm 10. In order to lower/raise the wafer W into/from the concave portion 24, there are provided elevation pins 16 that are raised or lowered through corresponding through holes formed in the concave portion 24 of the rotation table 2 by an elevation mechanism (not illustrated).

Figure 9:
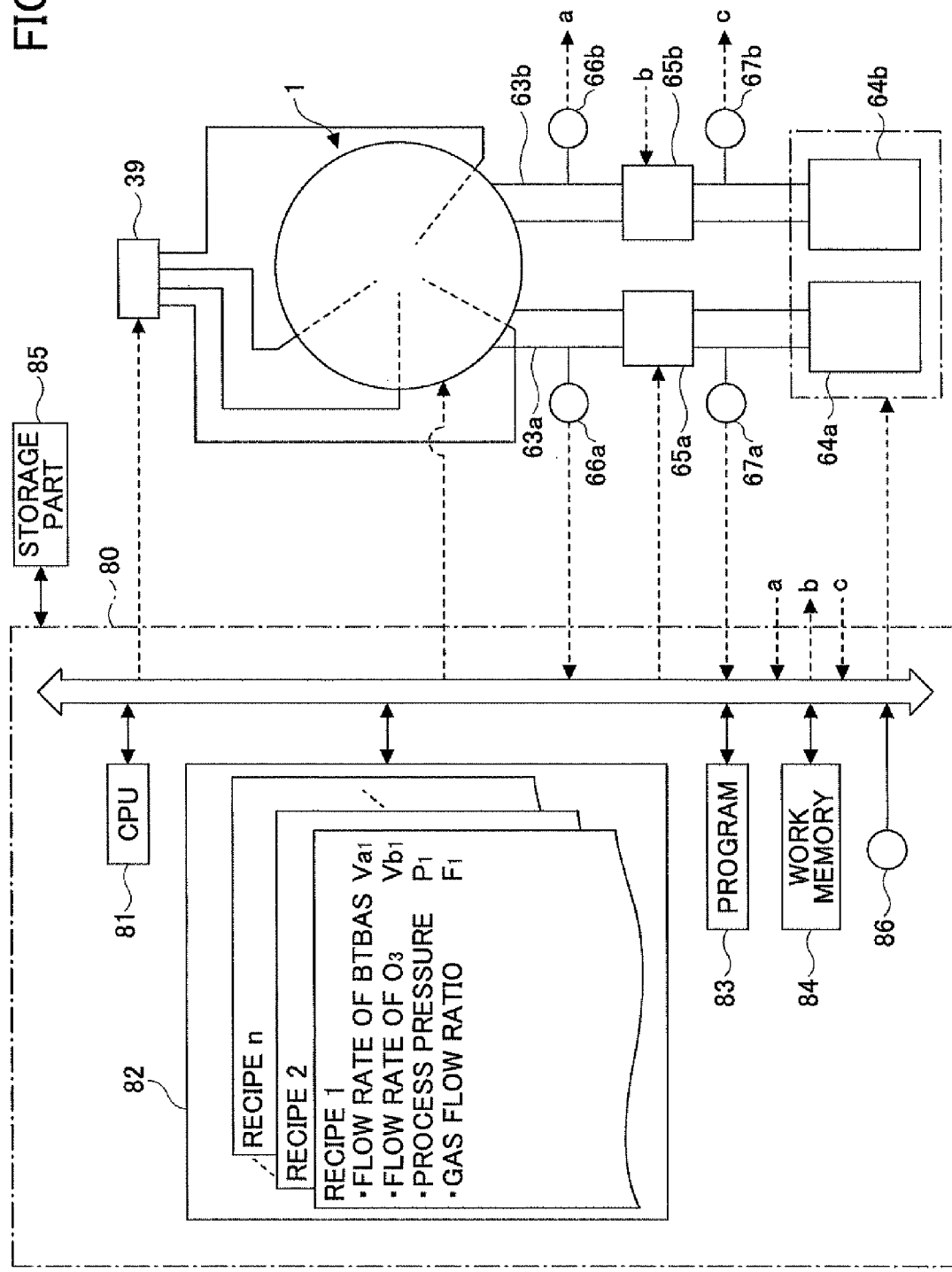
FIG. 9 is a schematic diagram illustrating an example of a control part of the film deposition apparatus according to the first embodiment of the present invention.
Figure 10:
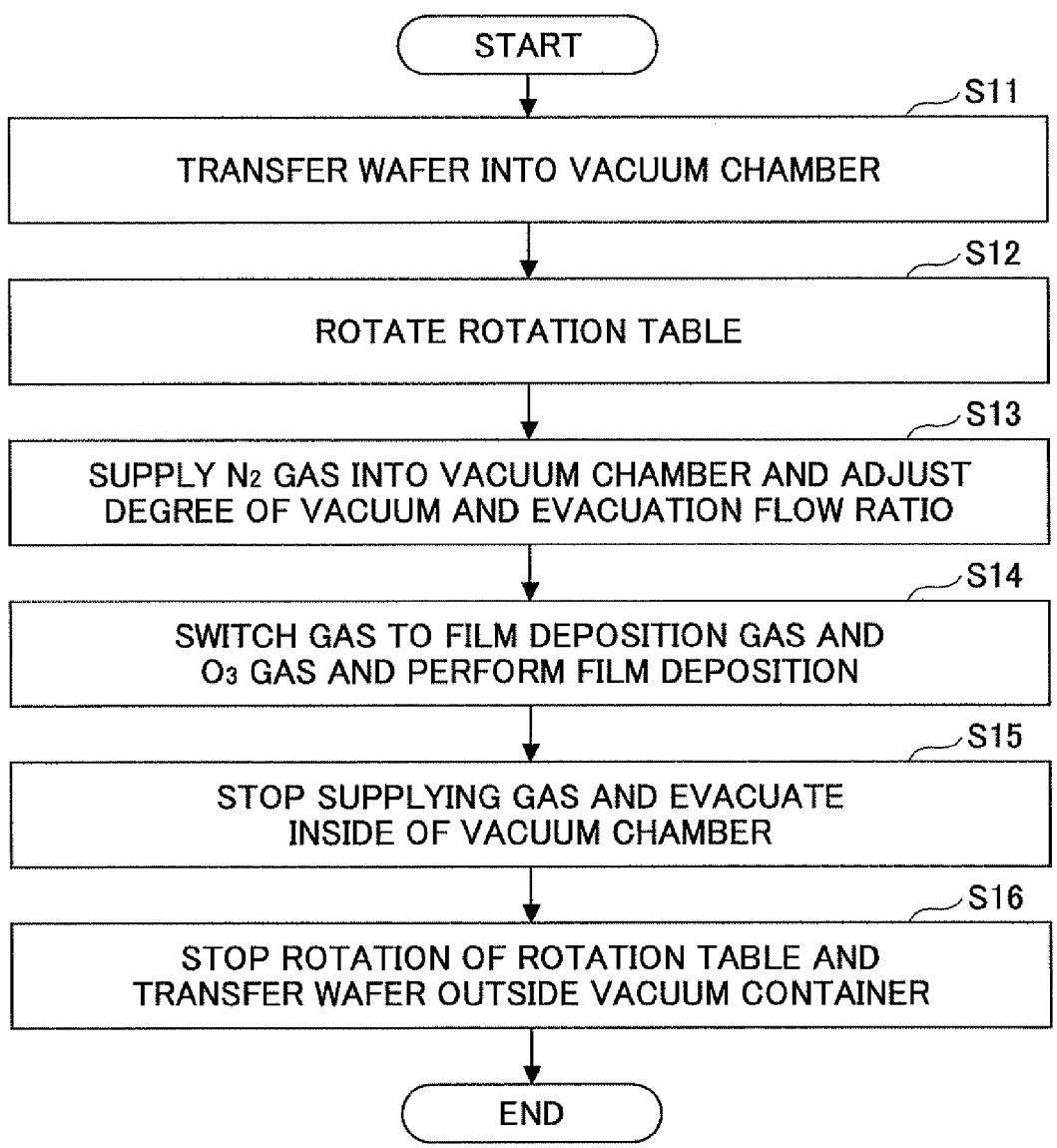
FIG. 10 is a flowchart illustrating an example of an overall operation performed by the film deposition apparatus according to the first embodiment of the present invention.

As illustrated in FIG. 9, the film deposition apparatus according to an embodiment of the present invention includes a control part 80 including a computer for controlling overall operations of the film deposition apparatus. The control part 80 includes a CPU 81, a memory 82, a processing program 83, a work memory 84, and a timer 86. In the memory 82, processing conditions (e.g., flow rate Va of BTBAS gas supplied from the first reaction gas nozzle 31, flow rate Vb of O3 gas supplied from the second reaction gas nozzle 32, process pressure P, flow ratio F of gas evacuated from the first evacuation channel 63a and the second evacuation channel 63b (i.e. flow rate of gas flowing in the second evacuation channel/flow rate of gas flowing in the first evacuation channel) are recorded thereto with respect to each recipe. In a steady state, the flow ratio F of the gases is set so that the flow of gas supplied to the wafer W in the first and second process chambers 91, 92 is constant (stable) with respect to an in-plane direction or in-between surfaces of the wafers W. For example, process temperature or a process pressure is stabilized to a value of a corresponding recipe. Further, the values of the flow rate of gas evacuated from the first and second evacuation channels 63a, 63b are set to be a flow rate corresponding to the gas supplied from the first reaction gas nozzle 31 and the second reaction gas nozzle 32 (including N2 gas supplied as purge gas).

The processing program 83 has commands assembled thereto for processing the wafer W by loading a corresponding recipe recorded in the memory 82 to the work memory 84, transmitting control signals to each part of the film deposition apparatus according to the recipe, and executing each of the below-described steps. The processing program 83 is for setting a value of a processing temperature read out from a recipe before the BTBAS gas or O3 gas is supplied (i.e. before a film deposition process). Further, N2 gas is supplied into the chamber 1 at a flow rate substantially the same as the total flow rate of gas supplied during processing. In this state, the opening of the first valve 65a and the opening of the second valve 65b are adjusted according to each pressure value detected by the first process pressure detecting part 66a (66b) and a pressure detecting part 67 so that the flow ratio F evacuated from the first and second evacuation channels 63a and 63b and the pressure P (degree of vacuum) inside the chamber 1 become predetermined values, to thereby stabilize the flow of gas supplied to the wafer W (steady state). After reaching the steady state, the processing program 83 commands a film deposition process to be executed in which BTBAS gas or O3 gas is supplied. In adjusting the flow ratio F of the evacuation gases and the pressure inside the chamber 1, the adjustment is repeated for a predetermined time (number of times), for example, performing a first step of adjusting the pressure P inside the chamber 1 with the first valve 65a, performing a second step of adjusting the flow ratio of the evacuation gases with the second valve 65b, and then performing the first step again (described in detail below). Although the flow ratio F of the evacuation gases is different with respect to each recipe, the flow ratio F of the evacuation gases may be the same with respect to each recipe.

A timer 86 is for setting the time (number of times) for repeating the valve 65 adjustment by the processing program 83. For example, the time for the repetition may be set to automatic or may be set by a user according to each recipe.

The processing program 83 may be installed to the control part 80 from a storage medium such as a hard disk, a compact disk, a magneto-optical magnetic disk, a memory card, or a flexible disk.

Figure 8:
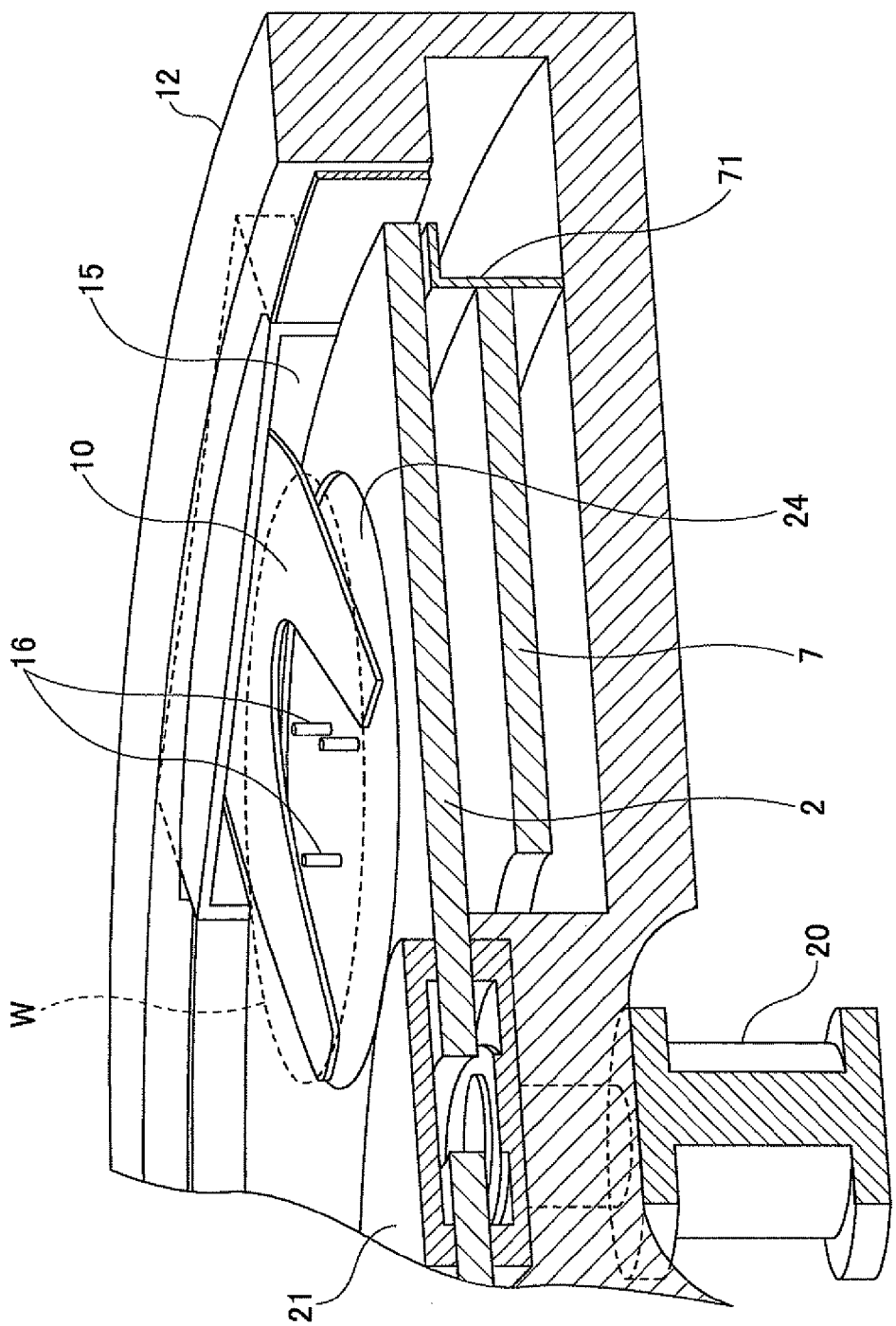
FIG. 8 is a fragmentary perspective view of the film deposition apparatus according to the first embodiment of the present invention.

A film deposition operation according to an embodiment of the present invention is described with reference to FIGS. 10-15. First, a recipe is read out from the memory 82. Then, a gate valve (not illustrated) is opened, and a wafer W is transferred into the concave portion 24 of the rotation table 2 from outside via the transfer opening 15 by the transfer arm 10 (Step S11). The transfer is performed by raising or lowering the elevation pins 16 from the bottom portion of the chamber 1 via the through holes formed at the bottom surface of the concave portion 24 as illustrated in FIG. 8. In this example, the transfer is performed by intermittently rotating the rotation table 2 and placing wafers W on five corresponding concave portions 24 of the rotation table 2. Then, the rotation table 2 is rotated clockwise at the substantially the same number of rotations when performing film deposition (Step S12). Then, the adjustment of the pressure P inside the chamber 1 and the adjustment of the flow ratio F of evacuation gases are performed in Step S13 (described in detail in Steps S21-S28).

First, the chamber 1 is evacuated by fully opening the first and second valves 65a, 65b together with heating the wafer W at a predetermined temperature (e.g., 300° C.) with the heater unit 7 (Step S21). For example, the wafer W is heated to a predetermined temperature by heating the rotation table 2 beforehand to a temperature of 300° C. with the heater unit 7 and placing the wafer W on the rotation table 2. Then, N2 gas is supplied into the chamber 1 in substantially the same flow rate as the total flow rate of gas supplied in the chamber 1 when performing the below-described film deposition process. In order to attain substantially the same flow rate as the flow rate of gas supplied from the nozzles 31, 32, 41, 42 during the film deposition process, each of the separation gas nozzles 41, 42 supplies N2 gas with a flow rate of 20000 sccm, the first reaction gas nozzle 31 supplies N2 gas with a flow rate of 100 sccm, and the second reaction gas nozzle 32 supplies N2 gas with a flow rate of 10000 sccm. Further, the separation gas supplying pipe 51 and the purge gas supplying pipe 72 also supply N2 gas with a predetermined flow rate to the center portion area C and the aforementioned narrow gaps. Further, in order to attain a predetermined value of a recipe, the pressure value P1 is set to, for example, 1067 Pa (8 Torr), and the flow ratio F1 is set to, for example, 1.5 (Step S22). Then, the timer 86 is set for setting the time t1 for repeating the below-described Steps S24-S27 (Step S23).

As illustrated in FIG. 13, in order for the pressure P in the chamber 1 to be a predetermined pressure value P1 (e.g., 1067 Pa (8 Torr), the opening (A1) of the first valve 65a is adjusted (Step S24). For example, in order to reduce the flow rate of gas flowing in the first evacuation channel 63a, the opening of the first valve 65a is reduced. The flow rate of each gas flowing in the evacuation channels 63a, 63b (Qa1, Qb1) is calculated according to the pressure difference between the pressure of an upstream side (front) of the first valve 65a and the pressure of a downstream side (back) of the first valve 65a (ΔPa1) and the pressure difference between the pressure of an upstream side (front) of the second valve 65b and the pressure of a downstream side (back) of the second valve 65b (ΔPb1). Then, the gas flow ratio F (Qb1/Qa1) is obtained based on the calculated flow rate, to thereby determine whether the flow ratio is a predetermined value F1 (Step S25). In a case where the flow ratio is equal to the predetermined value F1, the operation proceeds to the below-described film deposition process of Step S14. In a case where the flow ratio is greater than the predetermined value F1, the opening (B1) of the second valve 65b is reduced so that the flow ratio equals to the predetermined value F1 (Step S26).

Then, it is determined whether the pressure P is deviated from a predetermine value P1 (Step S27). If the pressure P is not deviated from the predetermined value P1, the operation proceeds to the below-described film deposition process of Step S14. In a case where the pressure P is deviated from the predetermined value P1, it is determined whether the time used in performing the above-described steps S24-S27 has reached a predetermined repetition time t1 (Step S28). The steps of S24-S27 are repeated when i) the time used in performing the step S24-S27 reaches the repetition time t1, ii) the flow ratio F equals to the predetermined value F1 in Step S25, or iii) the pressure P equals to the predetermined value P1. For example, in a case where the pressure P is greater than P1 by the adjustment of the opening of the valve 65b (Step S26), the opening of the valve 65a is increased. In a case where the pressure P is less than P1 by the adjustment of the opening of the valve 65b (Step S26), the opening of the valve 65a is reduced. In a case where the flow ratio F is greater than F1 by the adjustment of the opening of the valve 65a (Step S24), the opening of the valve 65b is reduced. In a case where the flow ratio is less than F1 by the adjustment of the opening of the valve 65b (Step S24), the opening of the valve 65b is increased. Accordingly, by alternately adjusting the opening of the valves 65a, 65b, each of the pressure P and the flow ratio F becomes closer to the corresponding predetermined values P1, F1.

Figure 12A:
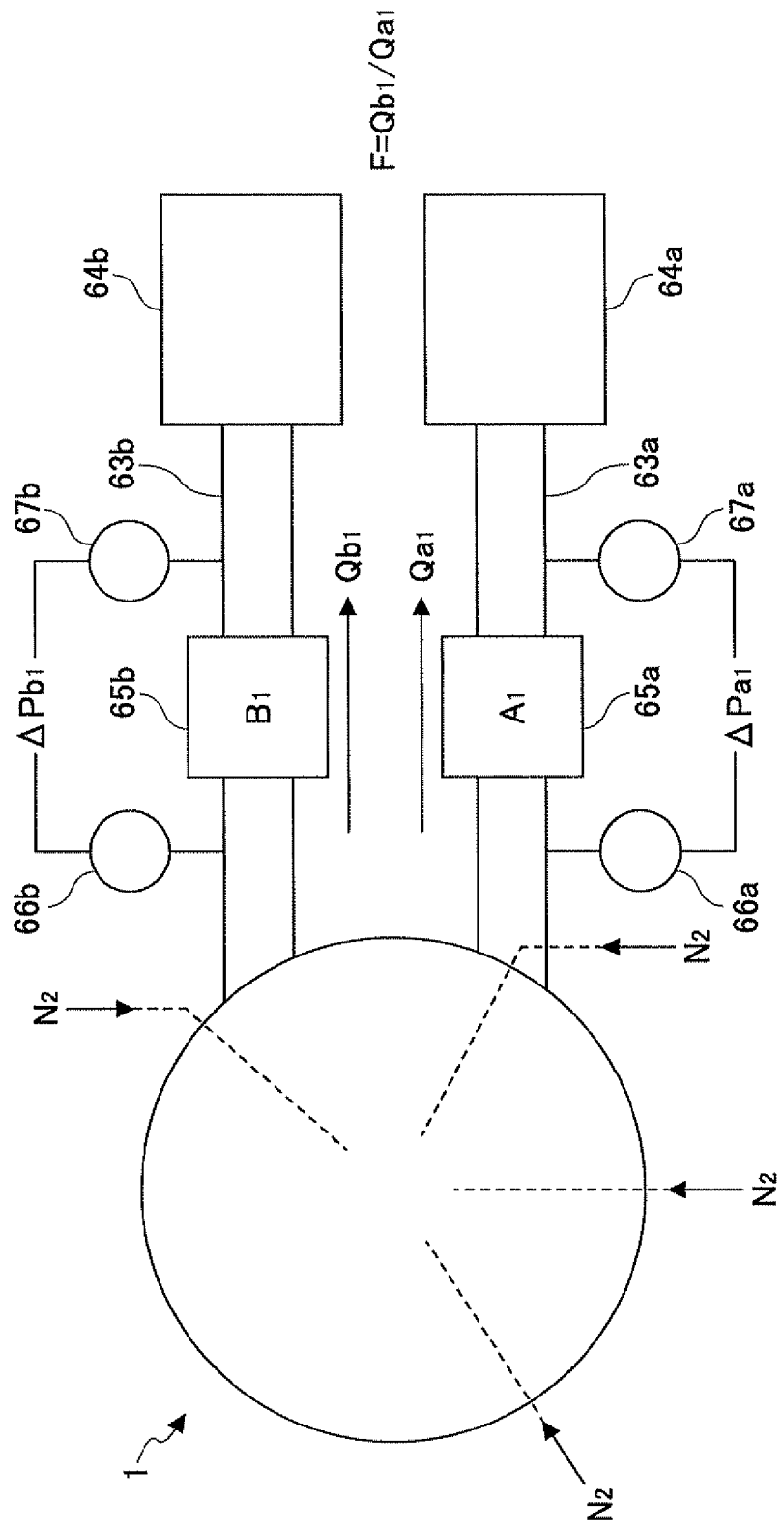
Figure 12B:
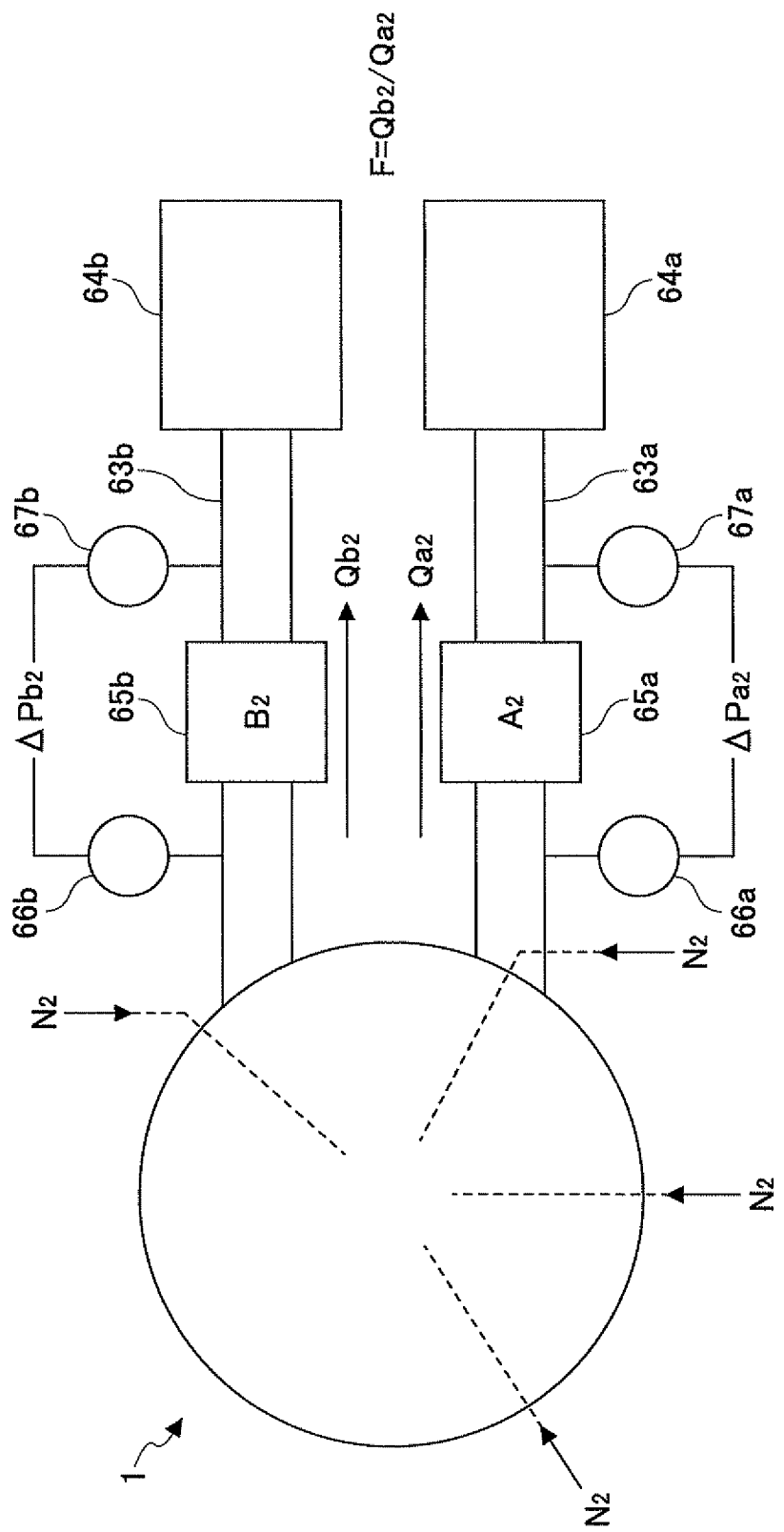

In a case where the pressure P and the flow ratio F reach the predetermined value P1, F1 by performing the steps S24-S27, the flow rate of the gas evacuated from the evacuation channels 63a, 63b become 20 sccm, 30 sccm, respectively. As illustrated in FIG. 12B, each of the opening of the first valve 65a and the opening of the second valve 65b is set to, for example, A2, B2, respectively. Even in a case where time is up in Step S28, the amount of deviation between the adjusted pressure P and the predetermined value P1 and the amount of deviation between the adjusted flow ratio F and the predetermined flow ratio F1 becomes smaller as the aforementioned Steps S24-S27 are repeated because the adjustment of the pressure P of the first pressure valve 65a and the adjustment of the pressure of the second pressure valve 65b are alternately performed. Accordingly, the pressure P and the flow ratio F are significantly close to the corresponding predetermined value P1 and F1 even when the time is up. Therefore, the operation proceeds to the film deposition process of Step S14 even in the case where the time is up.

In order to maintain the pressure P and the flow ratio F set by performing the above-described steps, the opening of the first valve 65a and the opening of the second valve 65b are slightly adjusted. In this embodiment, a wide area is provided by cutting out (notching) the inner circumferential wall of the chamber body 12 provided at a lower side of the second ceiling surface 45. The evacuation ports 61, 62 are provided below this wide space. Accordingly, the pressure in the space below the second ceiling surface 45 is lower than the pressure in the narrow space below the first ceiling surface 44 and lower than the pressure in the center portion area C.

Figure 14A:
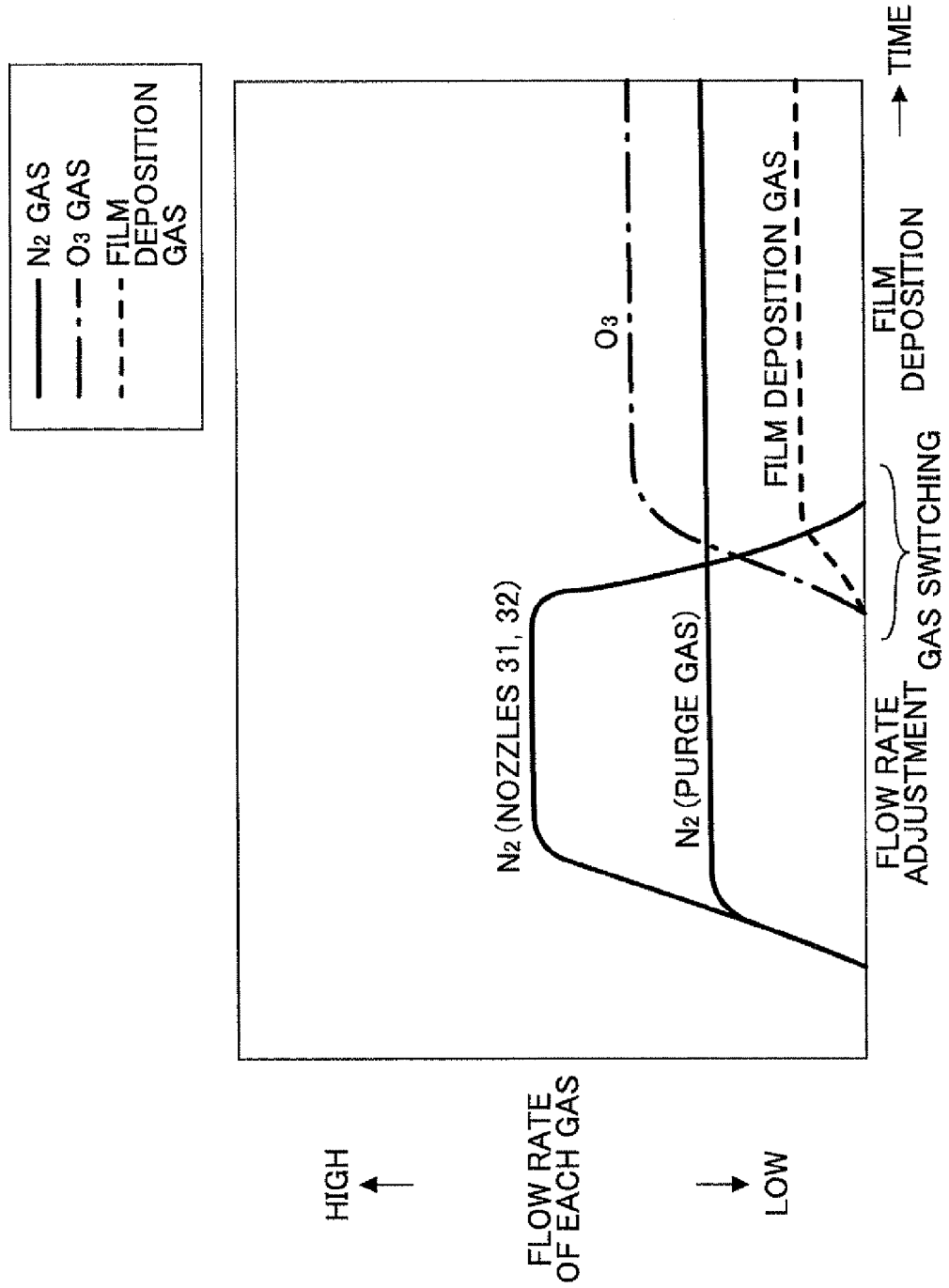
FIGS. 14A and 14B is a schematic diagram illustrating, for example, the pressure in a chamber in a middle of an operation according to the first embodiment of the present invention.
Figure 14B:
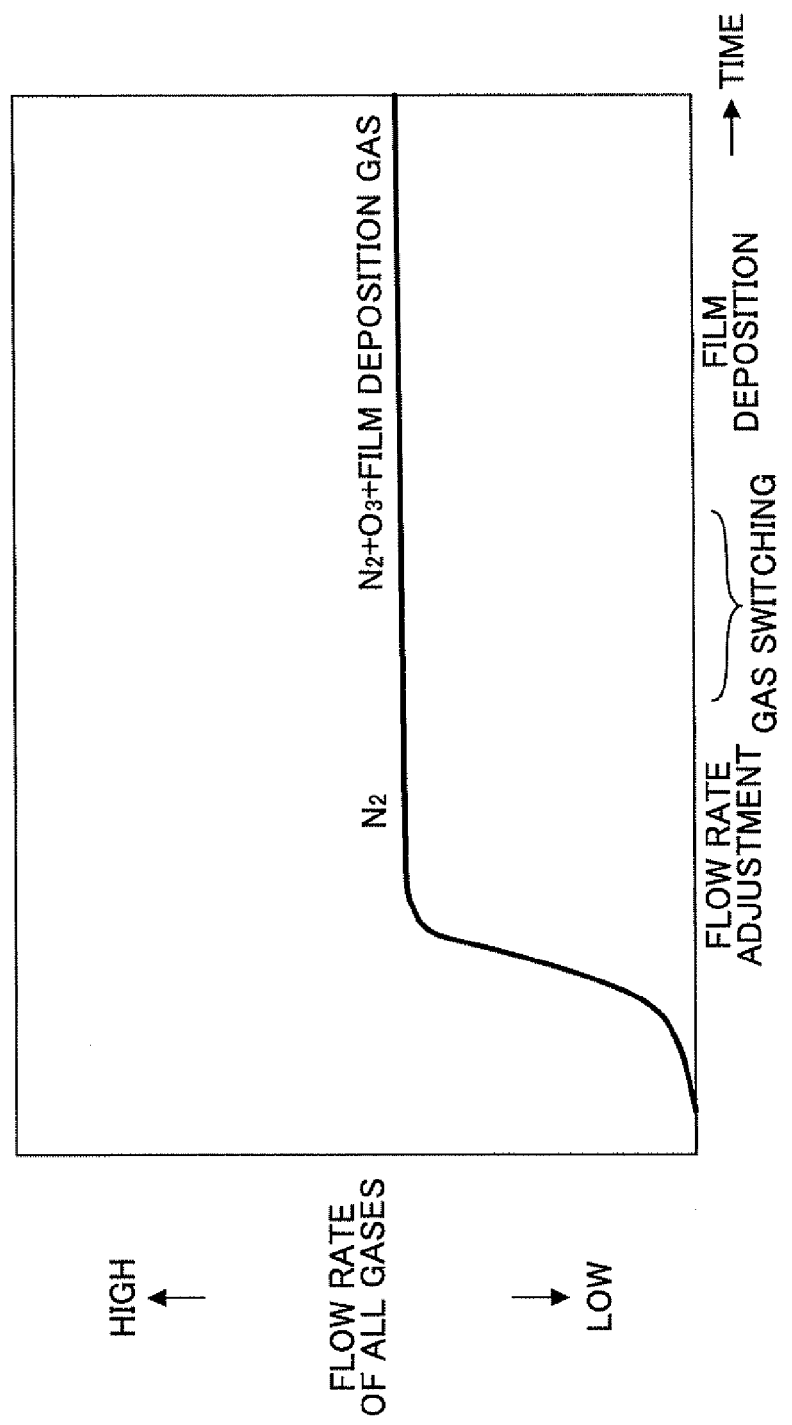

Then, it is determined whether the temperature of the wafer W has reached a predetermined temperature by a temperature sensor (not illustrated) and whether the pressure P in the chamber 1 and the flow ratio F of the evacuation gases has stabilized to a steady state. Then, as FIG. 14A shows, the gases supplied from the first and second reaction nozzles 31, 32 are switched from N2 gas to BTBAS gas and O3 gas, respectively (Step S14). As illustrated in FIG. 14B, the gases are switched in a manner that the total flow rate of the gases supplied to the chamber 1 (gases supplied from the nozzles 31, 32) does not change. By switching the gases in this manner, change in the flow of gases applied to the wafer W as well as the pressure inside the chamber 1 can be restrained. Accordingly, as illustrated in FIG. 12C, the pressure P inside the chamber 1 and the flow ratio F of evacuation gas can be maintained at predetermined values P1 and F1 without having to perform adjustment of the first and second valves 65a, 65b by performing the steps S21-S28.

Figure 15:
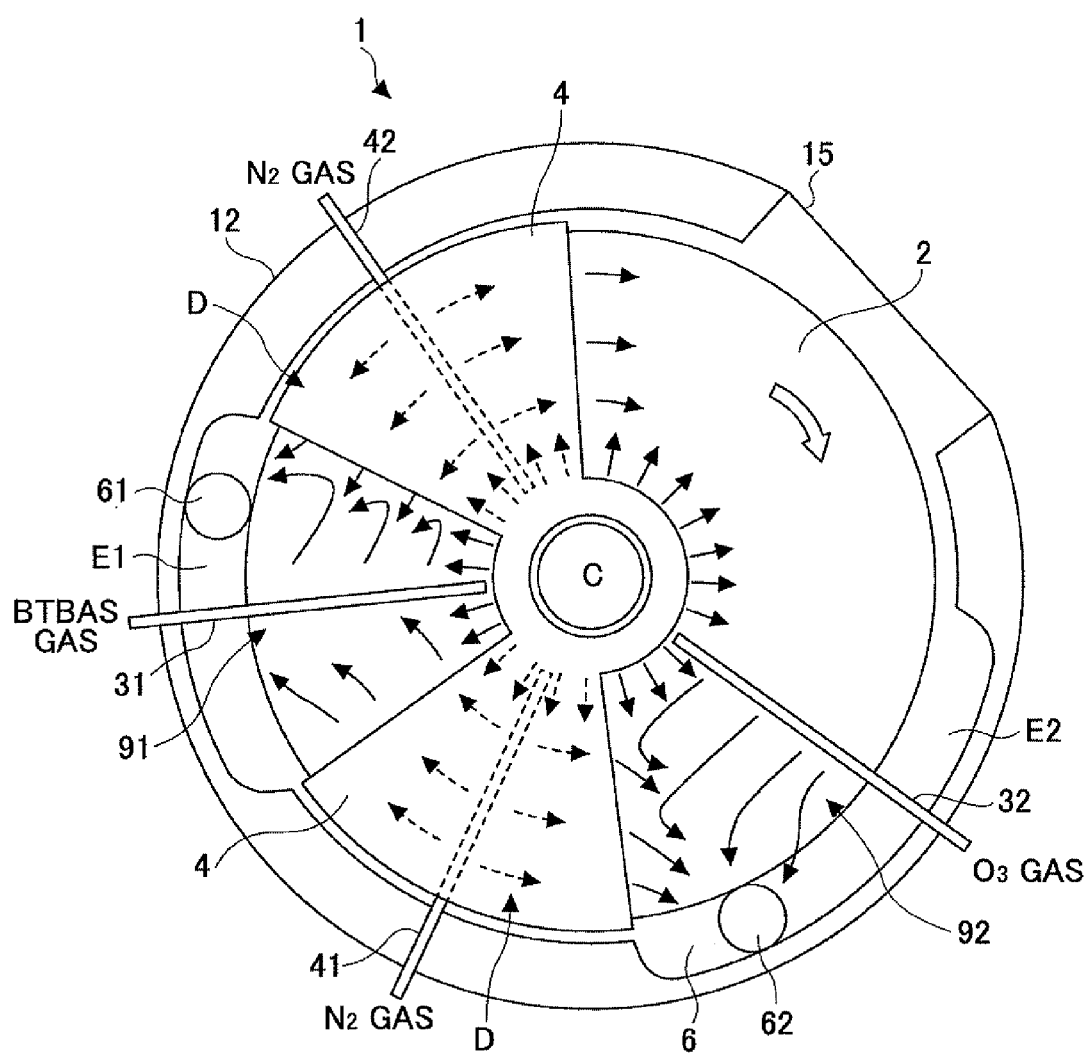
FIG. 15 is a schematic diagram for describing a state where first and second reaction gases are separated by separation gases and evacuated according to the first embodiment of the present invention.

Because the inside of the chamber 1 can be maintained at a steady state after gases are switched, the flow of gas with respect to an in-plane direction or in-between surfaces of the wafer W can be stabilized as illustrated in FIG. 15. Further, the flow of gas supplied to the wafer W during the film deposition process maintains a steady state because the opening of the valve 65a, 65b are slightly adjusted during the film deposition process in a manner that the flow ratio F of the gases evacuated from the evacuation channels 63a, 63b are maintained at the predetermined value F1. It is to be noted that the flow rate of each gas is schematically illustrated in FIG. 14A.

Because the wafers W alternately pass through the first and second process areas 91, 92 by the rotation of the rotation table 2, BTBAS gas is adsorbed to the wafer W and then O3 is adsorbed to the wafer W. Thereby, one or more layers of silicon oxide are formed on the wafer W. Accordingly, a silicon oxide film having a predetermined film thickness can be deposited by forming molecular layers of silicon oxide.

In this case, N2 gas is supplied between the first and second process areas 91, 92. Further, N2 is also supplied to the center portion area C as separation gas. Further, the valve 65a, 65b are slightly adjusted so that the flow of gas supplied to the wafer W is stabilized. Accordingly, each of the BTBAS gas and the O3 gas can be evacuated so that the BTBAS gas and the O3 gas can be prevented from being mixed. Further, in the separation area(s), because the gap between the bent portion 46 and the outer edge surface of the rotation table 2 is narrow, the BTBAS gas and the O3 gas do not mix even via the outer side of the rotation table 2. Therefore, the atmosphere of the first process area 91 and the atmosphere of the second process area 92 are substantially completely separated. Thus, the BTBAS gas is evacuated from the evacuation port 61 whereas the O3 gas is evacuated from the evacuation port 62. As a result, the BTBAS gas and the O3 gas do not mix in both the atmospheres of the first and second process areas 91, 92 and on the surface of the wafers W.

In this embodiment, gas entering the evacuation area E can be prevented from passing under a lower part of the rotation table 2 because the lower part of the rotation table 2 is purged with N2 gas. Thus, for example, BTBAS gas can be prevented from entering the area where O3 gas is supplied. After the film deposition process is completed, the supply of gases are stopped and each wafer W is transferred outside in order by the transfer arm 10 (Step S16).

An example of process parameters preferable in the film deposition apparatus according to this embodiment is listed below.

rotational speed of the rotation table 2: 1-500 rpm (in the case of the wafer W having a diameter of 300 mm)

flow rate of N2 gas from the separation gas pipe 51: 5000 sccm the number of rotations of the rotation table 2 (number of times in which the wafer W passes the process areas 91, 92): 600 rotations (depending on the film thickness required)

With the above-described embodiment, first and second process areas 91, 92 to which the reaction gases of BTSAS gases and O3 gases are supplied are formed in the same chamber in the rotation direction of the rotation table 2. When forming a thin film by forming plural layers of reaction products by passing a wafer W through the first and second process chambers 91, 92 by rotating the rotation table 2, separation gas is supplied to a separation area between the first and second process areas, separation areas D are provided between the first and second process chambers 91, 92 along with providing first and second evacuation channels 63a, 63b including evacuation ports 63a, 63b for separating and evacuating different reaction gases. The opening of the first valve 65a and the opening of the second valve 65b are adjusted so that the flow ratio F of the gases evacuated from the evacuation channels 63a, 63b becomes a predetermined value F1, and the pressure P inside the chamber 1 becomes P1. Therefore, the flow of gas on both sides of the separation areas can be stabilized. Thus, because the flow of the reaction gases (BATAS, O3) applied to the surface of the wafer W can be stabilized, the adsorption of BTBAS gas can be stabilized and the oxide reaction of the adsorbed molecules of O3 gas can be stabilized. As a result, the wafer W can obtain a satisfactory thin film having an even film thickness with respect to an in-plane direction or in-between surfaces of the wafer W.

Furthermore, because bias of evacuation on both sides of the separation areas D can be prevented, BTBAS gas and O3 gas can be prevented from passing through the separation areas and become mixed. Accordingly, reaction products can be prevented from being formed on areas besides the surface of the wafers W. Thus, formation of particles can be prevented. It is to be noted that the above-described embodiment of the present invention may be applied to a case where a single wafer is placed on the rotation table 2.

In the above-described embodiment of the present invention, both the first and second valves 65a, 65b are fully evacuated in Step S21. Alternatively, in a case where the first valve 65a is adjusted in Step S24, the second valve 65b can have its opening adjusted in the same manner by calculating the opening of the second valve 65b and the flow rate of the gas evacuated from the second evacuation chamber 63b. In this case, adjustment of the pressure value and adjustment of flow ratio can both be speedily performed. In this case, the pressure or the flow ratio that is adjusted becomes less (amount of change), and a reaction gas other than N2 gas may be used to adjust pressure or flow ratio.

In the above-described embodiment of the present invention, the flow rate of N2 gas when adjusting the pressure P or the flow ratio F is set to be substantially the same flow rate of the reaction gas when switching gases and performing film deposition. However, as long as the flow rate of N2 gas when adjusting the pressure P or the flow ratio F is near the flow rate of the reaction gas when switching gases and performing film deposition (e.g., ±5), turbulence of the gas applied to the wafer W can be suppressed.

In the above-described embodiment of the present invention, when time is up in Step S28, the operation proceeds to steps S14 and thereafter is assumed that the pressure P and the flow ratio F are substantially close to corresponding predetermined values P1, F1. An alarm may be output for stopping a subsequent film deposition process.

Second Embodiment

In the first embodiment, the pressure in the chamber 1 and the flow ratio F of the evacuation channels 63a, 63b are controlled by relying only on the adjustments of the opening of the first and second valves 65a, 65b. Alternatively, the control may be performed by further adding adjustment of the flow rate (evacuation performance) of the evacuation pump 64b by adjusting the number of rotations of the evacuation pump 64b.

Figure 16:
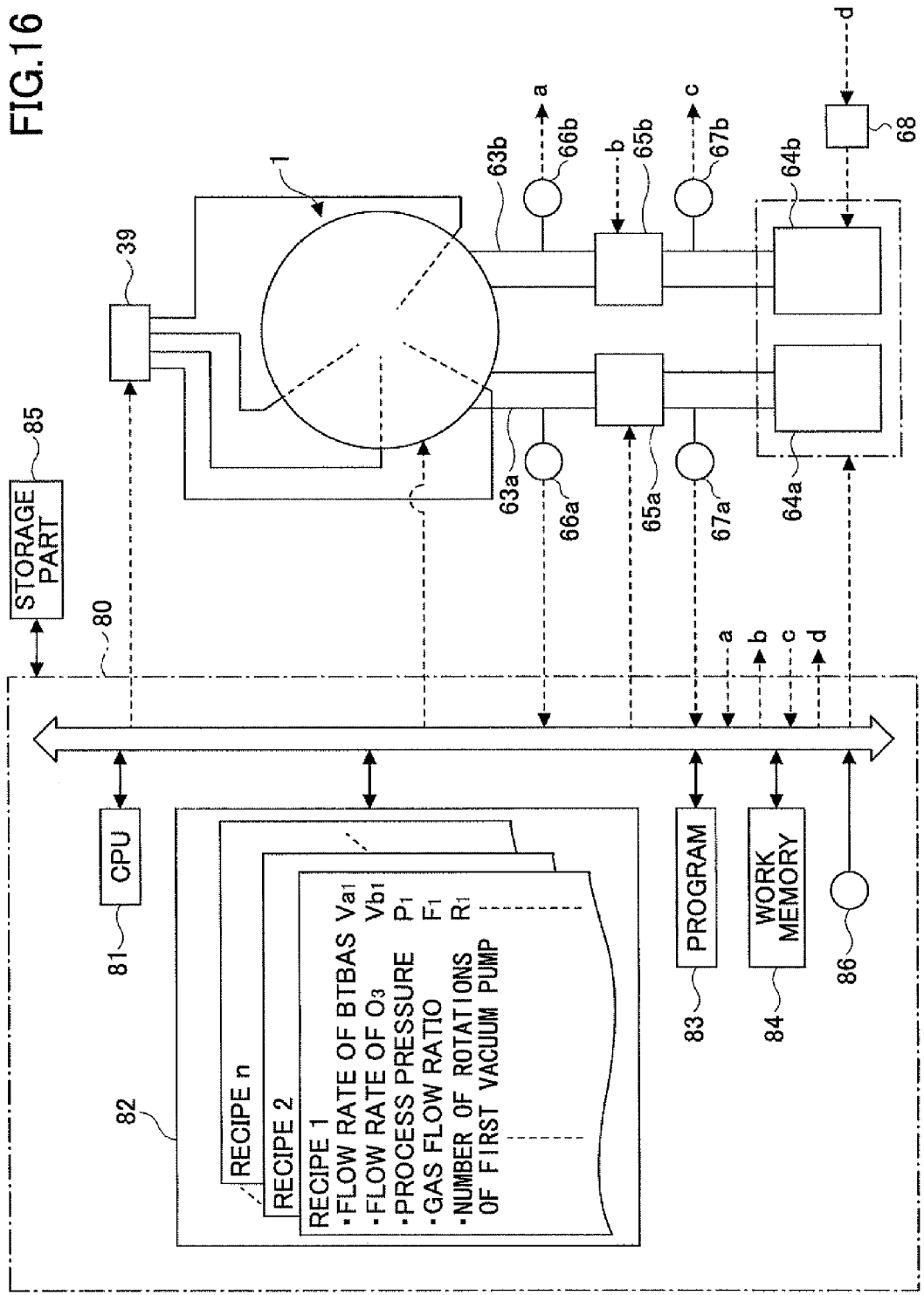
FIG. 16 is a schematic diagram illustrating an example of a film deposition apparatus according to a second embodiment of the present invention.

As illustrated in FIG. 16, the evacuation pump 64b is connected to an inverter 68 serving as a part for adjusting evacuation flow rate of the evacuation pump 64b. The inverter 68 is configured to adjust the electric current flowing in the evacuation pump 64b, that is the number of rotations (evacuation flow rate) of the evacuation pump 64b. Accordingly, in this embodiment, the number of rotations R of the evacuation pump 64b is stored in correspondence with this recipe. It is to be noted that, components and effects of the film deposition apparatus according to this embodiment is substantially the same as the above-described embodiments of the present invention and further explanation thereof is omitted.

Figure 17:
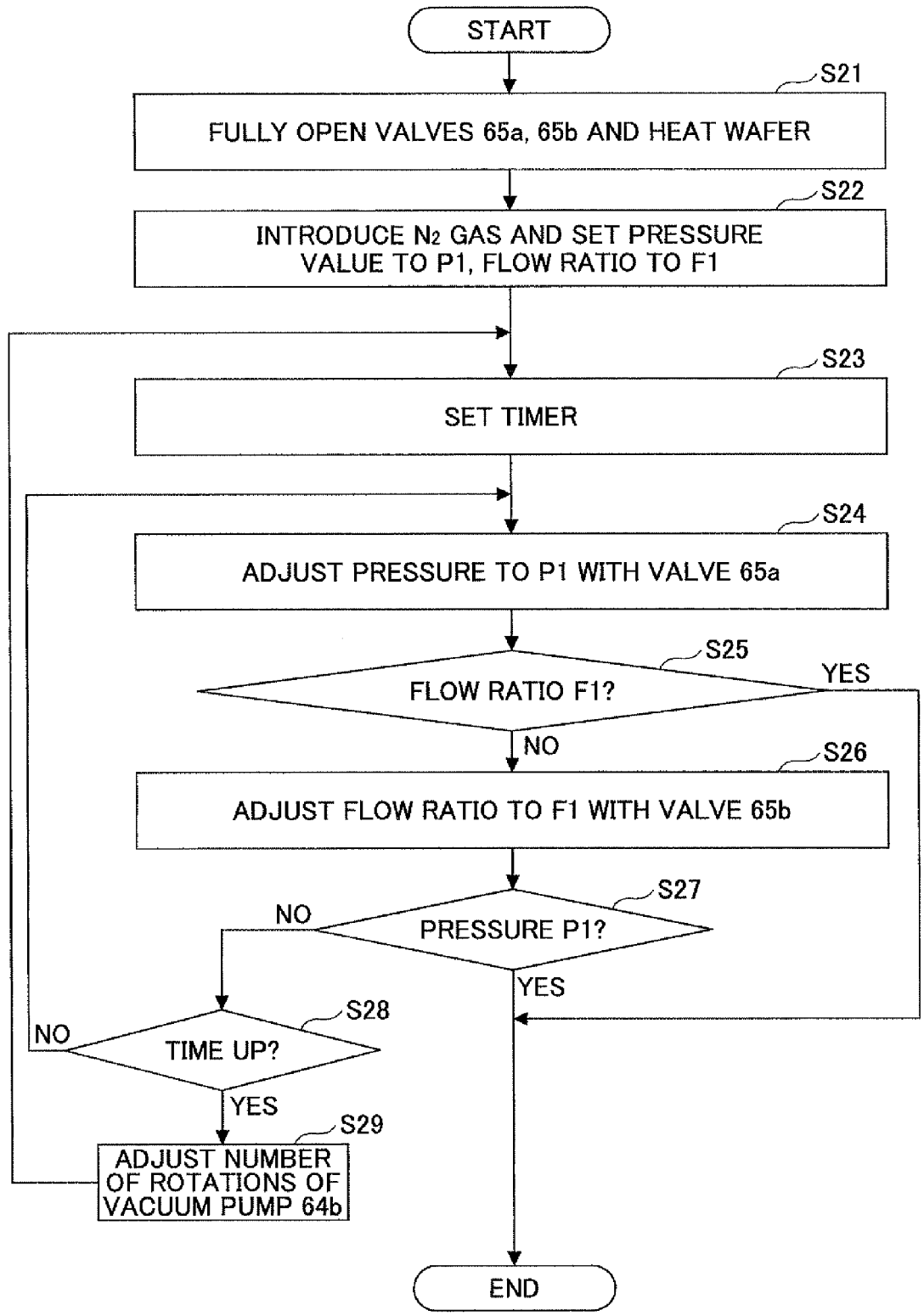
FIG. 17 is a flowchart illustrating an example in a case of adjusting an evacuation flow rate with the film deposition apparatus according to the second embodiment of the present invention.

As illustrated in FIG. 17, in a case where the time is up after repeating the steps of controlling the pressure of the first valve 65a and controlling the flow rate of the second valve 65b (Step S28), the third step of adjusting the number of rotations R of the evacuation pump 64b is performed (Step S29). For example, after the flow ratio F is adjusted by the second valve 65b (Step S26), the pressure P is determined (Step S27). In a case where the pressure P is deviated from the predetermined value P1, the amount of evacuation of the evacuation pump 64b is adjusted so that the pressure P becomes the predetermined value P1. For example, in a case where the pressure is equal to or greater than the predetermined value P1, that is, in a case where the evacuation amount of the evacuation pump 64b is insufficient, the value of the electric current of the inverter 68 is set so that the evacuation amount of the evacuation pump 64b is increased by increasing the number of rotations R of the vacuum pump 64b. On the other hand, in a case where the pressure P is less than the predetermined value P1, the evacuation amount of the evacuation pump 64b is reduced by reducing the number of rotations R of the evacuation pump 64b.

Then, the above-described steps S24-S27 are repeated after resetting the repetition time t1 with the timer 86. In a case where the pressure P and the flow ratio F are adjusted to the predetermined values P1 and F1 in Steps S25 and S27, the operation proceeds to the film deposition process (Step S14).

In a case where the pressure P and the flow ratio F has not reached the predetermined values P1 and F1 even by the adjustment of the number of rotations R of the evacuation pump 64b, adjustment of the number of rotations R of the evacuation pump 64b is repeated in Step S29. The steps S24-S28 are repeated until the repetition time t1 elapses or the pressure P and the flow ratio F reach the predetermined values P1 and F1. It is to be noted that even in a case where the pressure P and the flow ratio F has not reached the predetermined values P1 and F1 after the elapse of the repetition time t1, the adjusted pressure P and the adjusted flow ratio F become closer towards corresponding predetermined values P1 and F1 becomes smaller because the opening of the valves 65a, 65b and the number of rotations R of the evacuation pump 64b are adjusted. Accordingly, the pressure P and the flow ratio F become close to the predetermined values P1 and the flow ratio F even when the time is up. Thus, the operation proceeds to the film deposition process of Step S14 even in the case where the time is up.

With the above-described embodiment of the present invention, the following effect can be obtained. That is, even in a case where the pressure P and the flow ratio F cannot be adjusted to the predetermined values P1 and F1 within the repetition time (t1) by adjusting the opening of the first and second valves 65a, 65b, the opening of the first and second valves 65a, 65b can be re-adjusted by adjusting the number of rotations R of the evacuation pump 64b. Therefore, even if there is a difference in the evacuation performance between the evacuation pumps 64a, 64b, the pressure P and the flow ratio F can be set to become the predetermined values P1 and F1. In other words, by adjusting the number of rotations R of the evacuation pump 64b along with adjusting the opening of the valves 65a, 65b, the pressure P and the flow ratio F can be set in a wide range.

In the above-described embodiment, the number of rotations R of the evacuation pump 64b is adjusted. Alternatively, the evacuation pump 64a may be connected to the inverter so that the number of rotation of the evacuation pump 64a is adjusted instead of the evacuation pump 64b. Alternatively, the number of rotations of both the evacuation pumps 64a and 64b may be adjusted. In a case of adjusting the number of rotations R of both the evacuation pumps 64a and 64b, the number of rotations R of both the evacuation pumps 64a and 64b may be adjusted simultaneously in Step S29. Alternatively, in a case of adjusting the number of rotations R of both the evacuation pumps 64a and 64b, the number of rotations R of the evacuation pump 64b is adjusted in Step S29, then the number of rotations R of the evacuation pump 64a is adjusted after the time is up in Step S28, then the repetition time t1 is set in Step S23, and then the opening of the valves 65a, 65b are adjusted in Steps S24-S28.

In the above-described embodiment, the step S29 is performed when the time is up in Step S28. Alternatively, the step S29 may be performed between steps S27 and S28, so that the adjustment of the opening of the valves 65a, 65b is repeated along with the adjustment of the number of rotations R of the evacuation pump 64a, for example. Further, in the step S27 (before repeating each step), the step S29 may be performed before repeating the steps S24-S27 in a case where, for example, the pressure P is significantly deviates from the predetermined value P1.

Figure 18:
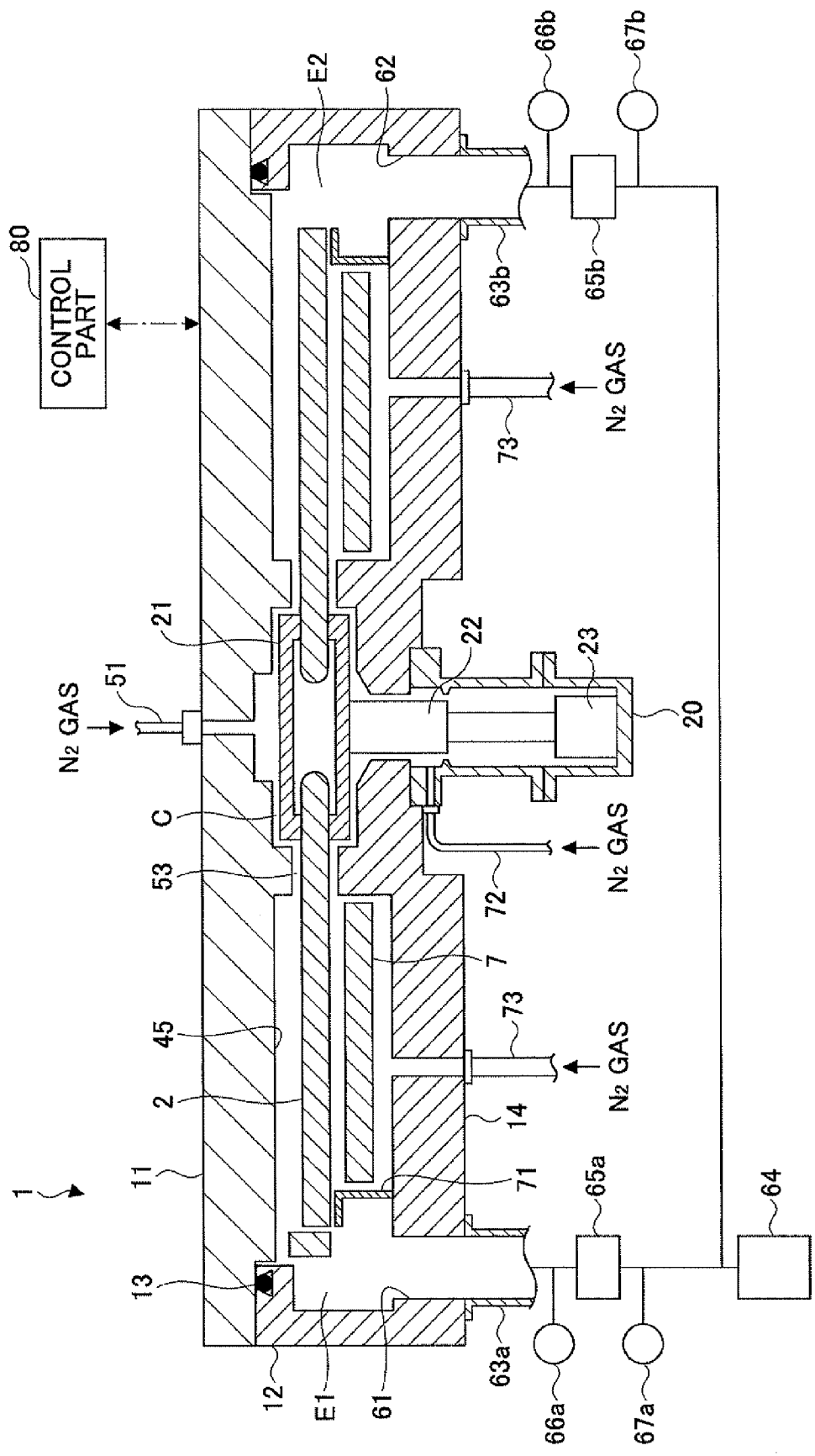
FIG. 18 is a schematic diagram illustrating another example of the film deposition apparatus according to the second embodiment of the present invention.

In the above-described embodiment, generation of reaction products inside the evacuation passages 63a, 63b and the evacuation pump 64 is prevented by separately evacuating the reaction gases from two evacuation passages 63a, 63b. In a case where reaction of reaction gases is unlikely to occur where the temperature inside the evacuation passages 63a, 63b and the evacuation pump 64 is low, the evacuation pumps 64a, 64b may be formed into a shared evacuation pump 64 as illustrated in FIG. 18. In this case, the cost of the film deposition apparatus can be reduced.

As for process gases that are used in the present invention other than those of the above-described embodiments of the present invention, there are dichlorosilane (DCS), hexachlorodisilane (HCD), Trimethyl Aluminum (TMA), tris(dimethyl amino) silane (3DMAS), tetrakis-ethyl-methyl-amino-zirconium (TEMAZr), tetrakis-ethyl-methyl-amino-hafnium (TEMHf), bis(tetra methyl heptandionate) strontium (Sr(THD)$_2$), (methyl-pentadionate)(bis-tetra-methyl-heptandionate) titanium (Ti(MPD)(THD)), monoamino-silane, or the like.

Because gas flows toward the separation area D at a higher speed in the position closer to the outer circumference of the rotation table 2, it is preferable that the width of an upstream area of the ceiling surface 44 of the separation area D with respect to the separation gas nozzles 41, 42 to be greater than the area located at the outer circumference of the rotation table 2. In view of this, it is preferable for the convex portion 4 to have a sector-shape.

Figure 19A:
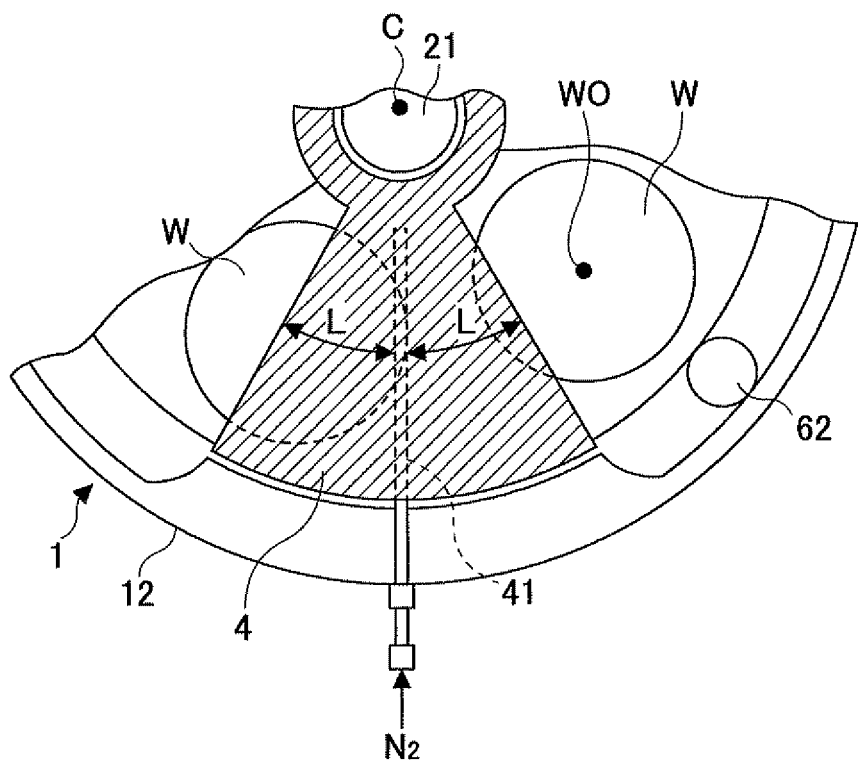
FIGS. 19A and 19B are schematic diagrams for describing measurements of a convex portion used as a separation area according to the second embodiment of the present invention.
Figure 19B:
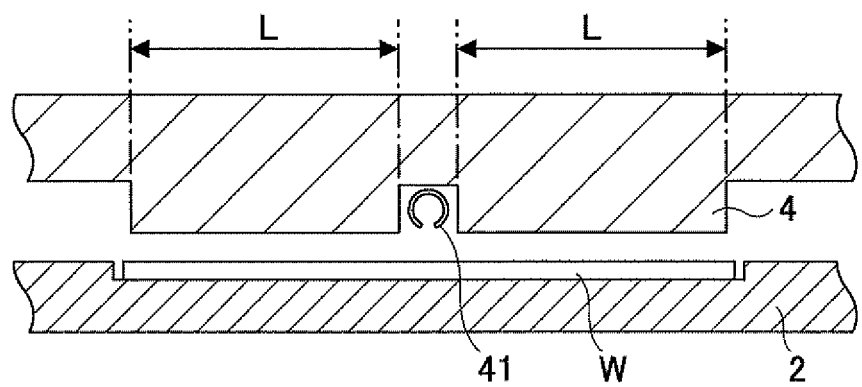

As illustrated in FIGS. 19A and 19B, in a case where a wafer W having a diameter of, for example, 300 mm is used as the target substrate, the ceiling surface 44 that creates the thin space in both sides of the separation gas nozzle 41 is preferred to have a width L equal to or greater than 50 mm in the rotation direction of the rotation table 2 at a portion where the center WO of the wafer W passes. In order to effectively prevent reaction gases from entering an area below the convex portion 4 from both sides of the convex portion 4, the distance h between the first ceiling surface 44 and the rotation table 2 is made to be short in a case where the width L is small. Further, in a case where a predetermined length is set to the distance h between the first ceiling surface 44 and the rotation table 2, the speed of the rotation table 2 becomes faster the farther away from the rotation center of the rotation table 2. Therefore, the width L required for attaining a reaction gas impeding effect becomes greater the farther away from the rotation center. When the width L is small, the height h of the thin space between the ceiling surface 44 and the rotation table 2 (wafer W) has to be made accordingly small in order to effectively prevent the reaction gases from flowing into the thin space. It is, therefore, necessary to reduce the vibration of the rotation table 2 as much as possible for preventing collision between the rotation table 2 or the wafer W and the ceiling surface 44 when the rotation table 2 is rotated. Further, it becomes easier for reactions gases to enter the lower part of the convex portion 4 from upstream of the convex portion 4 as the number of rotations of the rotation table 2 increases. Thus, when the width L is less than 50 mm, it becomes necessary to reduce the number of rotations of the rotation table 2 which is rather disadvantageous in terms of production throughput. Therefore, it is preferable for the width L to be equal to or greater than 50 mm. Nevertheless, the effects of the present invention may still be attained where the width L is equal to or less than 50 mm. In other words, it is preferable for the width L to be $\frac{1}{10}$-$\frac{1}{1}$ compared to the diameter of the wafer W, and more preferably about $\frac{1}{6}$ or greater than the diameter of the wafer W.

Figure 20:
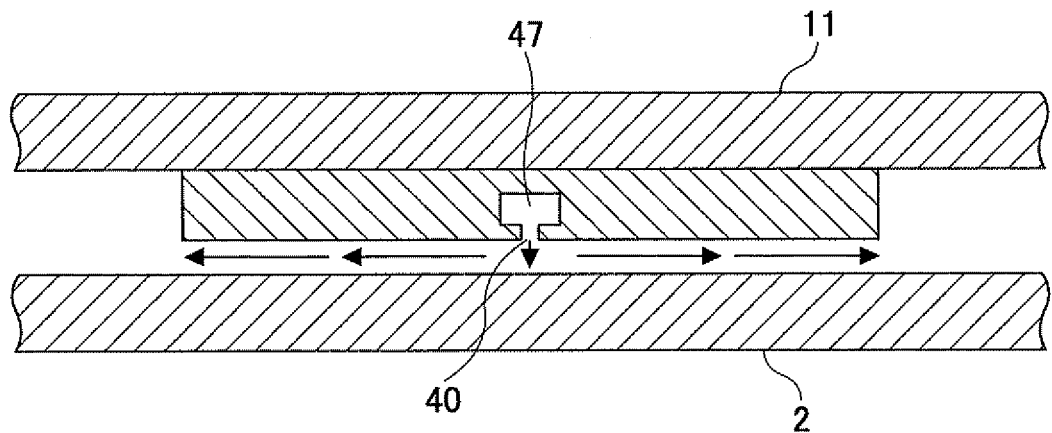
FIG. 20 is a vertical cross-sectional view illustrating another example of a separation area according to the second embodiment of the present invention.

The separation gas nozzle 41 (42) is located in the groove portion 43 formed in the convex portion 4 and the lower ceiling surfaces 44 are located in both sides of the separation gas nozzle 41 (42) in the above embodiment. However, as shown in FIG. 20, a conduit 47 extending along the radial direction of the rotation table 2 may be made inside the convex portion 4, instead of the separation gas nozzle 41 (42), and plural holes 40 may be formed along the longitudinal direction of the conduit 47 so that the separation gas (N2 gas) may be ejected from the plural holes 40 in other embodiments.

Figure 21A:
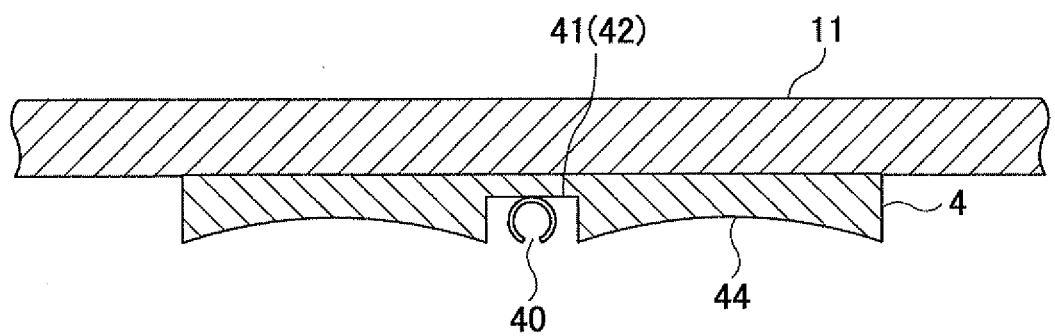
FIGS. 21A-21C are vertical cross-sectional views illustrating another example of a convex portion used as a separation area according to the second embodiment of the present invention.
Figure 21B:
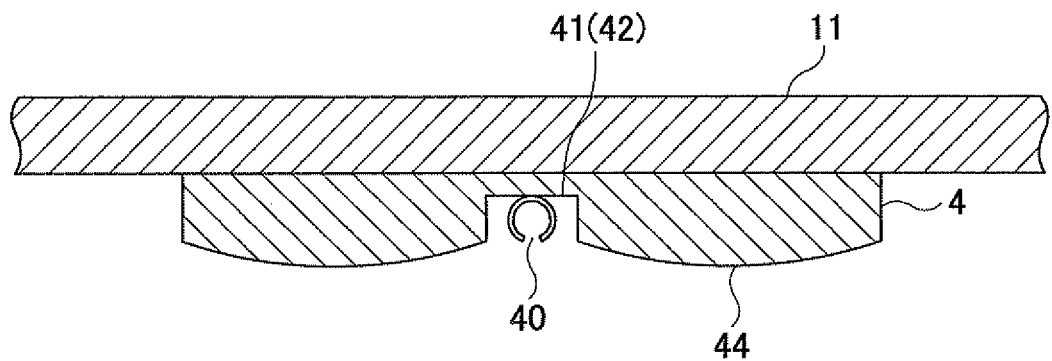
Figure 21C:
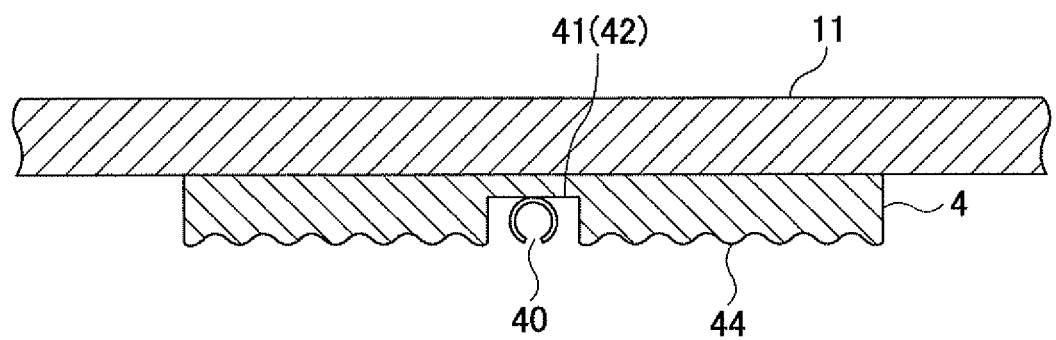

As illustrated in FIG. 21A, the ceiling surface 44 of the separation areas D may not only be formed as a flat surface but may also be formed as a recess, a protrusion as illustrated in FIG. 21B, or a wave-shape as illustrated in FIG. 21C.

The heating part for heating the wafer W may not only be a heater having a resistance heating element but may also be a lamp heating element. In addition, the heater unit 7 may be located above the rotation table 2, or above and below the rotation table 2. Further, in a case where the reaction of the reaction gases occur at a low temperature (e.g., room temperature), no heating member need to be provided.

Figure 22:
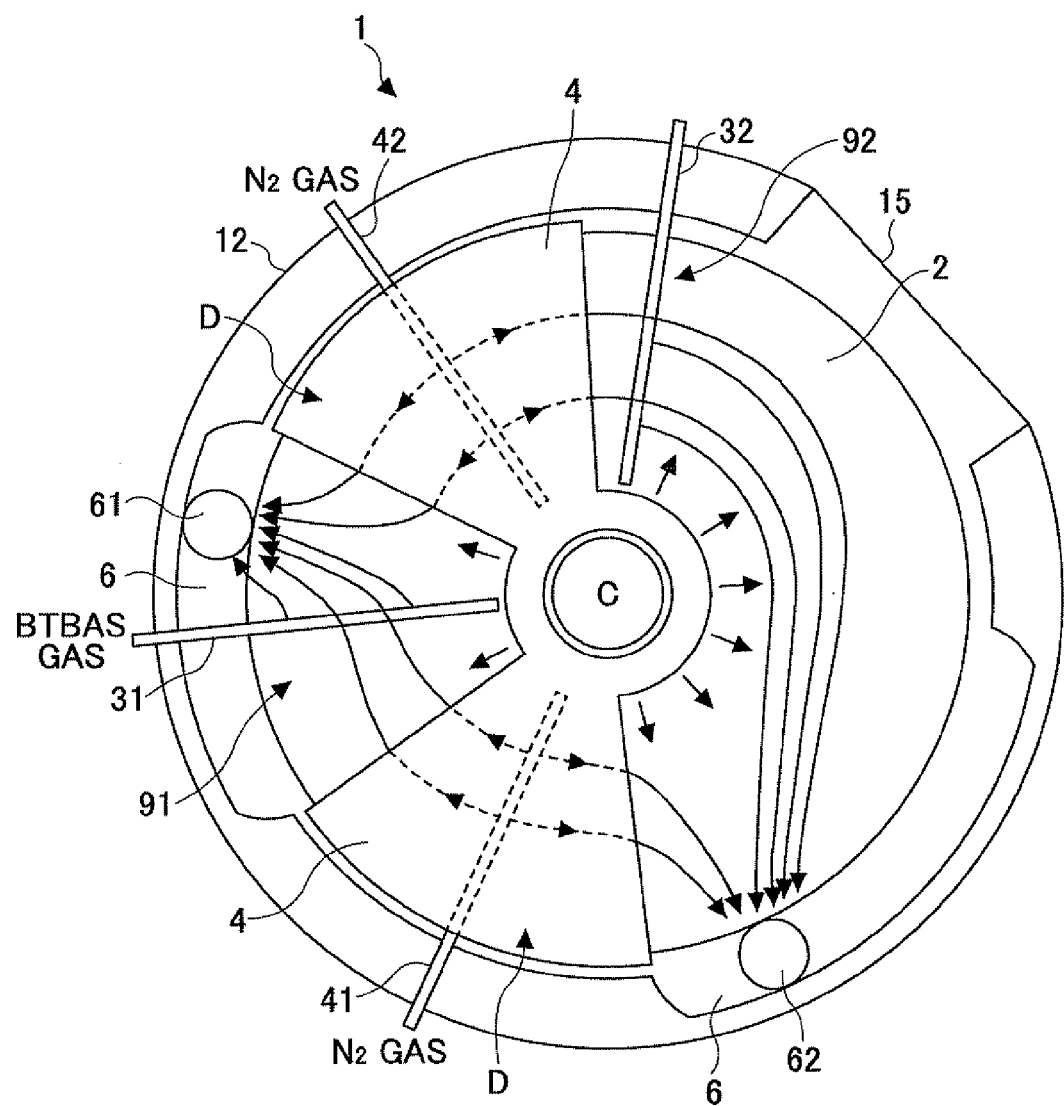
FIG. 22 is a horizontal cross-sectional view illustrating a film deposition apparatus according to an embodiment of the present invention.
Figure 23:
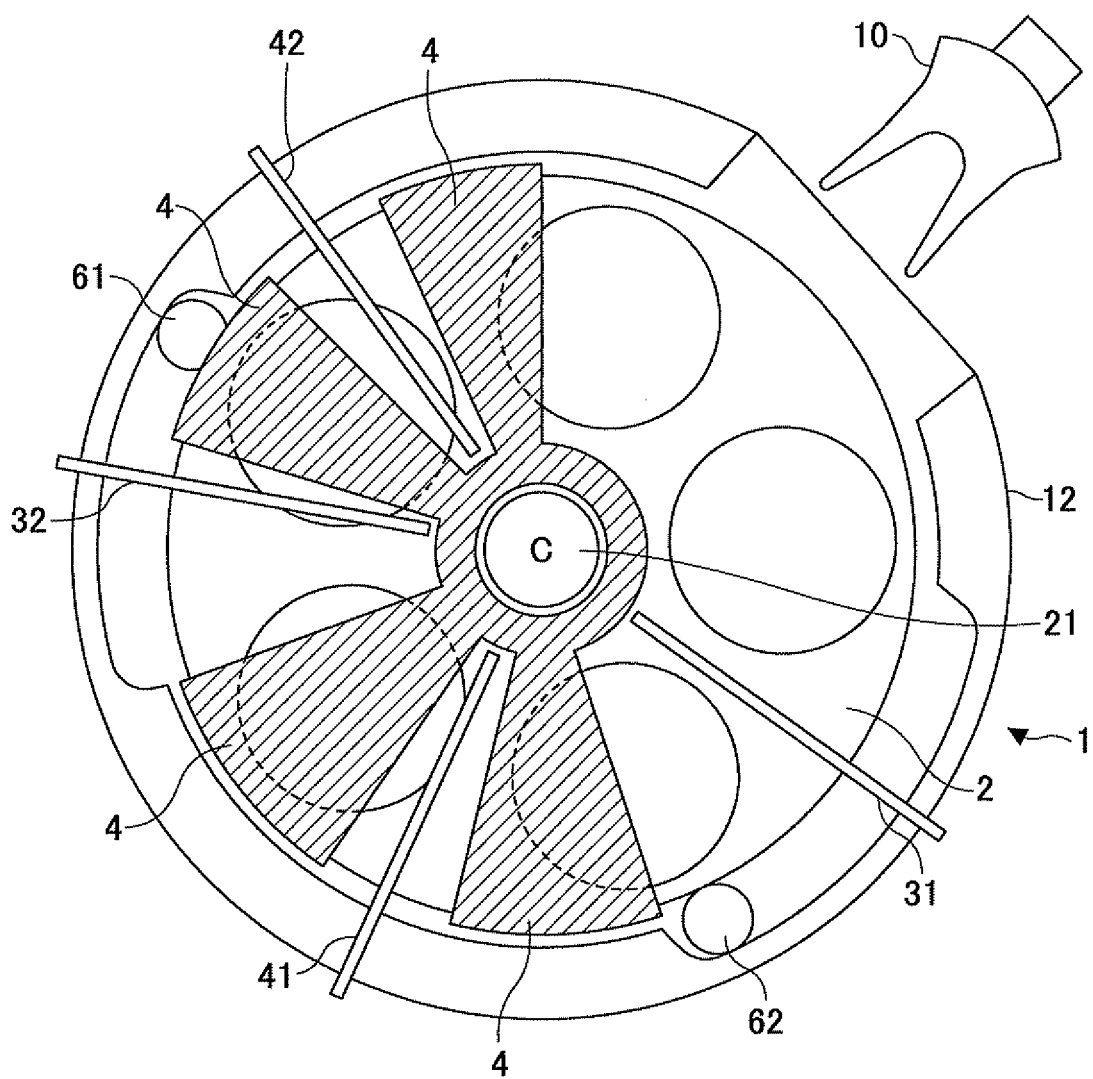
FIG. 23 is a horizontal cross-sectional view illustrating a film deposition apparatus according to an embodiment of the present invention.

Examples of the layout of the process areas 91, 92 and the separation areas D other than the above-described embodiments of the present invention are described below. FIG. 22 illustrates an example where the second reaction nozzle 32 is positioned upstream from the transfer opening 15 with respect to the rotation direction of the rotation table 2. The same effect as the above-described embodiments of the present invention can be attained even with this layout. The separation areas D may be configured having the sector-shaped convex portion 4 divided into two sector-shaped convex portions in the circumferential direction with the separation gas nozzle 41 (42) provided therebetween. FIG. 23 illustrates a plan view of this configuration. In this case, for example, the distance between the sector-shaped convex portion 4 and the separation gas nozzle 41 (42) or the size of the sector-shaped convex portion 4 may be set to enable the separation areas D to effectively exhibit a separating effect taking the ejection flow rate of the separation gas or the ejection flow rate of the reaction gas.

Figure 24:
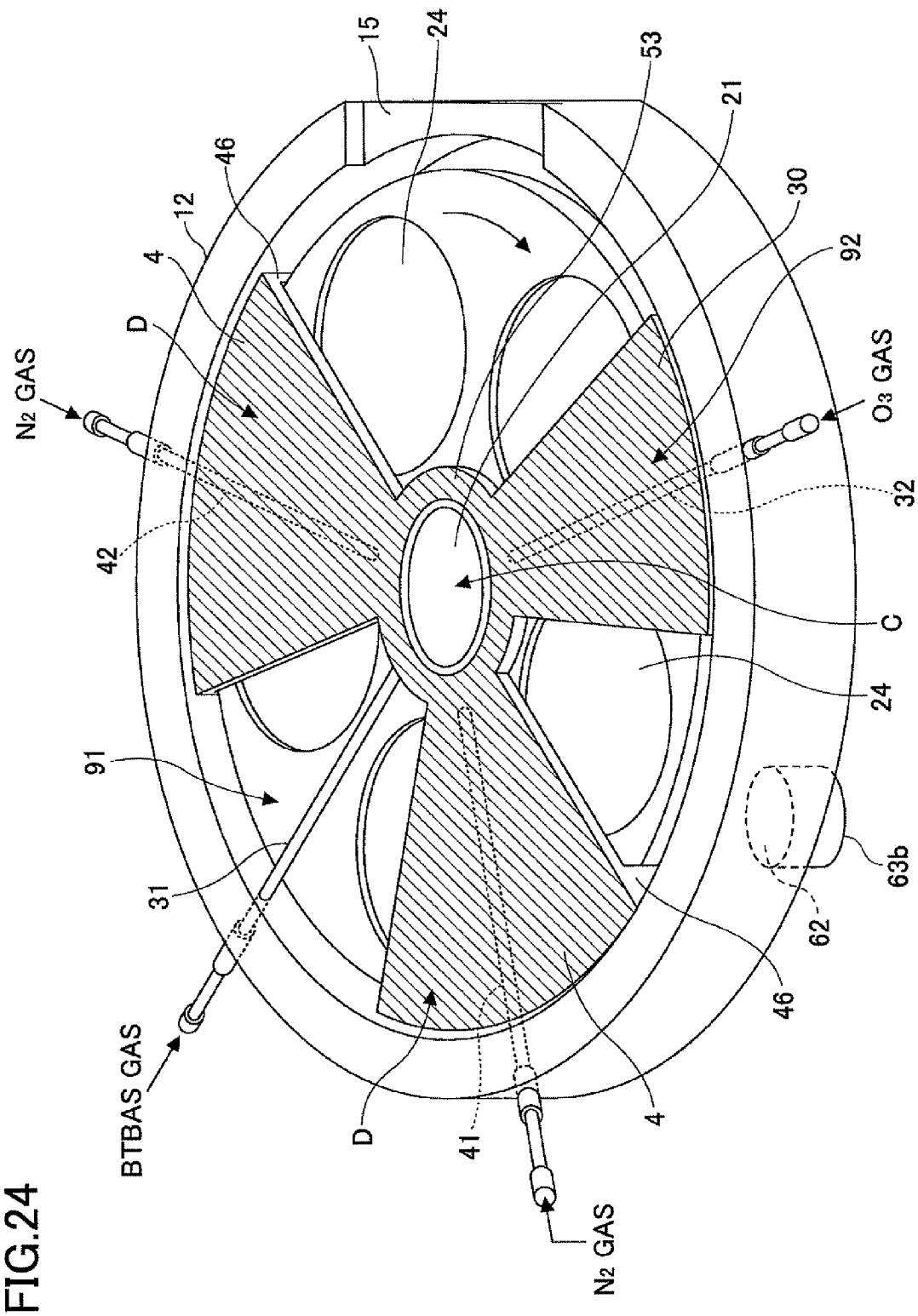
FIG. 24 is a perspective view illustrating a configuration of the inside of a film deposition apparatus according to an embodiment of the present invention.

In the above-described embodiment of the present invention, the first and second process areas 91 and 92 correspond to an area having a ceiling surface higher than the ceiling surface of the separation area D. However, in this embodiment, at least one of the first and second process areas 91 and 92 has ceiling surfaces that face the rotation table 2 on both sides of the gas supplying part relative to the rotation direction in the same manner as the separation area D to form a space for impeding gas from entering the space between the ceiling surfaces and the rotation table 2 and these ceiling surfaces are lower than the ceiling surfaces (second ceiling surfaces) on both sides of the separation area D relative to the rotation direction. FIG. 24 illustrates an example of this configuration. In the second process area 92 (in this example, adsorption area of O3 gas), the second reaction gas nozzle 32 is provided below the sector shaped convex portion 4. Other than providing the second reaction gas nozzle instead of the separation gas nozzle 41 (42), the second process area 92 in this embodiment is substantially the same as the separation area D.

Figure 25:
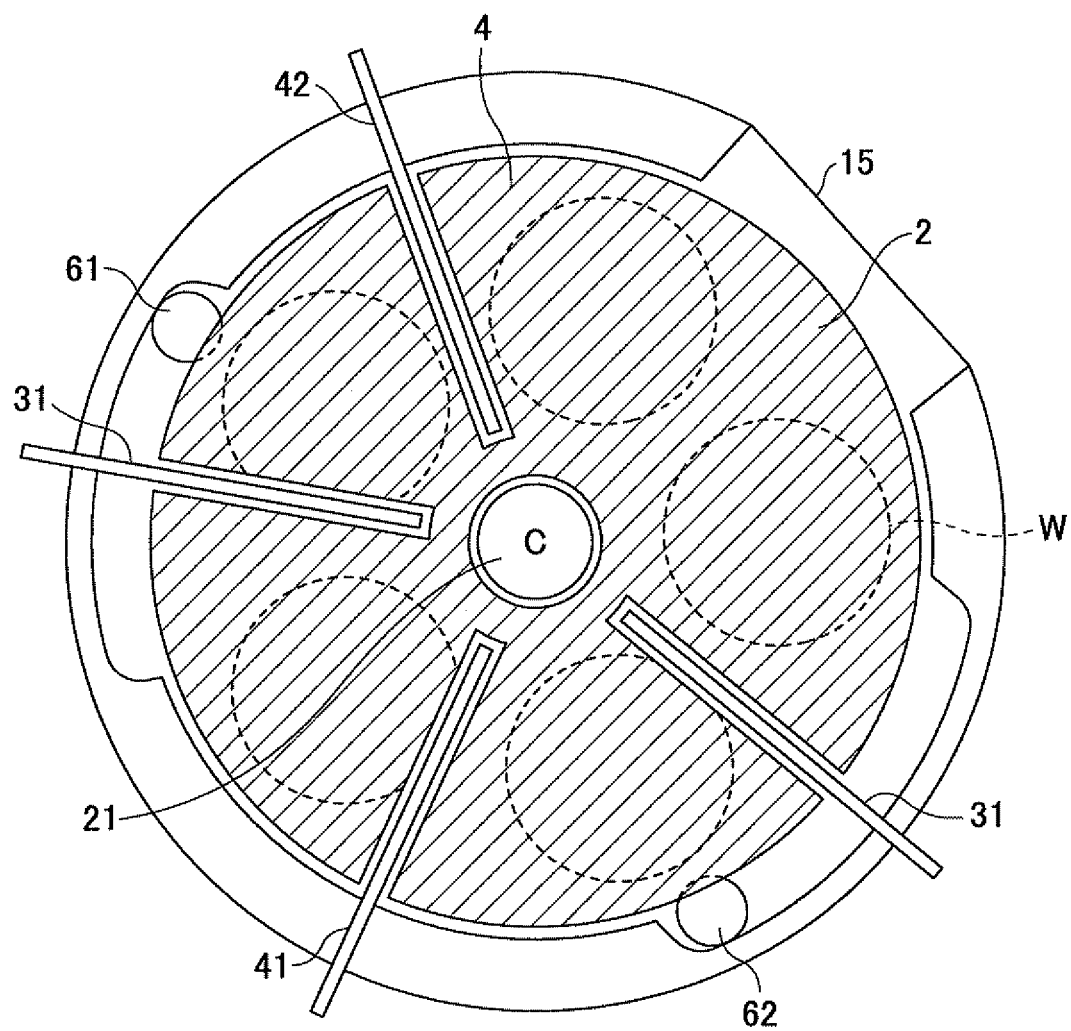
FIG. 25 is a horizontal cross-sectional view illustrating a film deposition apparatus according to an embodiment of the present invention.

In this embodiment, as illustrated in FIG. 25, in addition to providing low ceiling surfaces (first ceiling surfaces) 44 on both sides of the separation gas nozzle 41 (42) for forming narrow gaps, low ceiling surfaces are also provided on both sides of the reaction gas nozzle 31 (32), so that the ceiling surfaces are formed to be continuous. In other words, even in a case where the convex portion 4 is provided to the entire area facing the rotation table 2, the same effect can be attained except at the areas other than the areas where the separation gas nozzle 41 (42) and the reaction gas nozzle 31 (32) are provided. From a different standpoint, this configuration has the first ceiling surfaces 44 on both sides of the separation gas nozzle 41 (42) extending to the reaction gas nozzle 31 (32). In this case, although the separation gas diffusing to both sides of the separation nozzle 41 (42) and separation gas diffusing to both sides of the reaction gas nozzle 31 (32) merge at a lower part of the convex portion 4 (narrow gap), the gases are evacuated from the evacuation port 61 (62) positioned between the separation gas nozzle 42 (41) and the reaction gas nozzle 31 (32).

Figure 26:
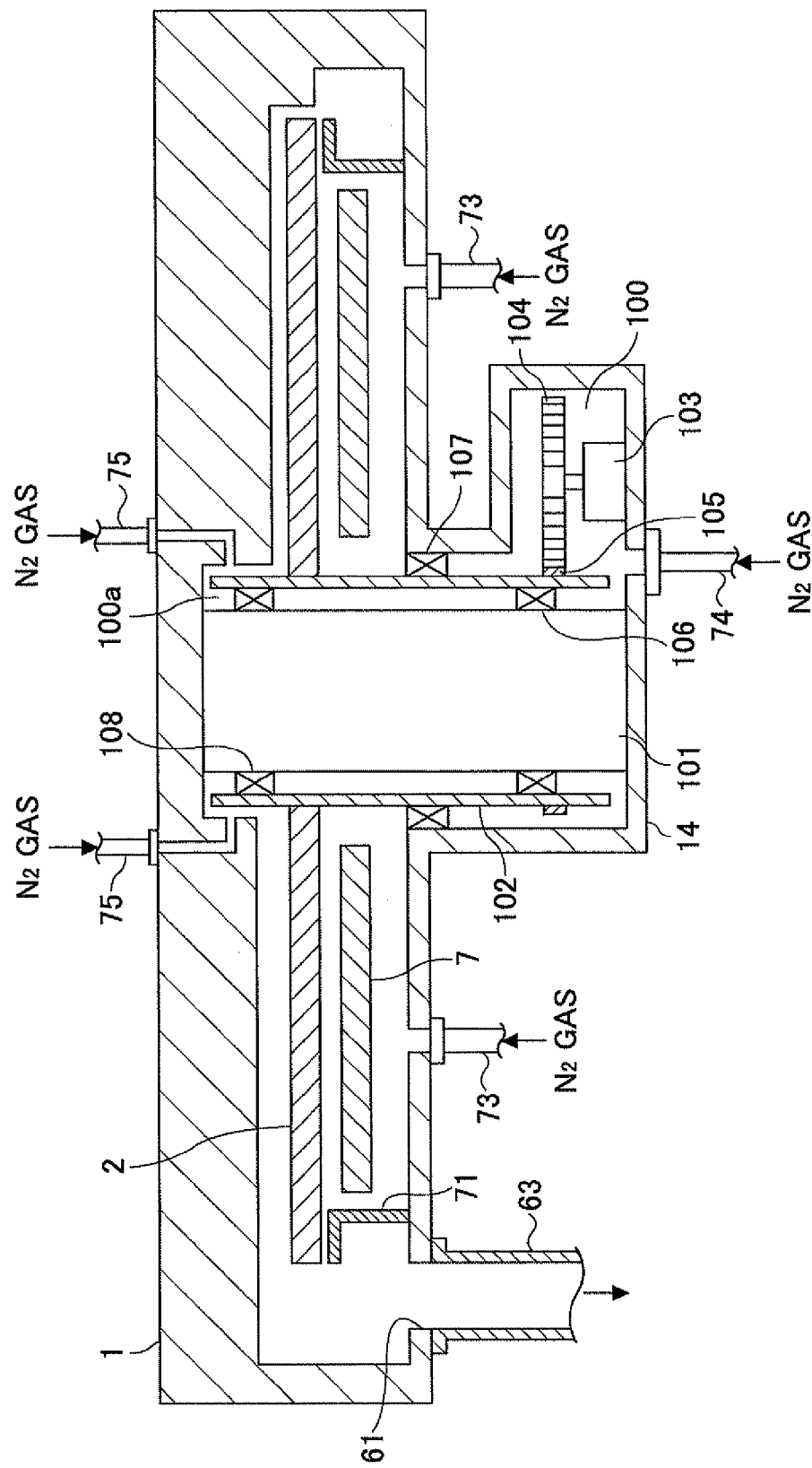
FIG. 26 is a vertical cross-sectional view illustrating a film deposition apparatus according to an embodiment of the present invention.

In the above embodiments, the rotation shaft 22 for rotating the rotation table 2 is located in the center portion of the chamber 1. In the above-described embodiment of the present invention, the space between the core portion 21 of the rotation table 2 and the ceiling plate 11 of the chamber 1 is purged with the separation gas. However, the chamber 1 may be configured as illustrated in FIG. 26. In the film deposition apparatus of FIG. 26, the bottom portion 14 of the chamber body 12 includes a housing space 100 of a driving portion and a concave portion 100a formed on the upper surface of the center portion of the chamber 1. A pillar 101 is placed between the bottom surface of the housing space 100 and the upper surface of the concave part 100a at the center portion of the chamber 1 for preventing the first reaction gas (BTBAS) ejected from the first reaction gas nozzle 31 and the second reaction gas (O3) ejected from the second reaction gas nozzle 32 from being mixed through the center portion of the chamber 1.

In addition, a rotation sleeve 102 is provided so that the rotation sleeve 102 coaxially surrounds the pillar 101. A ring-shape rotation table 2 is provided along the rotation sleeve 102. Further, a driving gear portion 104, which is driven by a motor 103, is provided in the housing space 100. The rotation sleeve 102 is rotated by the driving gear portion 104 via a gear portion 105 formed on the outer surface of the rotation sleeve 82. Reference numerals 106, 107, and 108 indicate bearings. A purge gas supplying pipe 74 is connected to a bottom part of the housing space 100, so that a purge gas is supplied into the housing space 100. Another purge gas supplying pipe 75 is connected to an upper part of the housing space 100, so that a purge gas is supplied between a side surface of the concave portion 100a and an upper edge part of the rotation sleeve 102. Although opening parts for supplying the purge gas to the space between the side surface of the concave portion 100a and the upper edge part of the rotation sleeve 102 are illustrated in a manner provided on two areas (one on the left and one on the right) in FIG. 26, the number of the opening parts (purge gas supplying port) may be determined so that the purge gas from the BTBAS gas and the O3 gas in the vicinity of the rotation sleeve 102 can be prevented from being mixed.

In the embodiment illustrated in FIG. 26, a space between the side wall of the concave portion 80a and the upper end portion of the rotation sleeve 82 corresponds to the ejection hole for ejecting the separation gas. Thus, in this embodiment, the ejection hole, the rotation sleeve 102, and the pillar 101 constitute the center portion area provided at a center part of the chamber 1.

Although the two kinds of reaction gases are used in the film deposition apparatus according to the above embodiment, three or more kinds of reaction gases may be used in other film deposition apparatuses according to other embodiments of the present invention. In this case, a first reaction gas nozzle, a separation gas nozzle, a second reaction gas nozzle, a separation gas nozzle, and a third reaction gas nozzle may be arranged in this order relative to the circumferential direction of the chamber 1, and the separation areas including respective separation nozzles may have the same configuration as those in the above-described embodiments. In this case, an evacuation channel, a pressure gage, and/or a valve may be provided in communication with each process chamber, to thereby perform the above-described adjustment of the evacuation flow rate (pressure difference between front and rear valves) in each process area.

Figure 27:
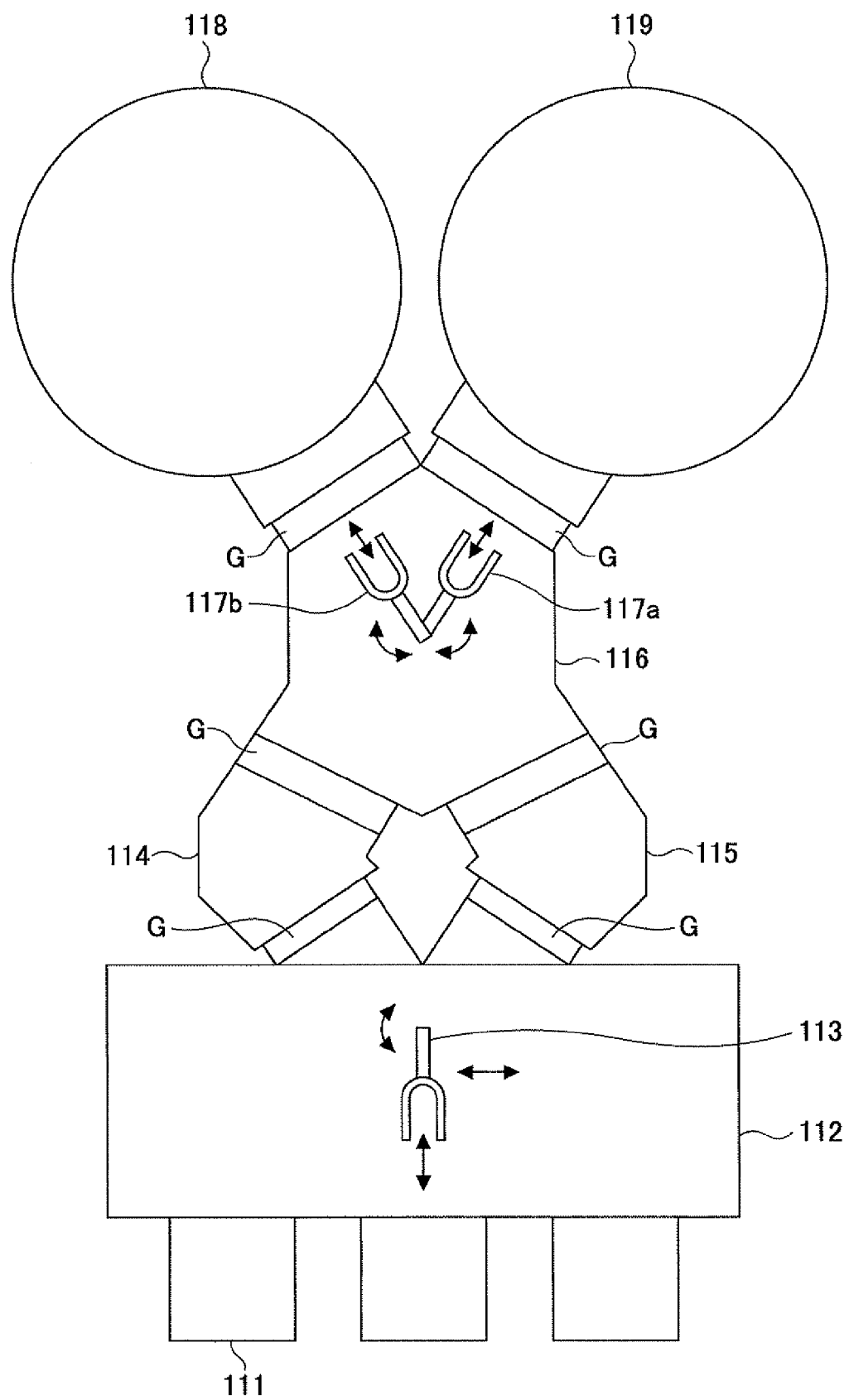
FIG. 27 is a plan view illustrating an example of a substrate processing system using a film deposition apparatus of the present invention.

The film deposition apparatus according to embodiments of the present invention may be integrated into a wafer process apparatus, an example of which is schematically illustrated in FIG. 27. The wafer process apparatus includes an atmospheric transfer chamber 112 in which a transfer arm 113 is provided, load lock chambers (preparation chambers) 114, 115 whose atmosphere is changeable between vacuum and atmospheric pressure, a vacuum transfer chamber 116 in which two transfer arms 107a, 107b are provided, and film deposition apparatuses 118, 119 according to embodiments of the present invention. In addition, the wafer process apparatus includes cassette stages (not shown) on which a wafer cassette 111 is placed. The wafer cassette 111 is brought onto one of the cassette stages, and connected to a transfer in/out port provided between the cassette stage and the atmospheric transfer chamber 112. Then, a lid of the wafer cassette 111 is opened by an opening/closing mechanism (not shown) and the wafer is taken out from the wafer cassette 111 by the transfer arm 117. Next, the wafer is transferred to the load lock chamber 114 (115). After the load lock chamber 114 (115) is evacuated, the wafer in the load lock chamber 114 (115) is transferred further to one of the film deposition apparatuses 118, 119 through the vacuum transfer chamber 117 by the transfer arm 107a (107b). In the film deposition apparatus 118 (119), a film is deposited on the wafer in such a manner as described above. Because the wafer process apparatus has two film deposition apparatuses 118, 119 that can house five wafers at a time, the ALD (or MLD) mode deposition can be performed at high throughput.

In the above-described embodiments of the present invention, in stabilizing the flow of each reaction gas in the chamber 1, the openings of the first and second valves 65a, 65b provided in the evacuation channels 63a, 63b are adjusted so that, for example, the flow ratio F of the evacuation gas flowing inside the two evacuation channels 63a, 63b is equal. Alternatively, the opening of the first and second valves 65a, 65b may be adjusted so that the pressure difference between each of the process areas 91, 92 becomes smaller. In this case, a film deposition apparatus and a film deposition method are described with reference to FIGS. 28-31. In the below-described embodiments, like components are denoted by like reference numerals as for the above-described embodiments and are not further explained.

Figure 28:
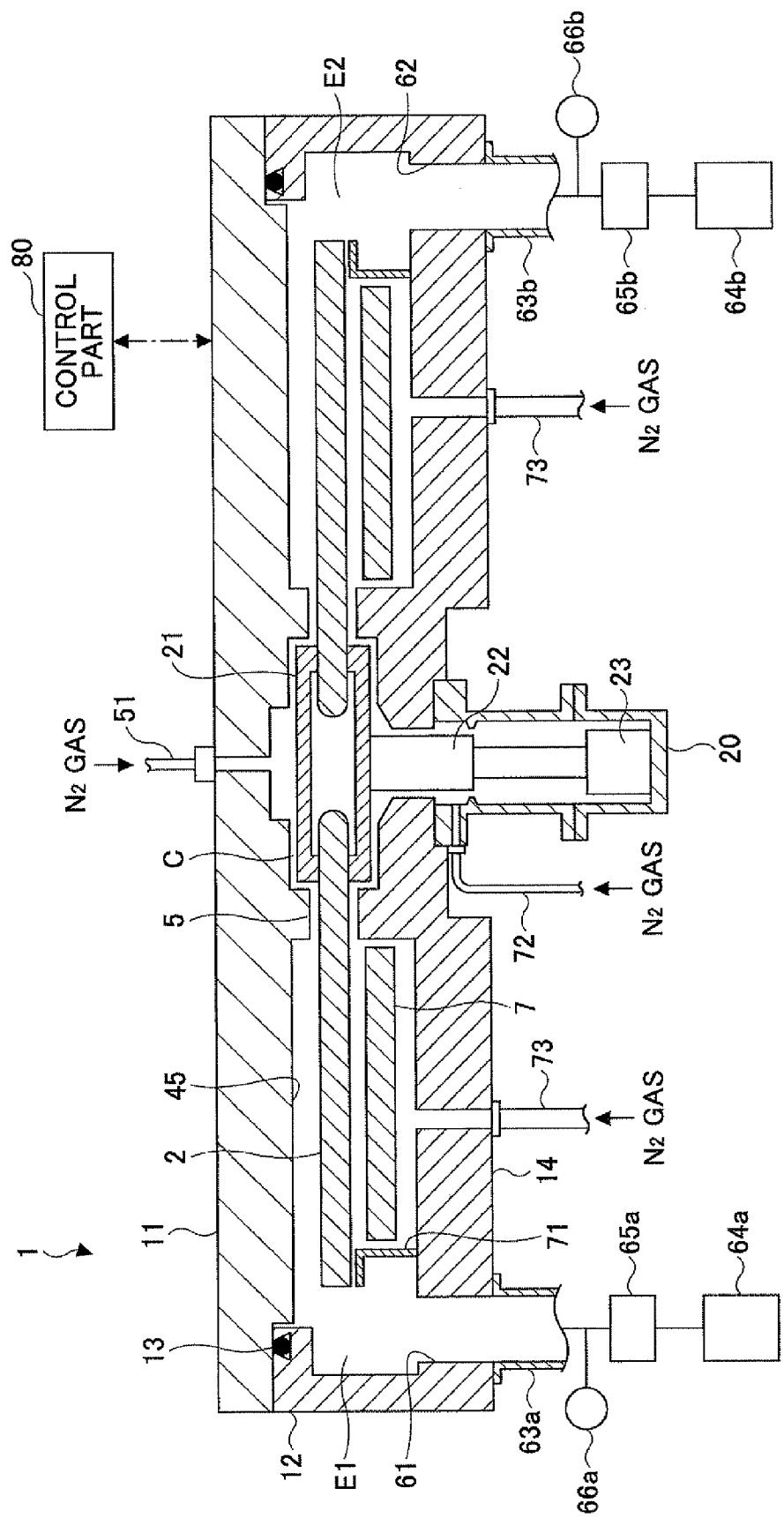
FIG. 28 is a vertical cross-sectional view illustrating a film deposition apparatus according to another embodiment of the present invention.

In this embodiment, as illustrated in FIG. 28, the first and second process pressure detecting parts 66a, 66b provided in the evacuation channels 63a, 63b are for measuring the pressure of the first and second process areas 91, 92. In this embodiment, the first and second pressure detecting parts 67a, 67b do not need to be provided in the evacuation channels 63a, 63b.

Figure 29:
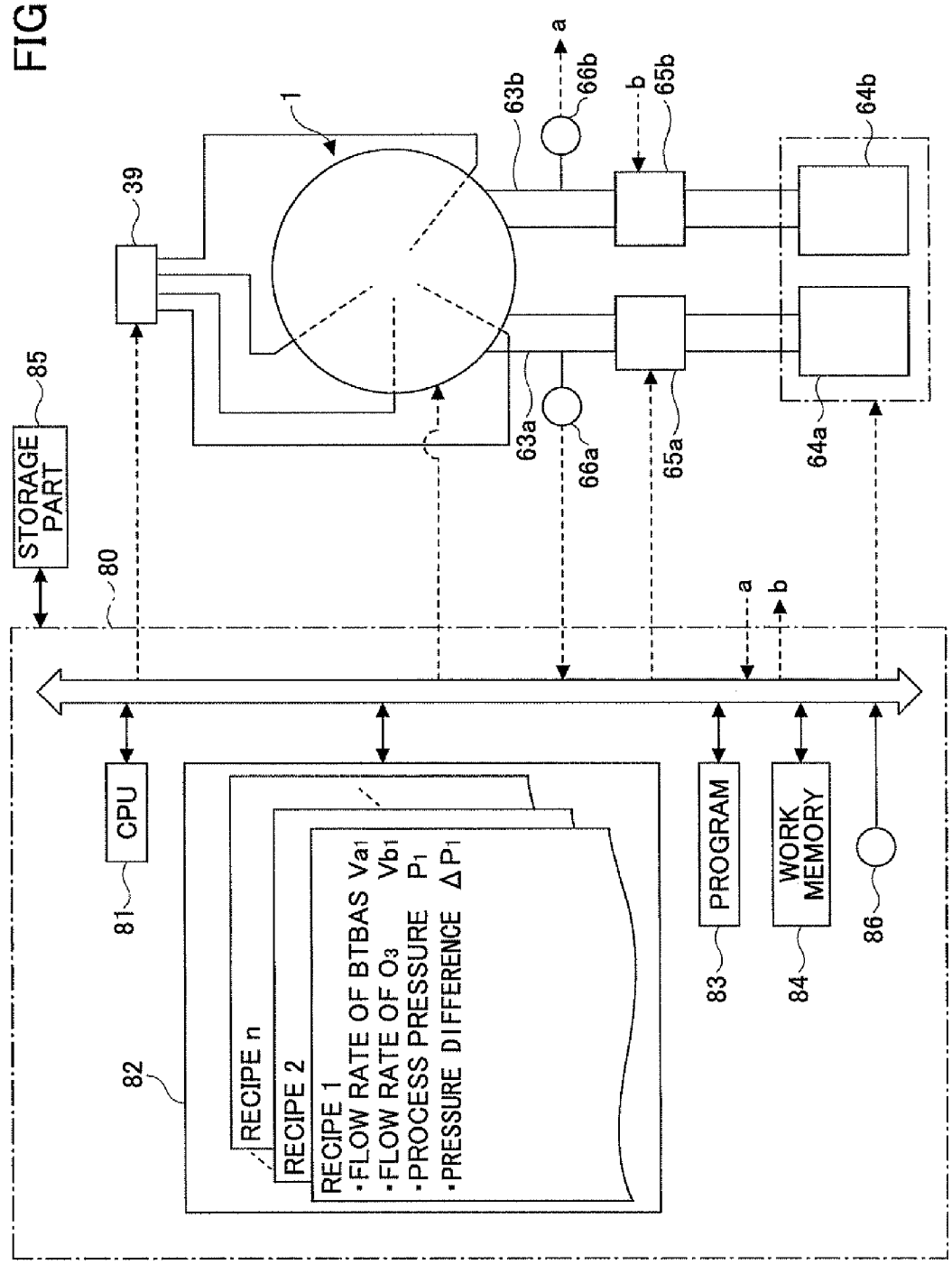
FIG. 29 is a schematic diagram illustrating an example of a control part of the film deposition apparatus according to another embodiment of the present invention.

As illustrated in FIG. 29, instead of storing the gas flow ratio F, the pressure difference $\Delta P$ allowed between the first and second process areas 91, 92 is stored in the memory 82 in correspondence with each recipe. In other words, in a case where the pressure difference $\Delta P$ between each process area 91, 92 in the chamber 1 is large, the flow of gas may become unstable because reaction gas tends to flow from a high pressure area to a low pressure area via the separation area D between the process areas 91, 92. However, in this embodiment, the flow of gas is stabilized by restraining the pressure difference $\Delta P$ between each process area 91, 92 to a small amount.

Figure 30:
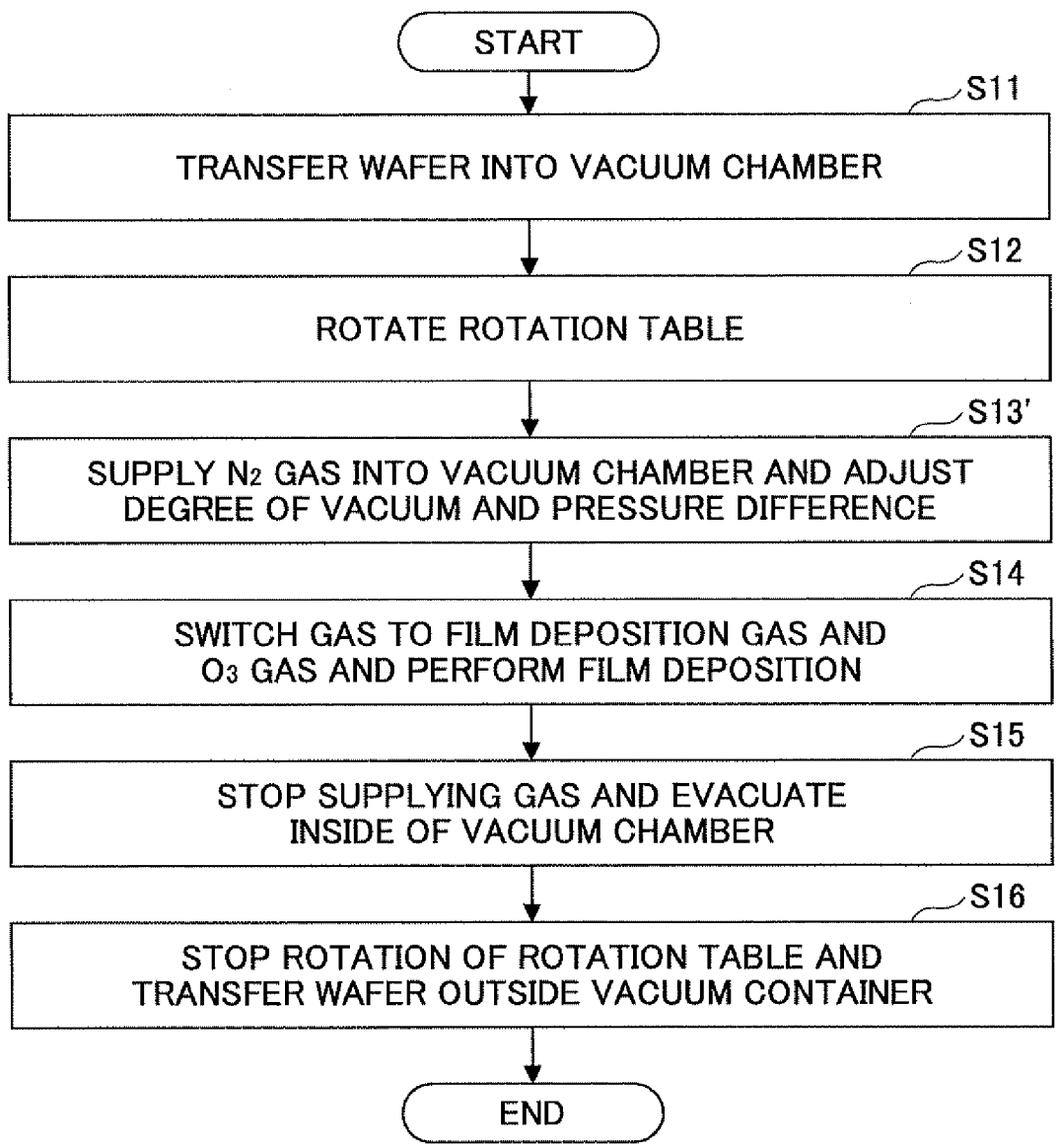
FIG. 30 is a flowchart illustrating an example of an overall operation performed on a substrate according to another embodiment of the present invention.
Figure 31:
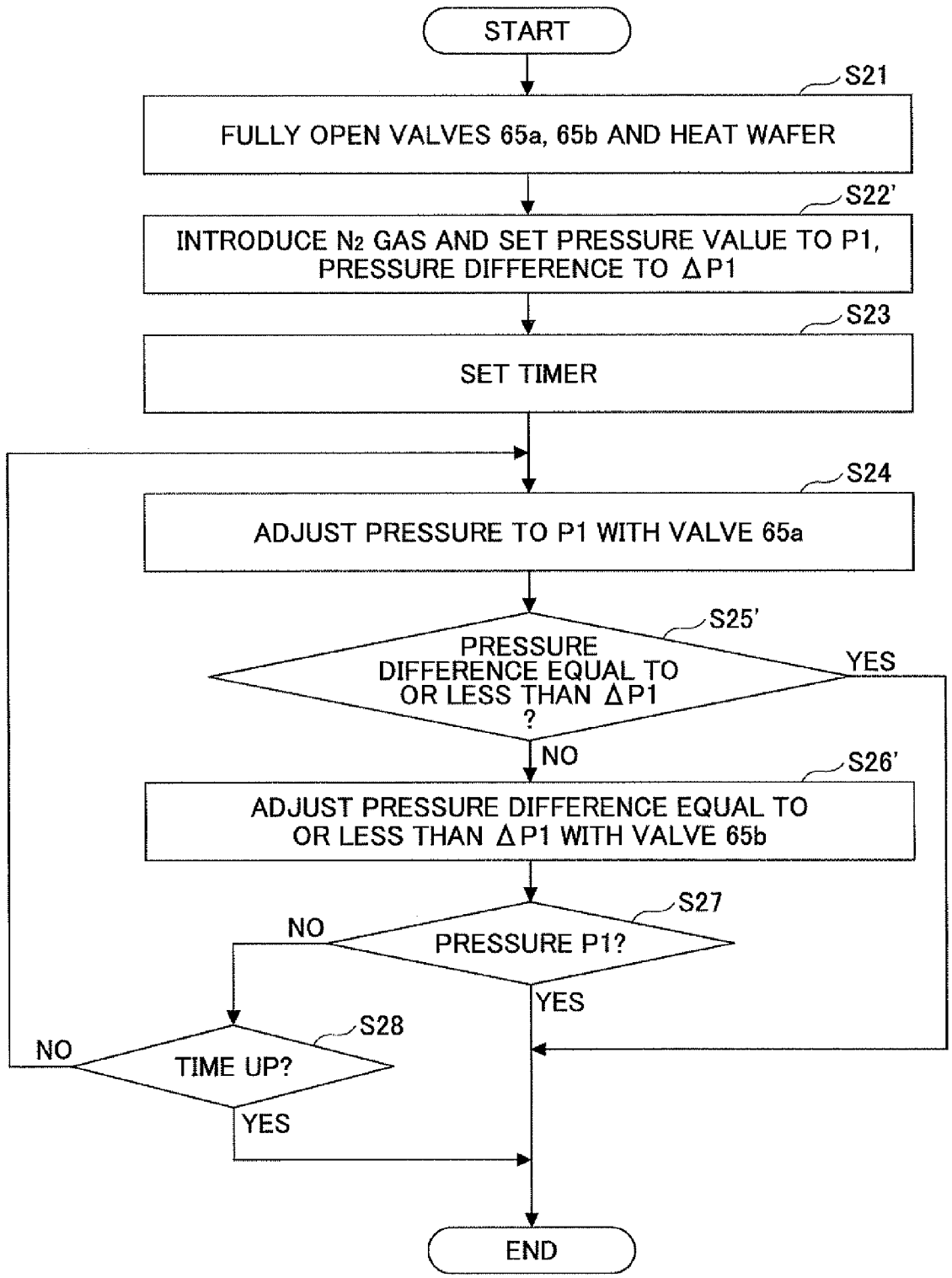
FIG. 31 is a flowchart illustrating an example of an overall operation performed on a substrate according to another embodiment of the present invention.

In this embodiment, in order to stabilize the flow of gas, the opening of the first and second valves 65a, 65b using nitrogen gas is adjusted before the supplying of reaction gas (Step S13) as illustrated in FIG. 30. The differences in the method of stabilizing the flow of gas or the conditions of processing with respect to the first embodiment are described below with reference to FIG. 31. In step S22', the predetermined value P1 of pressure P and a predetermined value ΔP1 of the pressure difference ΔP between the first and second process areas 91, 92 are set to be, for example, 1067 Pa (8 Torr) and 13.3 Pa (0.1 Torr) respectively. Then, in step S24, the process pressure inside the chamber 1 is adjusted by adjusting the opening of the first valve 65a so that the value detected by the process pressure detecting part 66a becomes the predetermined value P1. Then, in step S25', it is determined whether the pressure difference ΔP is equal to or less than the predetermined value P1 according to the measured (detected) results of the process pressure detecting parts 66a, 66b. In a case where the pressure difference ΔP becomes equal to or less than the predetermined value P1, the operation proceeds to the film deposition process of step S14. In a case where the pressure difference ΔP is greater than ΔP1, the opening of the second valve 65b is adjusted so that the pressure difference ΔP becomes equal to or less than the predetermined value ΔP1 (Step S26). Then, in a case where the process pressure becomes the predetermined value P1, the thin film deposition is initiated (Step S27). In a case where the process pressure does not become the predetermined value P1, the processes of steps S24-S27 are repeated when the repletion time t1 elapses (Step S28), when the pressure difference ΔP becomes equal to or less than the predetermined value P1 in Step S25, or when the process pressure reaches the predetermined value P1 in Step S27.

Then, in performing the film deposition process where gas is switched from N2 gas to reaction gas, the flow of gas (BTBAS gas, O3 gas) becomes stable owing to the pressure difference ΔP between the process areas 91, 92 being equal to or less than the predetermined value ΔP1 by the step S21-S28 or the pressure difference ΔP between the process areas 91, 92 being substantially close to the predetermined value ΔP1. Therefore, the adsorption of BTBAS gas can be stabilized and the oxide reaction of the adsorbed molecules of O3 gas can be stabilized. As a result, the wafer W can obtain a satisfactory thin film having an even film thickness with respect to an in-plane direction or in-between surfaces of the wafer W.

Furthermore, because bias of evacuation on both sides of the separation areas D can be prevented, BTBAS gas and O3 gas can be prevented from passing through the separation areas and become mixed. Accordingly, reaction products can be prevented from being formed on areas besides the surface of the wafers W. Thus, formation of particles can be prevented. Further, because the pressure difference ΔP between the first and second process chambers 91, 92 can be reduced to a low value, a buoyancy of gases rising from the rotation table 2 hardly occurs, for example, when the wafer W enters the process area 91 (92) or when the wafer W exits the process area 91 (92) by the rotation of the rotation table 2. Accordingly, the wafer W can be prevented from floating from the concave portion 24 or deviating from the concave portion 24. Thus, the wafer W can be prevented from colliding with the ceiling plate 11 and problems can be prevented from occurring in the film deposition process.

Further, even in a case where there is difference in the gas flow (conductance) between the first and second process areas 91, 92 due to the size difference between the areas (first and second process areas 91, 92) in which the gases flow or influence the concave portion 24 formed in the rotation table 2, the difference in the conductance of the gas flow can be restrained and the flow of gas can be positively stabilized because the pressure difference ΔP between the first and second process areas 91, 92 is restrained to a low value.

In the above-described embodiments of the present invention, in measuring (detecting) the pressure of the first and second process areas 91, 92, the process pressure detecting parts 66a, 66b are provided to the evacuation channels 63a, 63b. Alternatively, the process pressure detecting parts 66a, 66b in other areas pressure communicating with the first and second process areas 91, 92 (e.g., sidewall of the chamber 1). Further, in adjusting the pressure of each process area 91, 92, the number of rotations R of the evacuation pump 64 may be adjusted along with adjusting the opening of the first and second valves 65a, 65b. Further, the two evacuation pumps 64a and 64b may be shared (integrated). Further, although the pressure detection value of the process pressure detecting part 66a is used in setting the process pressure in the chamber 1 to the predetermined value P1 according to the above-described embodiments of the present invention, the pressure detection value of the process pressure detecting part 66a may alternatively be used. Further, a pressure value detected from another pressure detecting part provided in the chamber 1 may serve as the pressure value used to set the process pressure in the chamber 1 to the predetermined value P1.

In the above-described embodiments, the pressure of the first and second process areas 91, 92 are adjusted instead of the flow ratio F of the evacuation gas for stabilizing gas flow. However, both the flow rate of the evacuation gas and the pressure of the first and second process areas 91, 92 may be adjusted. For example, in a case where there is a high possibility of pressure changing inside the chamber 1, pressure in each process area 91, 92 is adjusted when starting the supply of reaction gas into the chamber 1 (when switching from N2 gas to reaction gas in Step S14 and then, the flow ratio F of the evacuation gas is adjusted when a predetermined time elapses after starting a film deposition process. In this case, the flow of gas flowing into the chamber 1 can be further stabilized and the buoyancy of the wafer W can be restrained.

Third Embodiment

In the following embodiment of the present invention, a vacuum chamber having a rotation table includes a first process area to which a first reaction gas is supplied and a second process area in which a second reaction gas is supplied. Further, the first and second process areas are separated from each other in a rotation direction of the rotation table. Further, separation areas are interposed between the first and second process areas for supplying separation gas between the first and second process areas from a separation gas supplying part. A thin film deposition process is performed by rotating a rotation table having plural substrates arranged in a rotation direction and layering plural layers of reaction products with first and second reaction gases. Evacuation is performed with a first evacuation channel having an evacuation port positioned between the first process area and the separation area positioned adjacent to the first process area and located downstream of the first process area relative to the rotation direction when viewed from the rotation center of the rotation table and a second evacuation channel having an evacuation port positioned between the second process area and the separation area positioned adjacent to the second process area and located downstream of the second process area relative to the rotation direction when viewed from the rotation center of the rotation table. The evacuation system (evacuation channel, pressure control device, evacuation part) of each of the process areas is independent from the other. Accordingly, in performing the thin film deposition process, the first and second reaction gases do not mix in the evacuation systems. Therefore, the possibility of reaction products being generated in the evacuation systems is extremely low.

Further, a ceiling surface is provided on both sides of a separation gas supplying part for forming a narrow space that allows the separation gas to flow from the separation areas towards the process areas. Thereby, reaction gases are prevented from entering separation areas. Further, a center portion area, which is positioned at a center portion inside the chamber for separating the atmosphere of the first and second process areas, includes an ejection port that ejects separation gas towards a substrate receiving surface of the rotation table for ejecting the separation gas towards the circumferential edges of the rotation table. As a result, with the center portion area disposed in-between, different reaction gases can be prevented from mixing with each other. Accordingly, a satisfactory film deposition process can be achieved. Further, generation of particles can be prevented because no reaction products or very few reaction products are formed.

Figure 32:
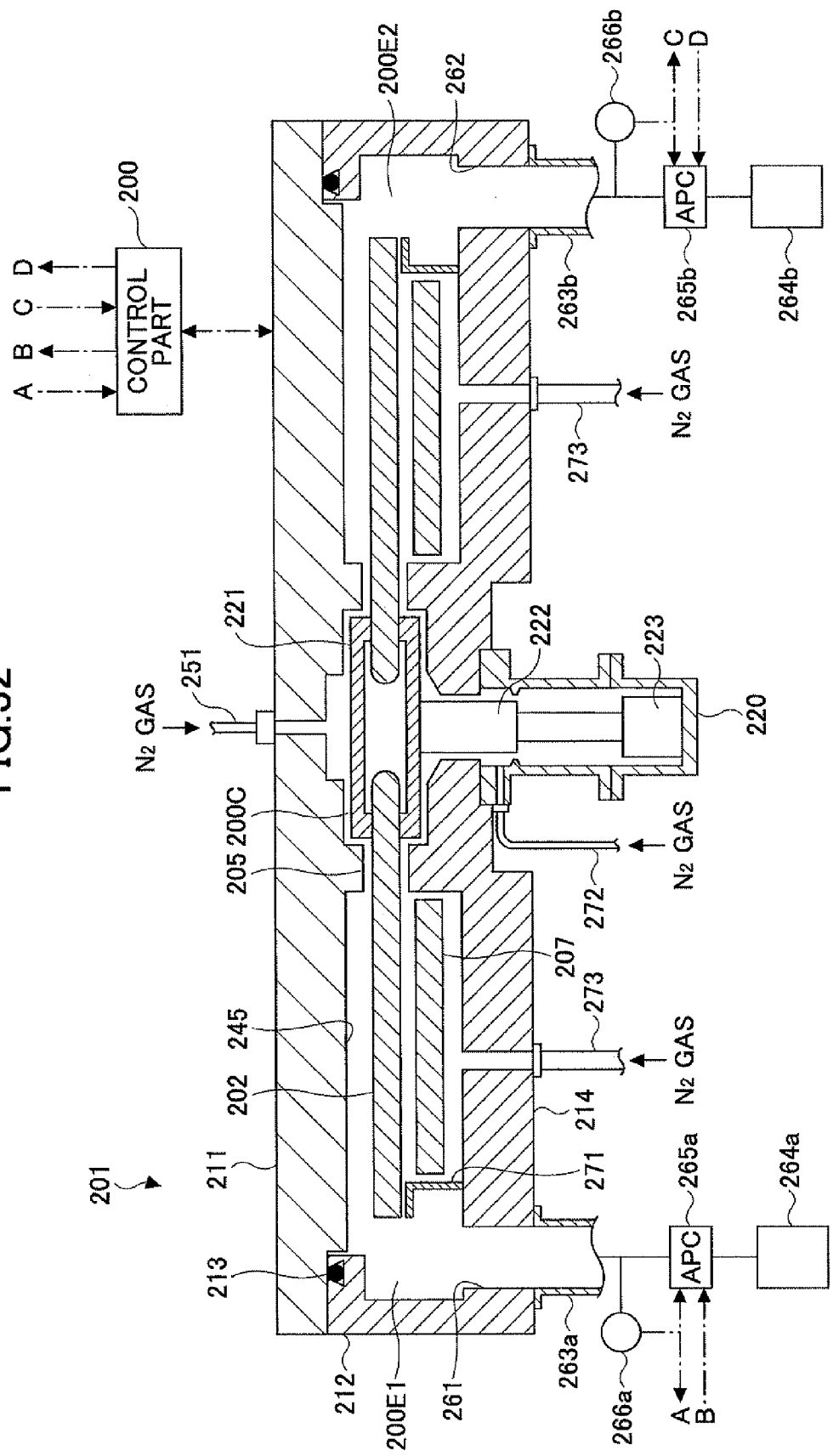
FIG. 32 is a vertical cross-sectional diagram taken along line I-I' of FIG. 34 illustrating a film deposition apparatus according to a third embodiment of the present invention.
Figure 34:
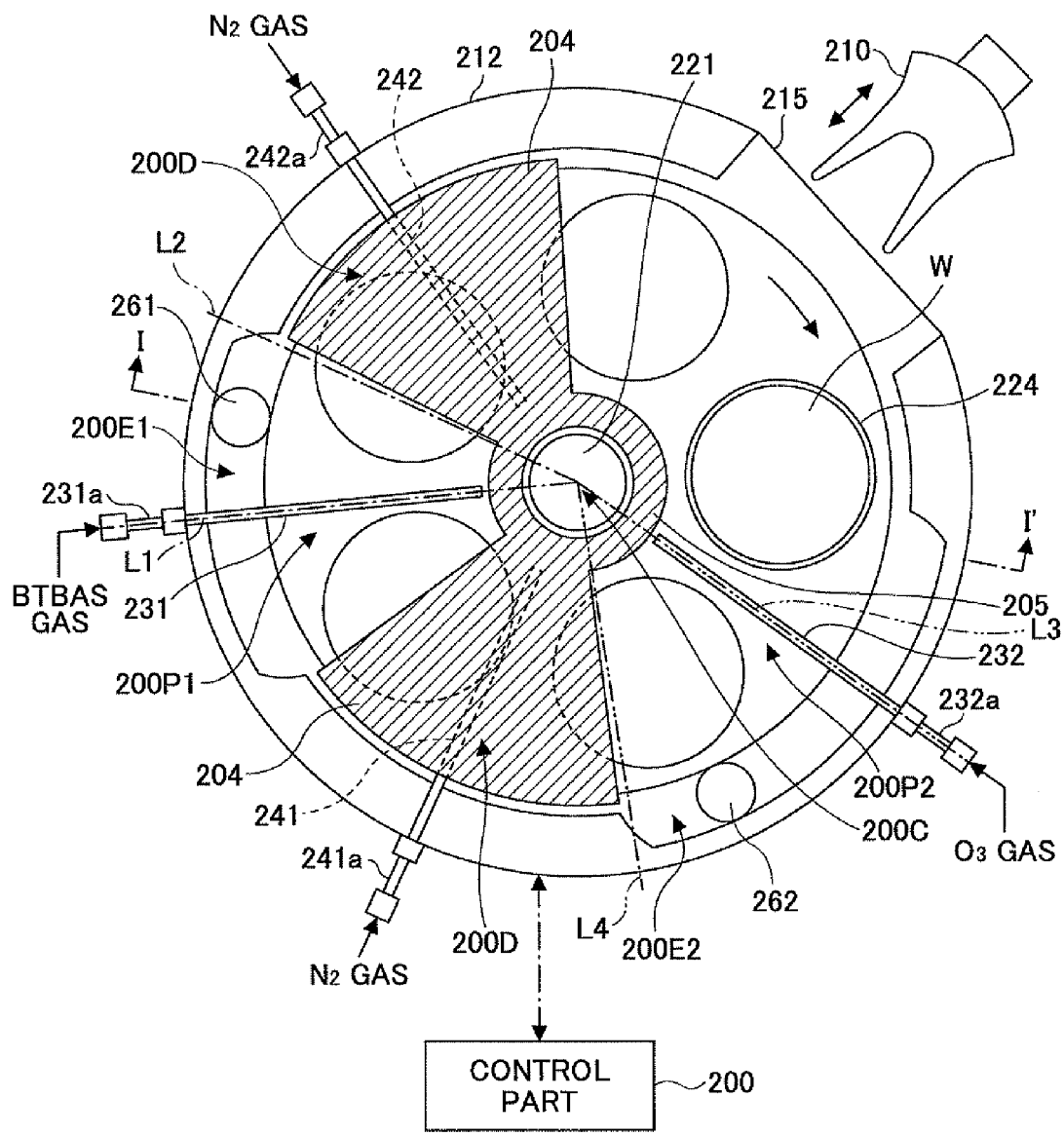
FIG. 34 is a horizontal cross-sectional plan view of the film deposition apparatus according to the third embodiment of the present invention.

Referring to FIG. 32, which is a cut-away diagram taken along I-I' line in FIG. 34, a film deposition apparatus according to an embodiment of the present invention has a vacuum chamber 201 having a flattened cylinder shape, and a rotation table 202 that is located inside the chamber 201 and has a rotation center at a center of the vacuum chamber 201. The vacuum chamber 201 is made so that a ceiling plate 211 can be separated from a chamber body 212. The ceiling plate 211 is pressed onto the chamber body 212 via a ceiling member such as an O-ring 213, so that the vacuum chamber 201 is hermetically sealed. On the other hand, the ceiling plate 211 can be raised by a driving mechanism (not shown) when the ceiling plate 211 has to be removed from the chamber body 212.

The rotation table 202 is fixed onto a cylindrically shaped core portion 221. The core portion 221 is fixed on a top end of a rotational shaft 222 that extends in a vertical direction. The rotational shaft 222 penetrates a bottom portion 214 of the vacuum chamber 201 and is fixed at the lower end to a driving mechanism 223 that can rotate the rotational shaft 222 clockwise, in this embodiment. The rotation shaft 222 and the driving mechanism 223 are housed in a cylindrical case body 220 having an open upper surface. The case body 220 is hermetically fixed to a bottom surface of the bottom portion 214 via a flanged portion, which isolates an inner environment of the case body 220 from an outer environment.

Figure 33:
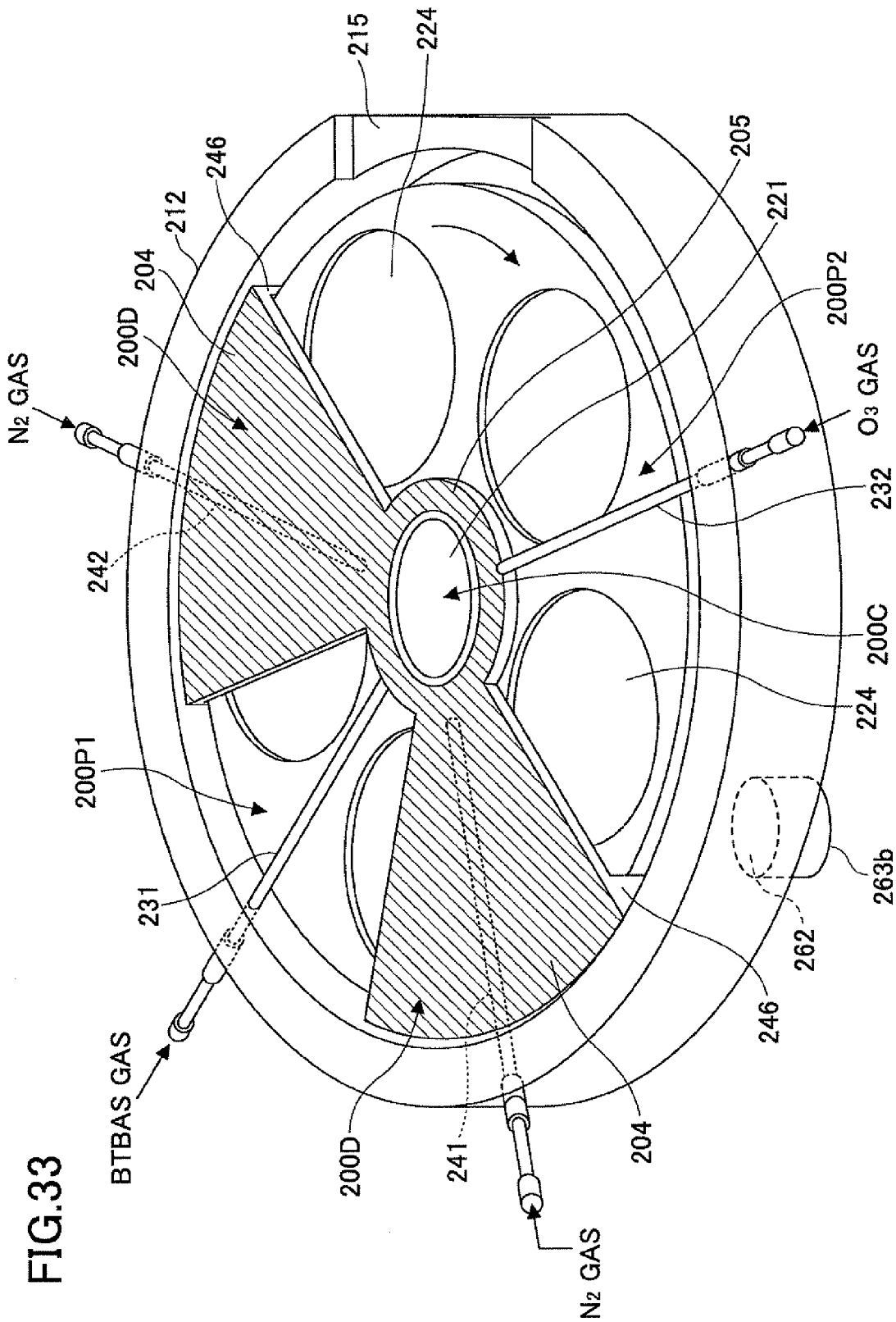
FIG. 33 is a perspective view illustrating a configuration of the inside of the film deposition apparatus according to the third embodiment of the present invention.

As shown in FIGS. 33 and 34, plural (five in the illustrated example) circular concave portions 224, each of which receives a semiconductor wafer W, are formed along a rotation direction (circumferential direction) in a top surface of the rotation table 202, although only one wafer W is illustrated in FIG. 34. FIGS. 35A and 35B are expanded views of the rotation table 202 being cut across and horizontally expanded along its concentric circle. As shown in FIG. 35A, the concave portion 224 has a diameter slightly larger, for example, by 4 mm than the diameter of the wafer W and a depth equal to a thickness of the wafer W. Therefore, when the wafer W is placed in the concave portion 224, a surface of the wafer W is at the same elevation of a surface of the rotation table 202 (an area of the rotation table where the wafer W is not placed). If there is a relatively large difference in height between the surface of the wafer W and the surface of the rotation table 202, a change of pressure occurs at the portion where the difference is located. Therefore, from the aspect of attaining uniformity of film thickness in the in-plane direction, it is preferable to match the elevation of the surface of the wafer W and the elevation of the surface of the rotation table 202. While matching the elevation of the surface of the wafer W and the height of the surface of the rotation table 202 may signify that the height difference of the surfaces of the wafer W and the rotation table is less than or equal to approximately 5 mm, the difference has to be as close to zero as possible to the extent allowed by machining accuracy. In the bottom of the concave portion 224 there are formed three through holes (not shown) through which three corresponding elevation pins are raised/lowered. The elevation pins support a back surface of the wafer W and raises/lowers the wafer W.

The concave portions 224 are substrate receiving areas (wafer W receiving areas) provided to position the wafers W and prevent the wafers W from being thrown outwardly by the centrifugal force caused by rotation of the rotation table 202. However, the wafer W receiving areas are not limited to the concave portions 224, but may be performed by guide members that are provided along a circumferential direction on the surface of the rotation table 202 to hold the edges of the wafers W. In a case where the rotation table 202 is provided with a chuck mechanism (e.g., electrostatic chucks) for attracting the wafer W, the areas on which the wafers W are received by the attraction serve as the substrate receiving areas.

Referring again to FIGS. 33 and 34, the chamber 201 includes a first reaction gas nozzle 231, a second reaction gas nozzle 232, and separation gas nozzles 241, 242 above the rotation table 202, all of which extend in radial directions and are arranged at predetermined angular intervals in a circumferential direction of the chamber 201. With this configuration, the concave portions 224 can move through and below the nozzles 231, 232, 241, and 242. In the illustrated example, the second reaction gas nozzle 232, the separation gas nozzle 241, the first reaction gas nozzle 231, and the separation gas nozzle 242 are arranged clockwise in this order. These gas nozzles 231, 232, 241, and 242 penetrate the circumferential wall portion of the chamber body 212 and are supported by attaching their base ends, which are gas inlet ports 231a, 232a, 241a, 242a, respectively, on the outer circumference of the wall portion.

Although the gas nozzles 231, 232, 241, 242 are introduced into the chamber 201 from the circumferential wall portion of the chamber 201 in the illustrated example, these nozzles 231, 232, 241, 242 may be introduced from a ring-shaped protrusion portion 205 (described later). In this case, an L-shaped conduit may be provided in order to be open on the outer circumferential surface of the protrusion portion 205 and on the outer top surface of the ceiling plate 211. With such an L-shaped conduit, the nozzle 231 (232, 241, 242) can be connected to one opening of the L-shaped conduit inside the chamber 201 and the gas inlet port 231a (232a, 241a, 242a) can be connected to the other opening of the L-shaped conduit outside the chamber 201.

The reaction gas nozzle 231 is connected to a gas supply source (not illustrated) of a first reaction gas (e.g., BTBAS gas) and the reaction gas nozzle 232 is connected to a gas supply source (not illustrated) of a second reaction gas (e.g., O3 gas). Further, the reaction gas nozzles 241 and 242 are each connected to a gas supply source (not illustrated) of N2 gas. Further, the reaction gas nozzles 231, 232 are also connected to a gas supply source (not illustrated) of N2 for supplying N2 gas to each process area 200P1, 200P2 as a pressure adjustment gas when operation of the film deposition apparatus is initiated. In this embodiment, the second reaction gas nozzle 232, the separation gas nozzle 241, the first reaction gas nozzle 231, and the separation gas nozzle 242 are arranged in this order in a clockwise direction.

The reaction gas nozzles 231, 232 have ejection holes 233 facing directly downward for ejecting reaction gases below. The ejection holes 233 are arranged at predetermined intervals in longitudinal directions of the reaction gas nozzles 231, 232. The separation gas nozzles 241, 242 have ejection holes 240 facing directly downward for ejecting reaction gases below. The ejection holes 233 are arranged at predetermined intervals in longitudinal directions of the reaction gas nozzles 231, 232. The reaction gas nozzle 231 corresponds to a first reaction gas supplying part and the reaction gas nozzle 232 corresponds to a second reaction gas supplying part. The area below the first reaction gas supplying part corresponds to a first process area 200P1 for enabling BTBAS gas to be adsorbed to the wafer W. The area below the second reaction gas supplying part corresponds to a second process area 200P2 for enabling O3 gas to be adsorbed to the wafer W.

The separation gas nozzles 241, 242 are provided in separation areas 200D that are configured to separate the first process area 200P1 and the second process area 200P2. As shown in FIGS. 33 through 35B, in each of the separation areas 200D, a convex portion 204 is provided in a ceiling plate 211 of the chamber 201 in a manner protruding downwards. The convex portion 204 has a top view shape of a sector. The convex portion 204 is formed by dividing a circle depicted along an inner circumferential wall of the chamber 201. The circle has the rotation center of the rotation table 202 as its center. The convex portion 204 has a groove portion 243 provided at the circumferential center of the circle that extends in the radial direction of the circle. The separation gas nozzle 241 (242) is located in the groove portion 243. The distance between the center axis of the separation gas nozzle 241 (242) and one side of the sector-shaped convex portion 204 (edge of the convex portion 204 towards an upstream side relative to relative to a rotation direction of the rotation table 202) is substantially equal to the distance between the center axis of the separation gas nozzle 241 (242) and the other side (edge of the convex portion 204 towards a downstream side relative to the rotation direction of the rotation table 202) of the sector-shaped convex portion 204.

It is to be noted that, although the groove portion 243 is formed in a manner bisecting the convex portion 204 in this embodiment, the groove portion 242 may be formed so that an upstream side of the convex portion 204 relative to the rotation direction of the rotation table 202 is wider, in other embodiments.

Accordingly, in this embodiment, a flat low ceiling surface (first ceiling surface) 244 is provided as a lower surface of the convex portion 204 on both sides of the separation gas nozzle 241 (242) relative to the rotation direction of the rotation table 202. Further, a high ceiling surface (second ceiling surface) 245, which is positioned higher than the first ceiling surface 244, is provided on both sides of the separation gas nozzle 241 (242) relative to the rotation direction of the rotation table 202. The role of the convex portion 204 is to provide a separation space which is a narrow space between the convex portion 204 and the rotation table 202 for impeding the first and second reaction gases from entering the narrow space and preventing the first and second reaction gases from being mixed.

Taking the separation gas nozzle 241 as an example, the O3 gas from an upstream side of the rotation direction of the rotation table 202 is impeded from entering the space between the convex portion 204 and the rotation table 202. Further, the BTBAS gas from a downstream side of the rotation direction of the rotation table 202 is impeded from entering the space between the convex portion 204 and the rotation table 202. "Impeding the first and second reaction gases from entering" signifies that the N2 gas ejected as the separation gas from the separation gas nozzle 241 diffuses between the first ceiling surfaces 244 and the upper surfaces of the rotation table 202 and flows out to a space below the second ceiling surfaces 245, which are adjacent to the corresponding first ceiling surfaces 244 in the illustrated example, so that the gases cannot enter the separation space from the space below the second ceiling surfaces 245. "The gases cannot enter the separation space" not only signifies that the gases from the adjacent space below the second ceiling surfaces 245 are completely prevented from entering the space below the convex portion 204, but that the gases from both sides cannot proceed farther toward the space below the convex portion 204 and thus be mixed with each other. Namely, as long as such effect can be attained, the separation area 200D can achieve the role of separating the first process area 291 and the second process area 292. The narrowness of the narrow space is set so that the pressure difference between the narrow space (space below the convex portion 204) and the space adjacent to the narrow space (e.g., space below the second ceiling surface 245) is large enough to attain the effect of "the gases cannot enter the separation space". The specific measurements of the narrow space differs depending on, for example, the area of the convex portion 204. Further, the gases adsorbed on the wafer W can pass through below the convex portion 204. Therefore, "impeding the first and second reaction gases from entering" signifies that the first and second reaction gases are in a gaseous phase.

Figure 36:
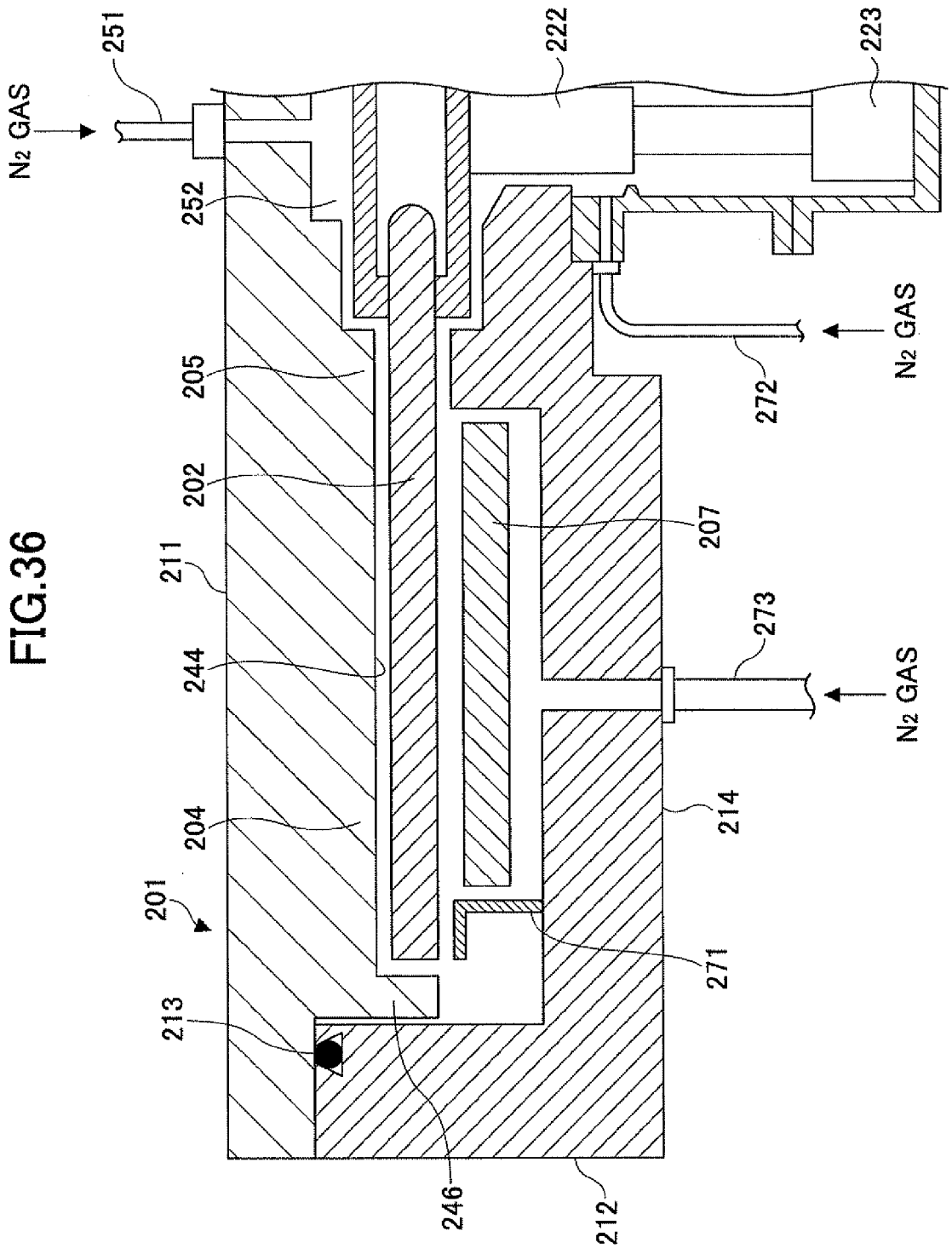
FIG. 36 is a vertical cross-sectional view of a separation area of the film deposition apparatus according to the third embodiment of the present invention.
Figure 38:
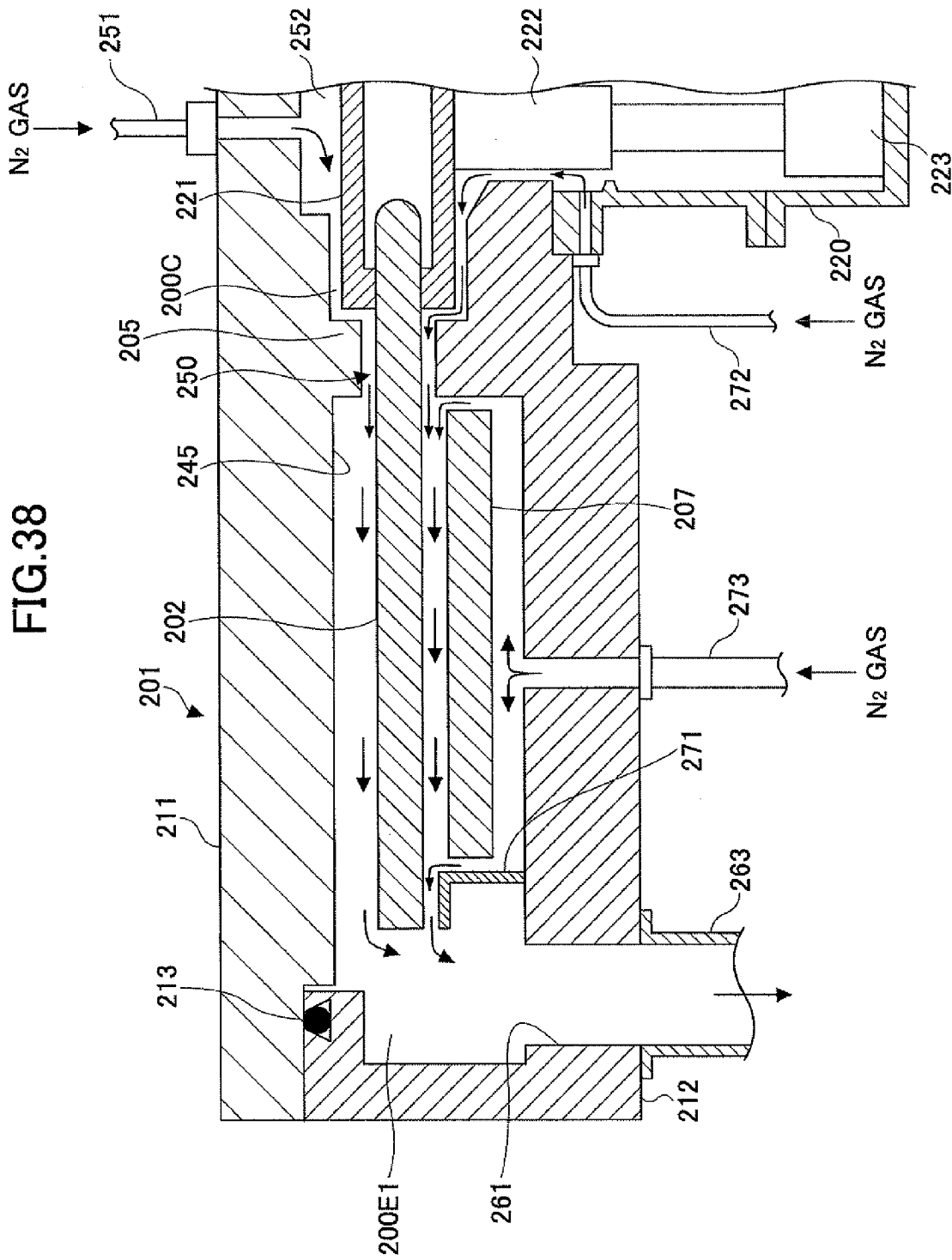
FIG. 38 is a schematic diagram for describing a state where separation gas or purge gas flows in the film deposition apparatus according to the third embodiment of the present invention.

As illustrated in FIGS. 36 and 38, a protrusion portion 205 is provided on a lower surface of the ceiling plate 211 so that the inner circumference of the protrusion portion 205 faces the outer circumference of the core portion 221. The protrusion portion 205 opposes the rotation table 202 at an outer area of the core portion 221. In addition, a lower surface of the protrusion portion 205 and a lower surface of the convex portion 204 form one plane surface. In other words, a height of the lower surface of the protrusion portion 205 from the rotation table 202 is the same as a height of the lower surface (ceiling surface 244) of the convex portion 204. FIGS. 33 and 34 show the ceiling plate 211 being horizontally cut across an area including a portion substantially lower than the ceiling surface 245 but higher than the separation nozzles 241, 242. The convex portion 204 may not only be formed integrally with the protrusion portion 205 but may also be formed separately from the protrusion portion 205.

The configuration of the combination of the convex portion 204 and the separation nozzle 241 (242) is fabricated by forming the groove portion 243 in a sector-shaped plate to be the convex portion 204, and locating the separation gas nozzle 241 (242) in the groove portion 243 in the above embodiment. However, two sector-shaped plates may be attached on the lower surface of the ceiling plate 211 by screws so that the two sector-shaped plates are located on both sides of the separation gas nozzle 241 (242).

In this embodiment, the separation gas nozzles 241 (242) has ejection holes arranged at predetermined intervals (e.g., about 10 mm) in longitudinal directions of the separation gas nozzles 241, 242. The ejection holes have an inner diameter of about 0.5 mm, for example.

In this embodiment, a wafer W having a diameter of about 300 mm is used as the target substrate. In this embodiment, at an area spaced about 140 mm from the rotation center of the rotation table 202 in the outer circumferential direction (border part between the convex portion 204 and the below-described convex portion 205), the convex portion 204 includes a part where the length is about 146 mm in the circumferential direction (length of arc concentric with the rotation table 202). Further, at an area corresponding to an outermost part of the wafer W receiving area (concave part 224), the convex portion includes a part where the length is about 502 mm in the circumferential direction. In the outermost part as illustrated in FIG. 35A, the length L of convex portion 204 on each side of the separation nozzle 241 (42) with respect to the circumferential direction is about 246 mm.

As illustrated in FIG. 35B, the height from a top surface of the rotation table 202 to the lower surface of the convex portion 204 (i.e. first ceiling surface 244) is indicated as "h". The height h ranges from, for example, about 0.5 mm to 10 mm, and more preferably, about 4 mm. In this case, the number of rotations of the rotation table 202 is set to, for example, about 1 rpm-500 rpm. Accordingly, in order to attain a separating function at the separation area 200D, the size of the convex portion 204 and the height h from the surface of the rotation table 202 to the lower surface of the convex portion 204 (first ceiling surface 244) are to be set based on, for example, experimentation of the applicable range of the number of rotations of the rotation table 202. Not only nitrogen gas (N2) may be used as the separation gas but also inert gas such as argon (Ar) may be used. Further, other gases such as hydrogen ($H_2$) may be used. As long as the film deposition process is not affected, the kind of gas is not to be limited in particular.

As described above, the lower surface of the ceiling plate 211 of the chamber 201 (i.e. ceiling when viewed from the wafer receiving area (concave portion 224) of the rotation table 202 includes the first ceiling surface 244 and the second ceiling surface 245 provided in a circumferential direction in a manner where the second ceiling surface 245 is positioned higher than the first ceiling surface 245. FIG. 32 is a vertical cross-sectional view of an area having a high ceiling surface 245. FIG. 36 is a vertical cross-sectional view of an area having a low ceiling surface 244. The convex portion 204 has a bent portion 246 that bends in an L-shape at the outer circumferential edge of the convex portion 204 (area at the outer rim of the chamber 201). The sector-shaped convex portion 204 is provided towards the ceiling plate 211 and is configured to be detachable from the chamber body 212. Therefore, a slight gap(s) is provided between the outer peripheral surface of the bent portion and the chamber body 212. Like the convex portion 204, the bent portion 246 is also provided for impeding reaction gases from entering and preventing the reaction gases from mixing. The gaps between the bent portion 246 and the rotation table 202 and between the bent portion 246 and the chamber body 212 are set to have substantially the same measurements as the height h of the ceiling surface 244 with respect to the surface of the rotation table 202. In this embodiment, from the standpoint of the surface of the rotation table 202, the inner surface of the bent portion 246 serves as an inner circumferential wall of the chamber 201.

As illustrated in FIG. 36, the chamber body 212 has an inner circumferential wall formed as a vertical surface in the vicinity of the outer circumferential surface of the bent portion 246 in the separation area 200D. As illustrated in FIG. 36, in an area other than the separation area 200D, the chamber body 212 has a dented portion (dented towards the outer side) that is notched having a rectangular cross section. The dented portion faces, for example, an area extending from the outer circumferential surface of the rotation table 202 to a bottom surface part 214. In the dented portion, the areas communicating with the first and second process areas 200P1, 200P2 are referred to as first and second evacuation areas 200E1 and 200E2, respectively. Accordingly, as illustrated in FIGS. 32 and 34, first and second evacuation ports 261 and 262 are formed at corresponding bottom parts of the first and second evacuation areas 200E1 and 200E2.

The first and second evacuation ports 261 and 262 are provided for ensuring a separating effect in the separation area 200D. When viewing the first and second evacuation ports 261, 262 from a plan position, the first and second evacuation ports 261, 262 are provided on both sides of the separation area 200D in the rotation direction. Each of the evacuation ports 261, 262 is dedicated to evacuate a corresponding reaction gas (BTBAS gas and O3 gas). In this example, the first evacuation port 261 is formed between the first reaction gas nozzle 231 and the separation area 200D provided adjacent to the first reaction gas nozzle 231 towards the downstream side of the first reaction gas nozzle 231 with respect to the rotation direction. Further, the second evacuation port 262 is formed between the second reaction gas nozzle 232 and another separation area 200D provided adjacent to the second reaction gas nozzle 232 towards the downstream side of the second reaction gas nozzle 232.

In other words, as illustrated in FIG. 34, the first evacuation port 261 of the first evacuation channel 263a is provided between the first process area 200P1 and the separation area 200D provided towards the downstream side of the first process area 200P1 with respect to the rotation direction (corresponding to area covered by the convex portion 204 at which the separation gas nozzle 242 is provided in FIG. 34). That is, in FIG. 34, the first evacuation port 261 is positioned between a straight line L1 (passing through the center of the rotation table 202 and the first process area 200P1) and a straight line L2 (passing through the center of the rotation table 202 and an upstream edge of the separation area 200D provided towards the downstream side of the first process area 200P with respect to the rotation direction). The second evacuation port 262 of the second evacuation channel 263b is provided between the second process area 200P2 and the separation area 200D provided towards the downstream side of the second process area 200P2 with respect to the rotation direction (corresponding to area covered by the convex portion 204 at which the separation gas nozzle 241 is provided in FIG. 34). That is, in FIG. 34, the second evacuation port 262 is provided between a straight line L3 (dash-double-dot line passing through the center of the rotation table 202 and the second process area 200P2) and a straight line L4 (dash-double-dot line passing through the center of the rotation table 202 and an upstream edge of the separation area 200D provided towards the downstream side of the second process area 200P2 with respect to the rotation direction).

The evacuation ports 261, 262 may be located at a part other than the bottom portion of the chamber 201. For example, the evacuation ports 261, 262 may be located in the side wall of the chamber 201. In addition, when the evacuation ports 261, 262 are provided in the side wall of the chamber 201, the evacuation ports 261, 262 may be located higher than the rotation table 202. In this case, the gases above the rotation table 202 flow towards the outer side of the rotation table 202. Therefore, it is advantageous in that particles are not blown upward by the gases, compared to evacuating from the ceiling surface facing the rotation table 202.

As illustrated in FIG. 32, the first evacuation port 261 is connected to a vacuum pump 264a via a first evacuation channel 263a. For example, the vacuum pump 264a is connected to a mechanical booster pump and a dry pump. A first pressure adjusting part 265a is interposed between the first evacuation port 261 and the vacuum pump 264a. Although not illustrated in the drawings, the first pressure adjusting part 265a has, for example, a pressure adjustment valve including a butterfly valve, a motor for opening/closing the pressure adjustment valve, and a controller for controlling operation of the motor. For example, the first pressure adjusting part 265a is configured as an APC (Auto Pressure Controller) that can perform pressure adjustment based on a detection result from a pressure gage 266a connected to the evacuation channel 263a provided upstream of the first pressure adjusting part 265a. In this embodiment, the vacuum pump 264a corresponds to a first evacuation part. In the following, the first evacuation channel 263a, the first pressure adjusting part 265a, and the vacuum pump 264a as a whole may be referred to as a first evacuation system.

The pressure gage 266a is for measuring the pressure in the first process area 200P1 in the chamber (upstream side of the evacuation channel 263a). The first pressure adjusting part 265a serves to maintain the first process area 200P1 in a steady pressure atmosphere by adjusting pressure based on a detection result of the pressure gage 266a.

Figure 40:
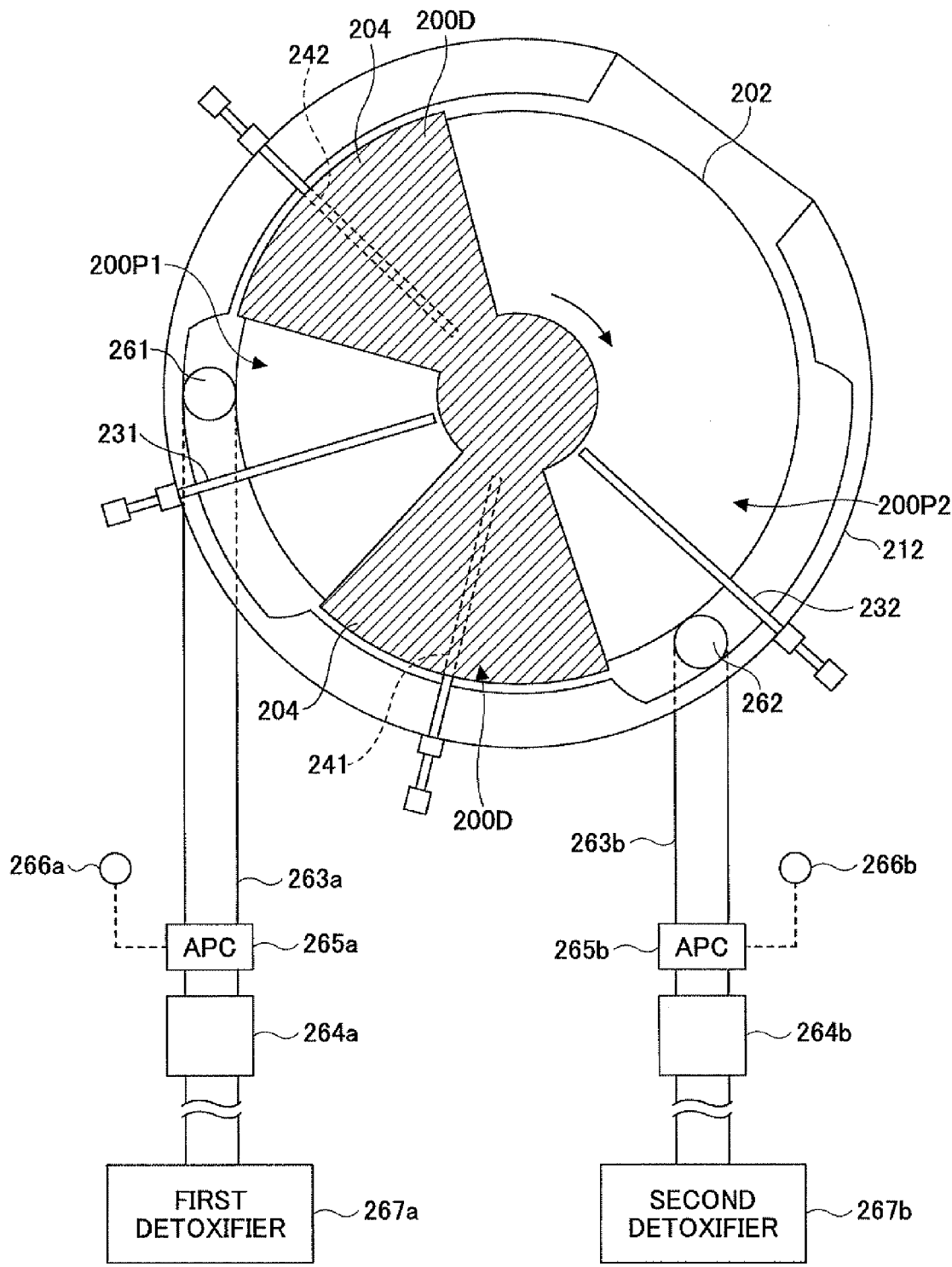
FIG. 40 is a horizontal plan view illustrating a state where evacuation systems are provided to the film deposition apparatus according to the third embodiment of the present invention.

Likewise, the second evacuation port 262 is connected to, for example, a vacuum pump (second evacuation part) 264b via a second evacuation channel 263b. A second pressure adjusting part 265b is interposed between the second evacuation port 262 and the vacuum pump 264b for maintaining the second process area 200P2 in a steady pressure atmosphere. The second pressure adjusting part 265b enables evacuation to be performed independently from the first evacuation channel 263a. The second pressure adjusting part 265b is also configured as an APC (Auto Pressure Controller) that can perform pressure adjustment based on a detection result from a pressure gage 266b connected to the evacuation channel 263b provided upstream of the second pressure adjusting part 265b. In the following, the second evacuation channel 263b, the second pressure adjusting part 265b, and the vacuum pump 264b as a whole may be referred to as a second evacuation system. Further, as illustrated in FIG. 40, first and second detoxifiers 267a, 267b may be provided at each downstream side of the evacuation pumps 264a, 264b for separately detoxifying ejected matter ejected from each of the vacuum pumps 264a, 264b.

Figure 37:
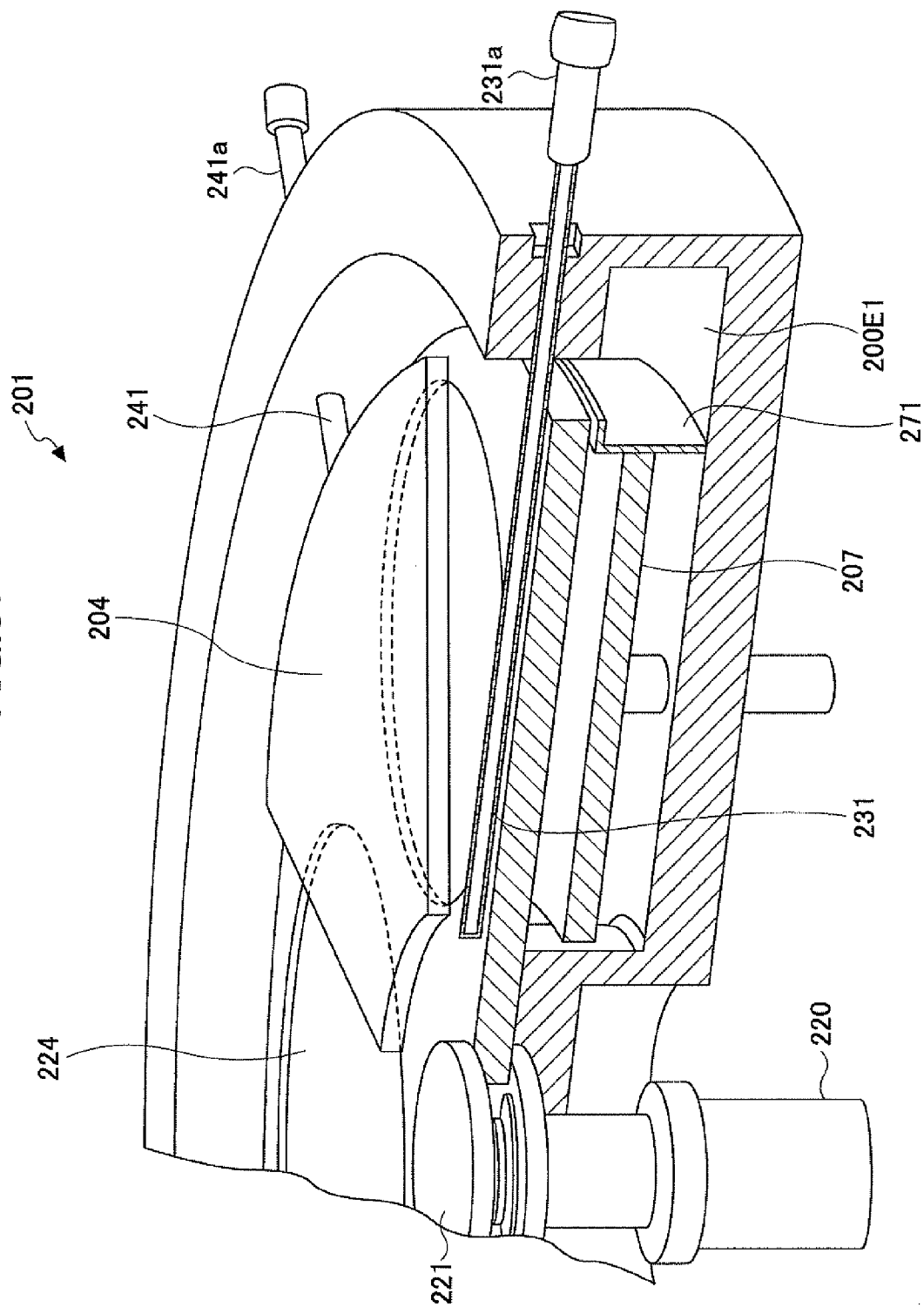
FIG. 37 is a perspective view of a reaction gas nozzle of the film deposition apparatus according to the third embodiment of the present invention.

As shown in FIGS. 32 and 37, a heater unit (heating portion) 207 is provided in a space between the bottom portion 214 of the chamber 201 and the rotation table 202, so that the wafers W placed on the rotation table 202 are heated through the rotation table 202 at a temperature determined by a process recipe. A cover member 271 is provided beneath the rotation table 202 near the outer circumference of the rotation table 202 in a manner surrounding the entire circumference of the heater unit 207, so that the atmosphere where the heater unit 207 is located is partitioned from the atmosphere extending from the upper space of the rotation table 202 to the evacuation areas 200E1, 200E2. The cover member 271 has an upper edge that is bent outward to form a flange shape. Thereby, gas can be prevented from entering the cover member 271 from the outside by reducing the size of the gap between the bent upper edge and a lower surface of the rotation table 202.

At an area located towards the bottom portion 214 and more towards the rotation center than the space where the heater unit 207 is provided, narrow spaces are provided in the vicinity of the center of the lower surface of the rotation table 202 and the core portion 221. Further, slight gaps, which are provided at a penetration hole through which the rotation shaft 222 passes, are in pressure communication with the inside of the case body 220. A purge gas supplying pipe 272 is connected to the case body for supplying a purge gas such as N2 gas to the aforementioned narrow spaces. Purge gas supplying pipes 273 are connected to plural areas in the circumferential direction at the bottom portion of the chamber 201 for purging the space where the heater unit 207 is provided.

By providing the purge gas supplying pipes 272, 273, N2 gas is purged into the space extending from the inside of the case body 220 to the area where the heater unit 207 is provided. The purge gas is evacuated from the gap between the rotation table 202 and the cover member 271 to the evacuation ports 261, 262 via an evacuation area 200E. Accordingly, because the BTBAS gas or O3 gas is prevented from circling around from one side of the first process area 200P1 and the second process area 200P2 to the other side of the first process area 200P1 and the second process area 200P1 via a lower part of the rotation table 202, the purge gas plays the role of a separation gas.

A gas separation supplying pipe 251 is connected to the top center portion of the ceiling plate 211 of the chamber 201, so that N2 gas is supplied as a separation gas to a space 252 between the ceiling plate 211 and the core portion 221. The separation gas, which is supplied to the space 252, is ejected towards the circumferential edges through the thin gap 250 between the protrusion portion 205 and the rotation table 202 and then along the wafer receiving area of the rotation table 202. Because the separation gas fills the space surrounded by the protrusion portion 205, reaction gases (BTBAS gas or O3 gas) can be prevented from mixing via the center portion of the rotation table 202 between the first process area 200P1 and the second process area 200P2. That is, the film deposition apparatus according to this embodiment is divided into a rotation center portion of the rotation table 200 and the chamber 201 for separating the atmosphere between the first process area 200P1 and the second process area 200P2. Further, the film deposition apparatus according to this embodiment is provided with a center area 200C having an ejection opening formed along a rotation direction at the center portion of the rotation table 202 for ejecting the separation gas on the surface of the rotation table 202. The ejection opening corresponds to the narrow gap 250 between the protrusion portion 205 and the rotation table 202.

Figure 39:
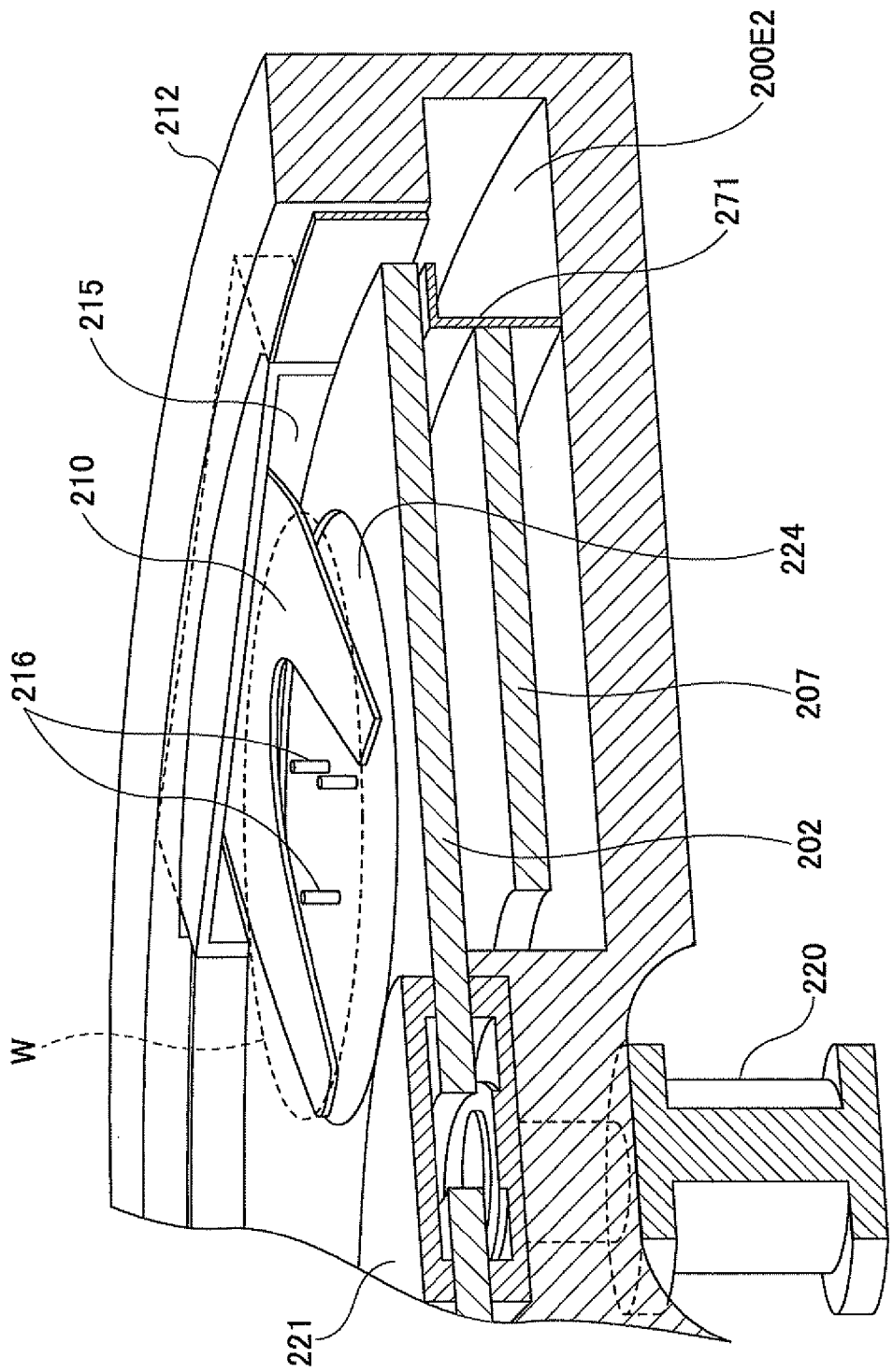
FIG. 39 is a fragmentary perspective view of the film deposition apparatus according to the third embodiment of the present invention.

As illustrated in FIGS. 33, 34, and 39, a transfer opening 215 is formed in a side wall of the chamber 201 for transferring a wafer W between an outside transfer arm 210 and the rotation table 202. The transfer opening 215 is provided with a gate valve (not illustrated) by which the transfer opening 215 is opened or closed. When a concave portion (wafer receiving area) 224 of the rotation table 202 is in alignment with the transfer opening 215, the wafer W is transferred into the chamber 201 and placed in the concave portion 224 as a wafer receiving portion of the rotation table 202 from the transfer arm 210. In order to lower/raise the wafer W into/from the concave portion 224, there are provided elevation pins 216 that are raised or lowered through corresponding through holes formed in the concave portion 224 of the rotation table 202 by an elevation mechanism (not illustrated).

As illustrated in FIGS. 32 and 34, the film deposition apparatus according to an embodiment of the present invention includes a control part 200 including a computer for controlling overall operations of the film deposition apparatus. A program for causing operation of the film deposition apparatus is stored in a memory of the control part 200. This program includes a group of steps for performing the below-described operation by the film deposition apparatus. This program may be installed to the control part 200 from a storage medium such as a hard disk, a compact disk, a magneto-optical magnetic disk, a memory card, or a flexible disk.

As illustrated in FIG. 32, the control part 200 is connected to the above-described first and second pressure adjusting parts 265*a* and 265*b*. For example, a predetermined pressure value of the controller for each pressure adjusting part 265*a*, 265*b* can be set based on data input from a control terminal (not illustrated) by the user or data set in the memory beforehand. Further, the detection results of the pressure gages 266*a*, 266*b* are also output to the control part 200.

Next, a film deposition method according to an embodiment of the present invention is described. The gate valve (not illustrated) is opened, and a wafer W is transferred into the concave portion 224 of the rotation table 202 from outside via the transfer opening 215 by the transfer arm 202. The transfer is performed by raising or lowering the elevation pins 216 from the bottom portion of the chamber 201 via the through holes formed at the bottom surface of the concave portion 224 as illustrated in FIG. 39. In this example, the transfer is performed by intermittently rotating the rotation table 202 and placing wafers W on five corresponding concave portions 224 of the rotation table 202. Then, each of the process areas 200P1 and 200P2 is evacuated to a predetermined pressure by activating the vacuum pumps 264*a*, 264*b* and fully opening the pressure adjustment valves of the first and second pressure adjusting parts 265*a*, 265*b*. Further, the wafer W is heated with the heater unit 207 by rotating the rotation table 202 in a clockwise direction. For example, the rotation table 202 is heated to a temperature of approximately 300° C. with the heater unit 207 beforehand, and then the wafer W is heated by being placed on the rotation table 202.

Along with the heating of the wafer W, the pressure inside the chamber 201 is adjusted by supplying N2 gas into the chamber 201 in an amount substantially equal to the amount of reaction gas, separation gas, and purge gas supplied into the chamber 201 after a film deposition process is started. For example, the first reaction gas nozzle 231 supplies N2 gas at a flow rate of 100 sccm, the second gas nozzle 232 supplies N2 gas at a flow rate of 10,000 sccm, separation gas nozzles 241, 242 each supplies N2 gas at a flow rate of 20,000 sccm, and the separation gas supplying pipe 251 supplies N2 gas at a flow rate of 5,000 sccm into the chamber 201. Then, the first and second pressure adjusting parts 265*a*, 265*b* perform opening/closing of the pressure adjustment valves so that the pressure inside the process areas 200P1, 200P2 become the predetermined pressure value, such as 1,067 Pa (8 Torr). It is to be noted that a predetermined amount of N2 gas is also supplied from each purge gas supplying pipe 272, 273.

Then, it is determined whether the temperature of the wafer W has reached a predetermined temperature by a temperature sensor (not illustrated) and whether the pressure P in each of the first and second process areas 200P1, 200P2 is a predetermined pressure. Then, the gases supplied from the first and second reaction gas nozzles 231, 232 are switched from N2 gas to BTBAS gas and O3 gas, respectively. Thereby, the film deposition process is performed on the wafer W. The switching of the gases of each of the first and second reaction gas nozzle 231, 232 is preferably performed slowly in order to prevent the total flow rate of gas supplied to the chamber 201 from steeply changing.

Because the wafers W alternatively pass through the first and second process areas 200P1, 200P2 by the rotation of the rotation table 202, BTBAS gas is adsorbed to the wafer W and then O3 is adsorbed to the wafer W. Thereby, one or more layers of silicon oxide are formed on the wafer W. Accordingly, a silicon oxide film having a predetermined film thickness can be deposited by forming molecular layers of silicon oxide.

In this case, N2 gas is also supplied as a separation gas from the gas separation supplying pipe 51. Thereby, N2 gas is ejected along the surface of the rotation table 202 from the center portion area 200, that is, the area between the protrusion portion 5 and the center portion of the rotation table 2. As described above, a wide area is provided by cutting out (notching) the inner circumferential wall of the chamber body 212 provided at a lower side of the second ceiling surface 245.

Figure 41:
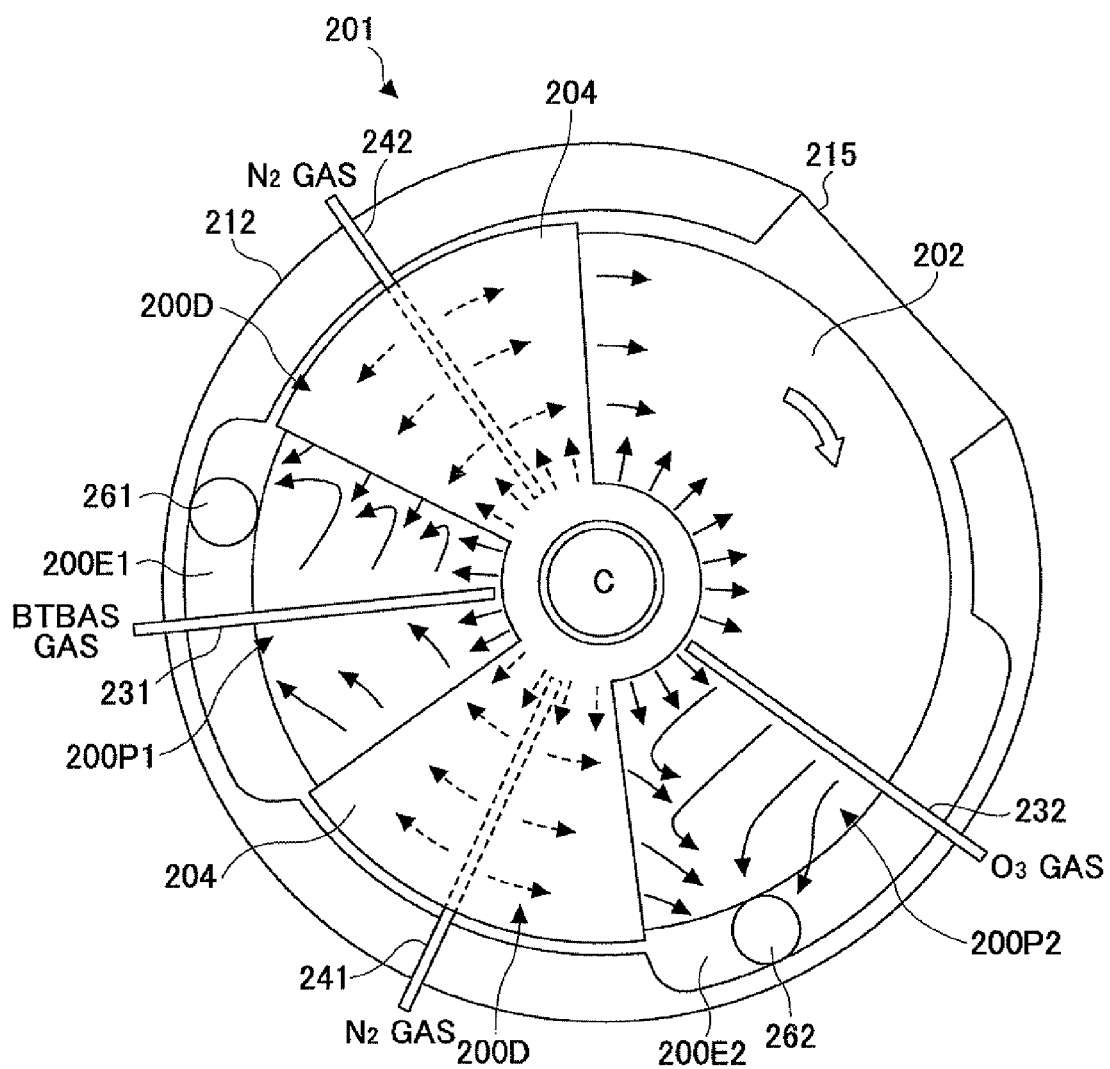
FIG. 41 is a schematic diagram for describing a state where first and second reaction gases are separated by separation gases and evacuated according to the third embodiment of the present invention.

A gas separation supplying pipe 51 is connected to the top center portion of the ceiling plate 11 of the chamber 1, so that N2 gas is supplied as a separation gas to a space 52 between the ceiling plate 11 and the core portion 21. The separation gas, which is supplied to the space 52, is ejected towards the circumferential edges through the thin gap 50 between the protrusion portion 5 and the rotation table 2 and then along the wafer receiving area of the rotation table 2. Because the separation gas fills the space surrounded by the protrusion portion 5, reaction gases (BTBAS gas or O3 gas) can be prevented from mixing via the center portion of the rotation table 2 between the first process area 91 and the second process area 92. That is, the film deposition apparatus according to this embodiment is divided into a rotation center portion of the rotation table 2 and the chamber 1 for separating the atmosphere between the first process area 91 and the second process area 92. Further, the film deposition apparatus according to this embodiment is provided with a center area C having an ejection opening formed along a rotation direction at the center portion of the rotation table 2 for ejecting the separation gas on the surface of the rotation table 2. The ejection opening corresponds to the narrow gap 50 between the protrusion portion 5 and the rotation table 2. The evacuation ports 261, 262 are provided below this wide space. Accordingly, the pressure in the space below the second ceiling surface 245 is lower than the pressure in the narrow space below the first ceiling surface 244 and lower than the pressure in the center portion area 200C. FIG. 41 schematically illustrates the state of the flow of gases ejected from respective parts. The O3 gas being ejected to a lower side from the second reaction gas nozzle 232, contacts the surface of the rotation table 202 (both the surface of the wafer W and the surface of non-receiving area) and flows upstream relative to the rotation direction along the surfaces. Such O3 gas is evacuated from the evacuation port 262 by flowing to the evacuation area 200E2 between the circumferential edge of the rotation table 202 and the inner circumferential wall of the chamber 201 as the O3 gas is forced back by the N2 gas flowing from the upstream side.

Further, O3 gas being ejected to a lower side from the second reaction gas nozzle 232 flows toward the evacuation port 262 by the flow of N2 gas ejected from the center portion area 200C and the drawing effect of the evacuation port 262. However, a portion of the O3 gas flows downstream to a separation area 200D and into a lower part of the sector-shaped convex portion 204. Nevertheless, because the height of the ceiling surface 244 of the convex portion 204 and the length of the ceiling surface 244 of the convex portion 204 are set with measurements for preventing gas from flowing to a lower part of the ceiling surface 244 in a case where process parameters during operation (e.g., flow rate of each gas) are used, O3 gas can hardly flow into the lower part of the sector-shaped convex portion 204 or cannot reach the vicinity of the separation gas nozzle 241. Accordingly, the O3 gas is forced back toward the upstream side relative to the rotation direction (i.e. toward the process area 200P2) by the N2 gas ejected from the separation gas nozzle 241. Thus, the O3 gas is evacuated from the evacuation port 262 via the evacuation area 200E2 at the gap between the circumferential edge of the rotation table 202 and the inner circumferential wall of the chamber 201 along with the N2 gas ejected from the center portion area 200C.

Further, the BTBAS gas being ejected to a lower part of the first reaction gas nozzle 231 flows towards both the upstream and downstream sides relative to the rotation direction along the surface of the rotation table 202. Such BTBAS gas can hardly flow into the lower part of the sector-shaped convex portion 204 or is forced back towards the second process area 200P1. Thus, the BTBAS gas is evacuated from the evacuation port 261 via the evacuation area 200E1 at the gap between the circumferential edge of the rotation table 202 and the inner circumferential wall of the chamber 201 along with the N2 gas ejected from the center portion area 200C. In each of the separation areas 200D, reaction gases (BTBAS gas or O3 gas) flowing in the atmosphere are prevented from entering. However, the gas molecules adsorbed to the wafer W pass the separation area, that is, the lower part of the low ceiling surface 244 of the sector-shaped convex portion 204, to thereby contribute to film deposition.

Further, because the separation gases are ejected from the center portion area 200C to the circumferential edges of the rotation table 202, even if the BTBAS gas of the first process area 200P1 (O3 gas of the second process area 200P2) attempt to enter the center portion area 200C, the separation gases impede or force back the gases (even if the gases enter to some degree). Accordingly, the gases are prevented from flowing through the center portion area 200C and entering the second process area 200P2 (first process area 200P1).

In the separation area 200D because the circumferential edge parts of the sector-shaped convex portions 204 are bent downward and a gap between such bent portion 246 and an outer edge surface of the rotation table 202 is made narrow, gas can be substantially stopped from passing therethrough. Therefore, BTBAS gas of the first process area 200P1 (O3 gas of second process area 200P2) can be prevented from flowing into the second process area 200P2 (first process area 200P1) via the outer side of the rotation table 202. Therefore, the atmospheres of the first and second process areas 200P1, 200P2 are substantially completely separated by the two separation areas 200D. Thus, BTBAS gas can be evacuated from the evacuation port 261 and O3 gas can be evacuated from the evacuation port 262. As a result, even where both reaction gases (in this example, BTBAS gas and O3 gas) are in the atmosphere, the reaction gases do not mix above the wafer W.

In this example, because the lower part of the rotation table 202 is purged with N2 gas, BTBAS gas can be prevented from flowing into the area where O3 gas is supplied.

Hence, because the first and second process areas 200P1, 200P2 are connected to dedicated evacuation channels 263a, 263b via the evacuation areas 200E1, 200E2, each type of gas flowing into the first process area 200P1 and the first evacuation area 200E1 is evacuated from the first evacuation channel 263a and each type of gas flowing into the second process area 200P2 and the second evacuation area 200E2 is evacuated from the second evacuation channel 263b. Therefore, reaction gas supplied to a process area 200P1, 200P2 on one side can be evacuated outside of the chamber 201 without mixing with reaction gas supplied to a process area 200P2, 200P1 on the other side. Accordingly, after the film deposition process is finished, the transfer arm 210 sequentially transfers wafers W out of the vacuum chamber 201 in a manner opposite from the operation of transferring wafers W into the vacuum chamber 201.

An example of process parameters preferable in the film deposition apparatus according to this embodiment is listed below.

rotational speed of the rotation table 202: 1-500 rpm (in the case of the wafer W having a diameter of 300 mm)

pressure in the chamber 201: 1067 Pa (8 Torr)

wafer temperature: 350° C.

flow rate of BTBAS gas: 100 sccm flow rate of O3 gas: 10000 sccm flow rate of N2 gas from the separation gas nozzles 241, 242: 20000 sccm flow rate of N2 gas from the separation gas supplying pipe 251: 5000 sccm the number of rotations of the rotation table 202: 600 rotations (depending on the film thickness required)

With the above-described embodiment of the present invention, the following effects can be attained. In this embodiment, there is provided a vacuum chamber 201 having a rotation table 202 includes a first process area 200P1 to which a first reaction gas of BTBAS gas is supplied and a second process area 200P2 in which a second reaction gas of O3 is supplied. Further, the first and second process areas 200P1, 200P2 are separated from each other in a rotation direction of the rotation table 202. Further, separation areas 200D are interposed between the first and second process areas 200P1, 200P2 for supplying separation gas between the first and second process areas 200P1, 200P2 from separation gas supplying parts 241, 242. A thin film deposition process is performed by rotating the rotation table 202 having plural wafers W arranged in a rotation direction and layering plural silicon oxide layers of reaction products with first and second reaction gases of BTBAS gas and O3 gas. Evacuation is performed with an evacuation port 261 of a first evacuation channel 263a corresponding to the first process area 200P1 and an evacuation port 262 of a second evacuation channel 263b corresponding to the second process area 200P2. The evacuation system (evacuation channels 263a, 263b; pressure adjusting parts 265a, 265b; evacuation pumps 264a, 264b) of each of the process areas 200P1, 200P2 is independent from the other. Accordingly, in performing the thin film deposition process, BTBAS gas and O3 gas do not mix in the evacuation systems. Therefore, the possibility of reaction products being generated in the evacuation systems is extremely low.

Further, by providing low ceiling planes on both sides of the separation nozzle 241, 242 relative to the rotation direction, each reaction gas can be prevented from entering the separation areas 200D. Further, by ejecting separation gases from the center portion area 200C (partitioned by the rotation center part of the rotation table 202 and the chamber 201) to the circumferential edges of the rotation table 202 and diffusing the separation gas on both sides of the separation area, the separation gas ejected from the rotation center part and the reaction gases can be evacuated via the gaps between the circumferential edges of the rotation table 202 and the inner peripheral wall of the chamber 201. Thereby, different reaction gases can be prevented from being mixed, satisfactory film deposition can be performed, and generation of particles can be prevented. The present invention may be applied to a case of placing a single wafer W on the rotation table 202.

With the film deposition apparatus according to an embodiment of the present invention, a so-called ALD (or MLD) technique is performed by arranging plural wafers W on the rotation table 202 in a rotation direction of the rotation table 202 and then rotating the rotation table 202 for allowing the wafers W to pass the first and second process areas 200P1 and 200P2 in order. Therefore, compared to the above-described single-wafer deposition method, the film deposition apparatus requires no time for purging reaction gas and is able to perform film deposition with high throughput.

Figure 42:
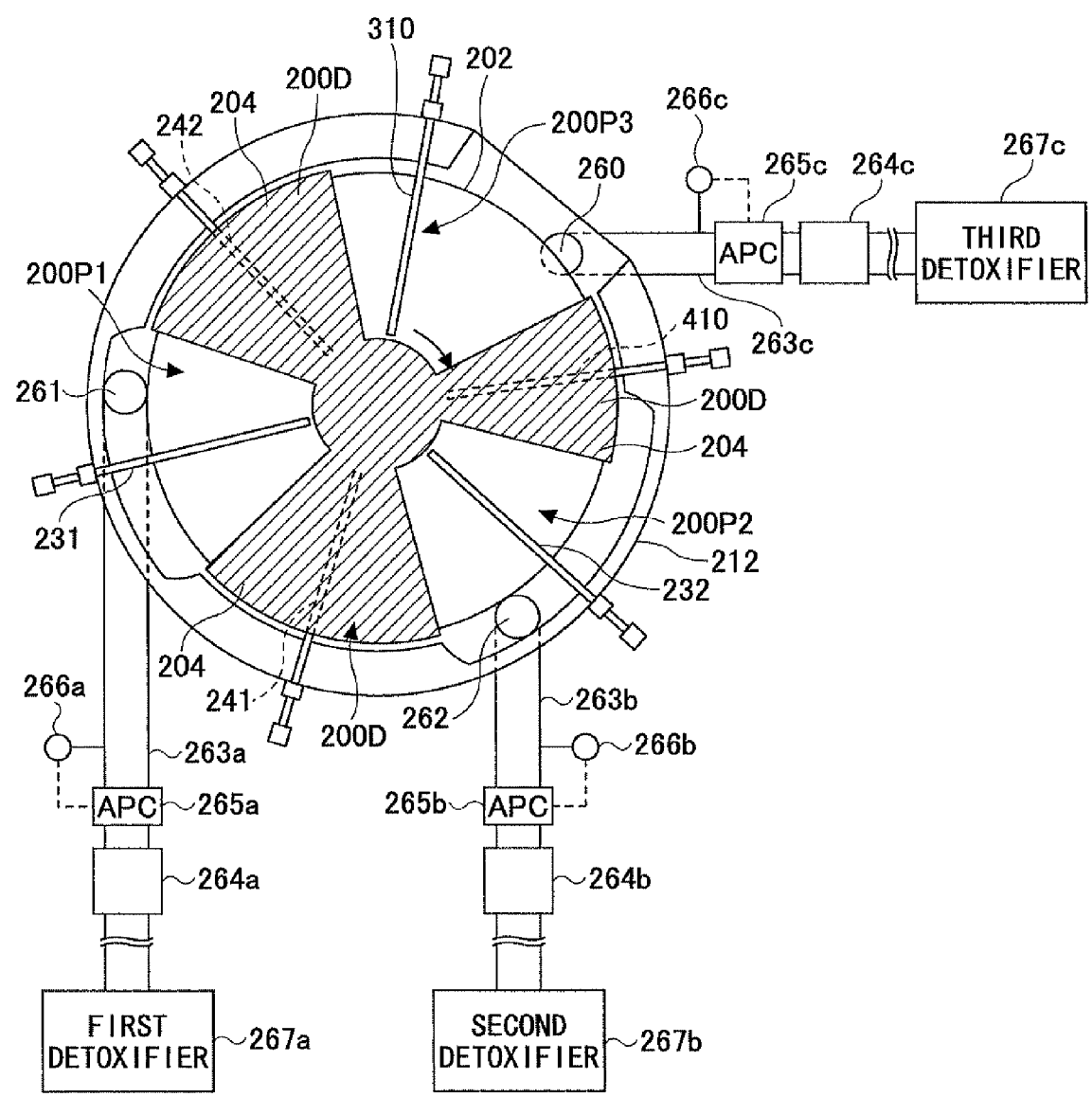
FIG. 42 is a horizontal cross-sectional plan view illustrating a modified example of the film deposition apparatus according to the third embodiment of the present invention.

It is to be noted that the evacuation system of the chamber 201 is not limited to two systems. For example, the film deposition apparatus illustrated in FIG. 42 is provided with a third process area 200P3 by adding the convex portion 204 above the rotation table 202. Accordingly, a third evacuation system (evacuation channel 263c, third pressure adjusting part 265c, vacuum pump 264) may be connected to the third process area 200P3. In FIG. 41, reference numeral 310 indicates a third reaction gas nozzle, reference numeral 410 indicates a separation gas nozzle, and reference numeral 260 indicates an evacuation port.

Further, the number of evacuation systems connected to each process area 200P1, 200P2 is not limited to one system. For example, two or more evacuation systems may be connected to each process area 200P1, 200P2.

Further, the method of operating the evacuation system is not limited to adjusting the pressure in the pressure areas 200P1, 200P2 corresponding to each evacuation system as described above. For example, a flow meter may be provided in each evacuation system. Thereby, the opening of the valves provided in the evacuation channels 263a, 263b can be adjusted so the amount of evacuation from each process area is a predetermined value. Further, the part used for adjusting pressure or the amount of evacuation is not limited to a valve. For example, pressure or amount of evacuation may be adjusted by changing the number of rotations of a mechanical booster pump of the vacuum pumps.

As for reaction gases that are used in the present invention other than those of the above-described embodiments of the present invention, there are dichlorosilane (DCS), hexachlorodisilane (HCD), Trimethyl Aluminum (TMA), tris(dimethyl amino) silane (3DMAS), tetrakis-ethyl-methyl-aminozirconium (TEMAZr), tetrakis-ethyl-methyl-amino-hafnium (TEMHf), bis(tetra methyl heptandionate) strontium (Sr (THD)$_2$), (methyl-pentadionate)(bis-tetra-methyl-heptandionate) titanium (Ti(MPD) (THD)), monoamino-silane, or the like.

Figure 43A:
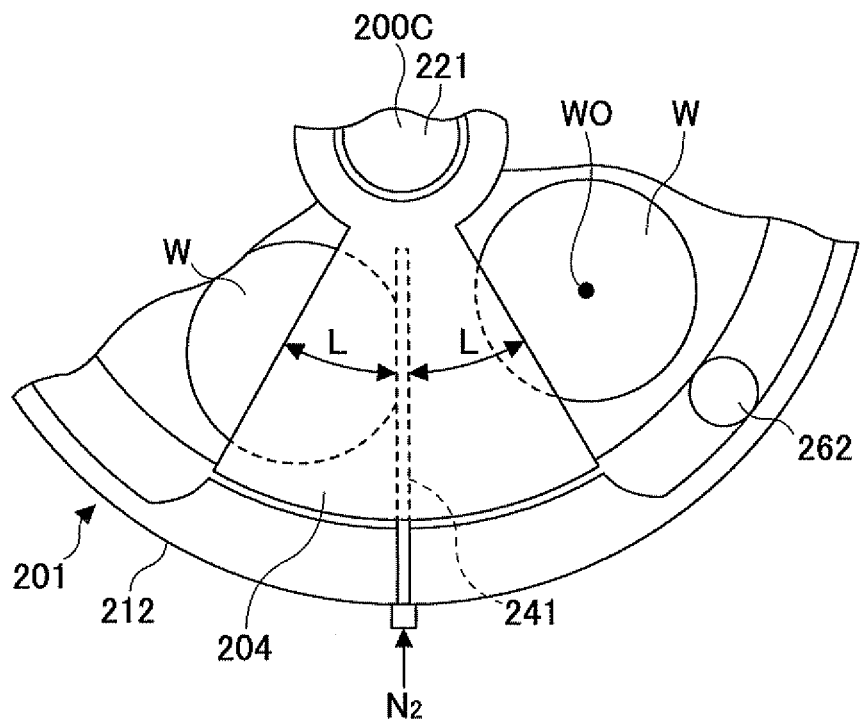
FIGS. 43A and 43B are schematic diagrams for describing measurements of a convex portion used as a separation area according to the third embodiment of the present invention.
Figure 43B:
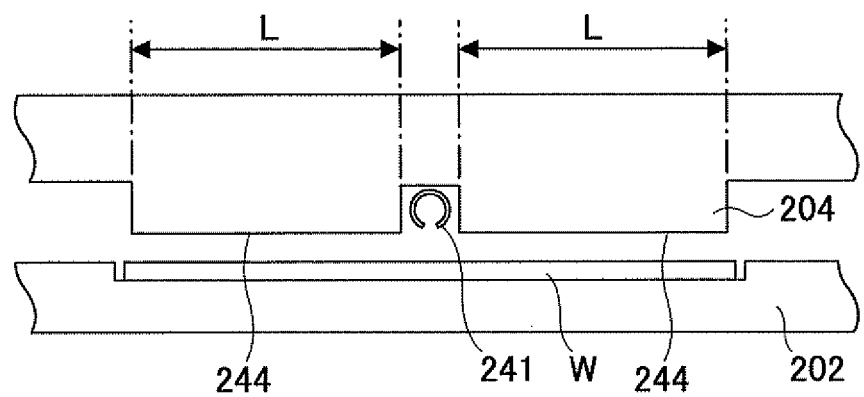

As illustrated in FIGS. 43A and 43B, in a case where a wafer W having a diameter of, for example, 300 mm is used as the target substrate, the first ceiling surface 244 that creates the thin space in both sides of the separation gas nozzle 241 (242) is preferred to have a width L equal to or greater than 50 mm in the rotation direction of the rotation table 202 at a portion where the center WO of the wafer W passes. In order to effectively prevent reaction gases from entering an area below the convex portion 204 from both sides of the convex portion 204, it is necessary to reduce the distance between the first ceiling surface 244 and the rotation table 202 in a case where the width L is small. Further, in a case where a predetermined length is set to the distance between the first ceiling surface 244 and the rotation table 202, the speed of the rotation table 202 becomes faster the farther away from the rotation center of the rotation table 202. Therefore, the width L required for attaining a reaction gas impeding effect becomes greater the farther away from the rotation center. When the length L is less than 50 mm, the distance between the ceiling surface 244 and the rotation table 202 is to be made significantly small. Accordingly, in order to prevent the rotation table 202 or the wafer W from colliding with the ceiling surface 244, it is necessary to reduce the vibration of the rotation table 202 as much as possible. Further, it becomes easier for reactions gases to enter the lower part of the convex portion 204 from upstream of the convex portion 204 as the number of rotations of the rotation table 202 increases. Thus, when the width L is less than 50 mm, it becomes necessary to reduce the number of rotations of the rotation table 202 which is rather disadvantageous in terms of production throughput. Therefore, it is preferable for the width L to be equal to or greater than 50 mm. Nevertheless, the effects of the present invention may still be attained where the length L is equal to or less than 50 mm. In other words, it is preferable for the width L to be $1/10$-$1/1$ compared to the diameter of the wafer W, and more preferably about $1/6$ or greater than the diameter of the wafer W. For the sake of convenience, the concave portion 224 is not illustrated in FIG. 43A.

Figure 44:
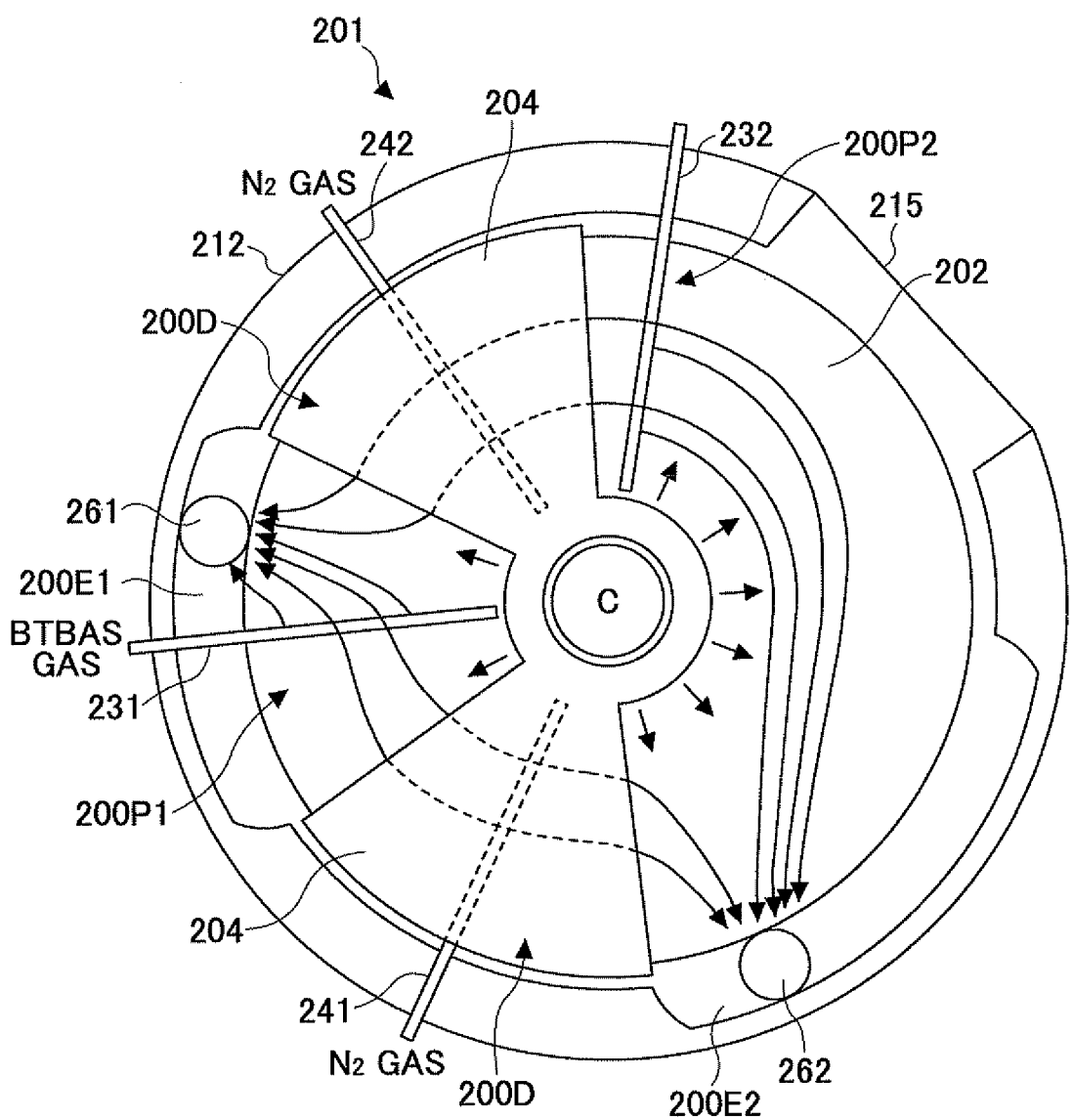
FIG. 44 is a horizontal schematic diagram illustrating a film deposition apparatus according to another embodiment of the present invention.

Examples of the layout of the process areas 200P1, 200P2 and the separation areas 200D other than the above-described embodiments of the present invention are described below. FIG. 44 illustrates an example where the second reaction nozzle 232 is positioned upstream from the transfer opening 215 with respect to the rotation direction of the rotation table 202. The same effect as the above-described embodiments of the present invention can be attained even with this layout.

Figure 45:
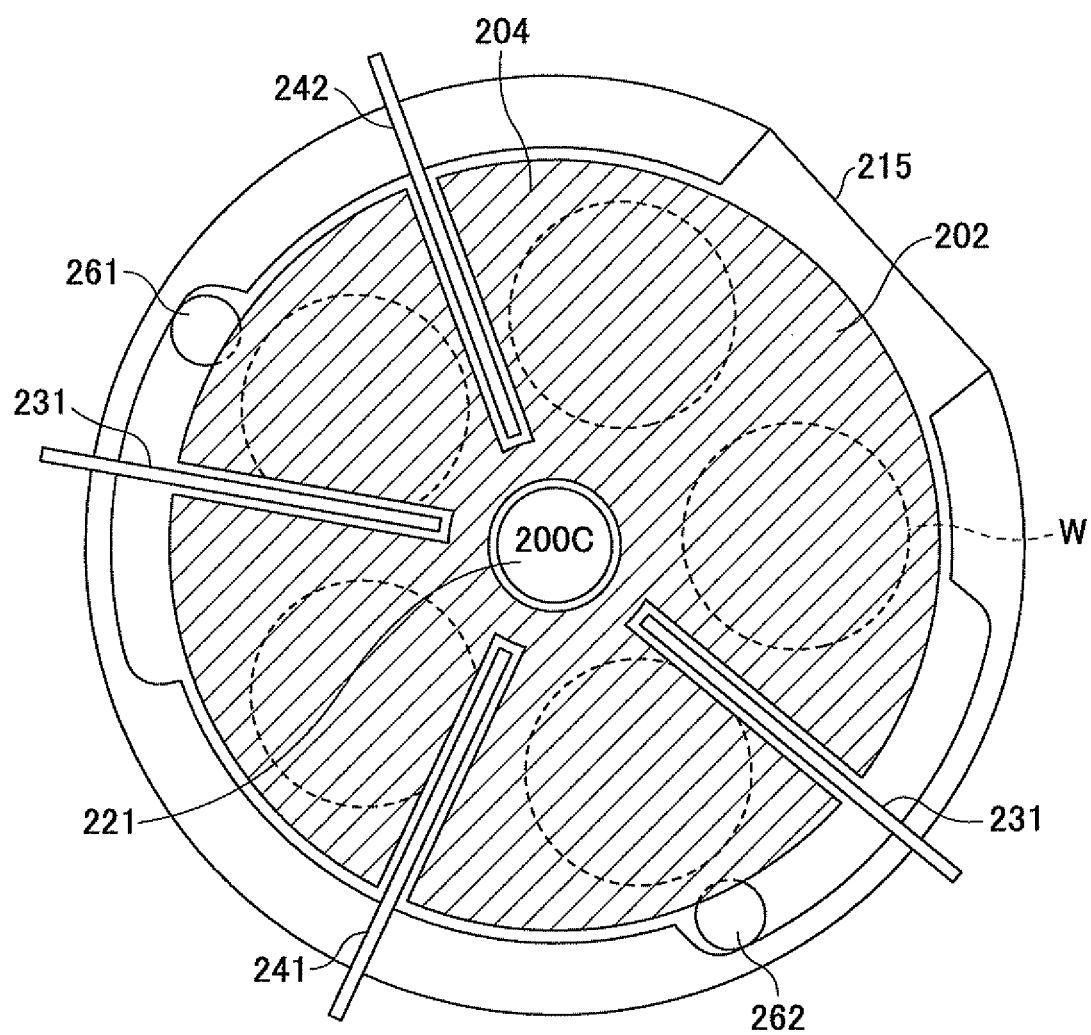
FIG. 45 is a horizontal cross-sectional plan view illustrating a film deposition apparatus according to another embodiment of the present invention.

In this embodiment, as illustrated in FIG. 45, in addition to providing low ceiling surfaces (first ceiling surfaces) 244 on both sides of the separation gas nozzle 241 (242) for forming narrow gaps, low ceiling surfaces are also provided on both sides of the reaction gas nozzle 231 (232), so that the ceiling surfaces are formed to be continuous. In other words, even in a case where the convex portion 204 is provided to the entire area facing the rotation table 202, the same effect can be attained except at the areas other than the areas where the separation gas nozzle 241 (242) and the reaction gas nozzle 231 (232) are provided. From a different standpoint, this configuration has the first ceiling surfaces 244 on both sides of the separation gas nozzle 241 (242) extending to the reaction gas nozzle 231 (232). In this case, although the separation gas diffusing to both sides of the separation nozzle 241 (242) and separation gas diffusing to both sides of the reaction gas nozzle 231 (232) merge at a lower part of the convex portion 204 (narrow gap), the gases are evacuated from the evacuation port 261 (262) positioned between the separation gas nozzle 242 (241) and the reaction gas nozzle 231 (232).

Figure 46:
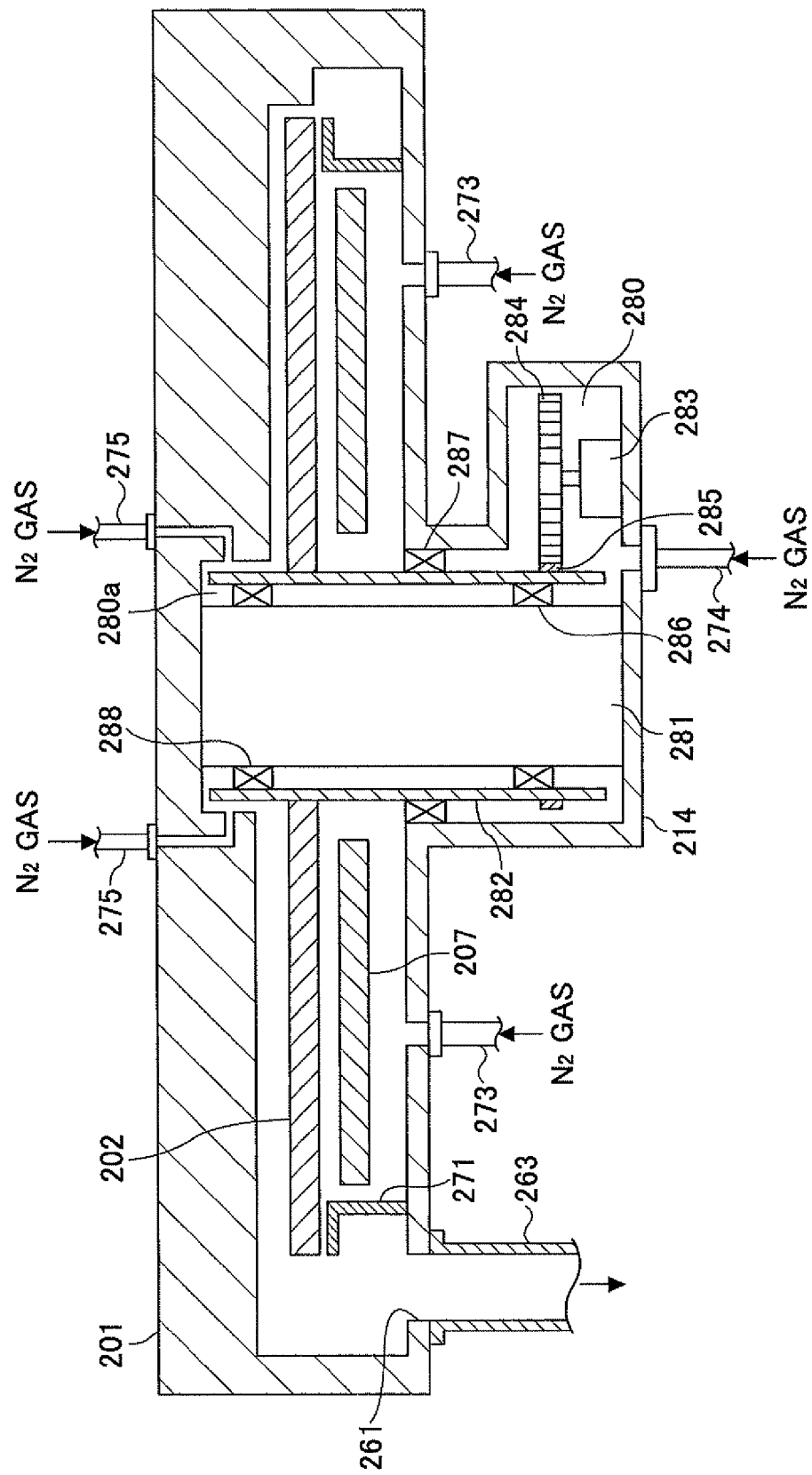
FIG. 46 is a vertical cross-sectional view illustrating a film deposition apparatus according to another embodiment of the present invention.

In the above embodiments, the rotation shaft 222 for rotating the rotation table 202 is located in the center portion of the chamber 201. In the above-described embodiment of the present invention, the space between the core portion of the rotation table 202 and the upper surface of the chamber 201 is purged with the separation gas. However, the chamber 201 may be configured as illustrated in FIG. 46. In the film deposition apparatus of FIG. 46, the bottom portion 214 of the center area of the chamber 201 includes a housing space 280 of a driving portion and a concave portion 280a formed on the upper surface of the center portion of the chamber 201. A pillar 281 is placed between the bottom surface of the housing space 280 and the upper surface of the concave part 280a at the center portion of the chamber 201 for preventing the first reaction gas (BTBAS) ejected from the first reaction gas nozzle 231 and the second reaction gas (O3) ejected from the second reaction gas nozzle 232 from being mixed through the center portion of the chamber 201.

In addition, a rotation sleeve 282 is provided so that the rotation sleeve 282 coaxially surrounds the pillar 281. A ring-shape rotation table 202 is provided along the rotation sleeve 282. Further, a driving gear portion 284, which is driven by a motor 283, is provided in the housing space 280. The rotation sleeve 282 is rotated by the driving gear portion 284 via a gear portion 285 formed on the outer surface of the rotation sleeve 282. Reference numerals 286, 287, and 288 indicate bearings. A purge gas supplying pipe 274 is connected to a bottom part of the housing space 280, so that a purge gas is supplied into the housing space 280. Another purge gas supplying pipe 275 is connected to an upper part of the housing space 280, so that a purge gas is supplied between a side surface of the concave portion 280a and an upper edge part of the rotation sleeve 282. Although opening parts for supplying the purge gas to the space between the side surface of the concave portion 280a and the upper edge part of the rotation sleeve 282 are illustrated in a manner provided on two areas (one on the left and one on the right) in FIG. 46, the number of the opening parts (purge gas supplying port) may be determined so that the purge gas from the BTBAS gas and the O3 gas in the vicinity of the rotation sleeve 282 can be prevented from being mixed.

In the embodiment illustrated in FIG. 46, a space between the side wall of the concave portion 280a and the upper end portion of the rotation sleeve 282 corresponds to the ejection hole for ejecting the separation gas. Thus, in this embodiment, the ejection hole, the rotation sleeve 282, and the pillar 281 constitute the center portion area provided at a center part of the chamber 201.

Figure 47:
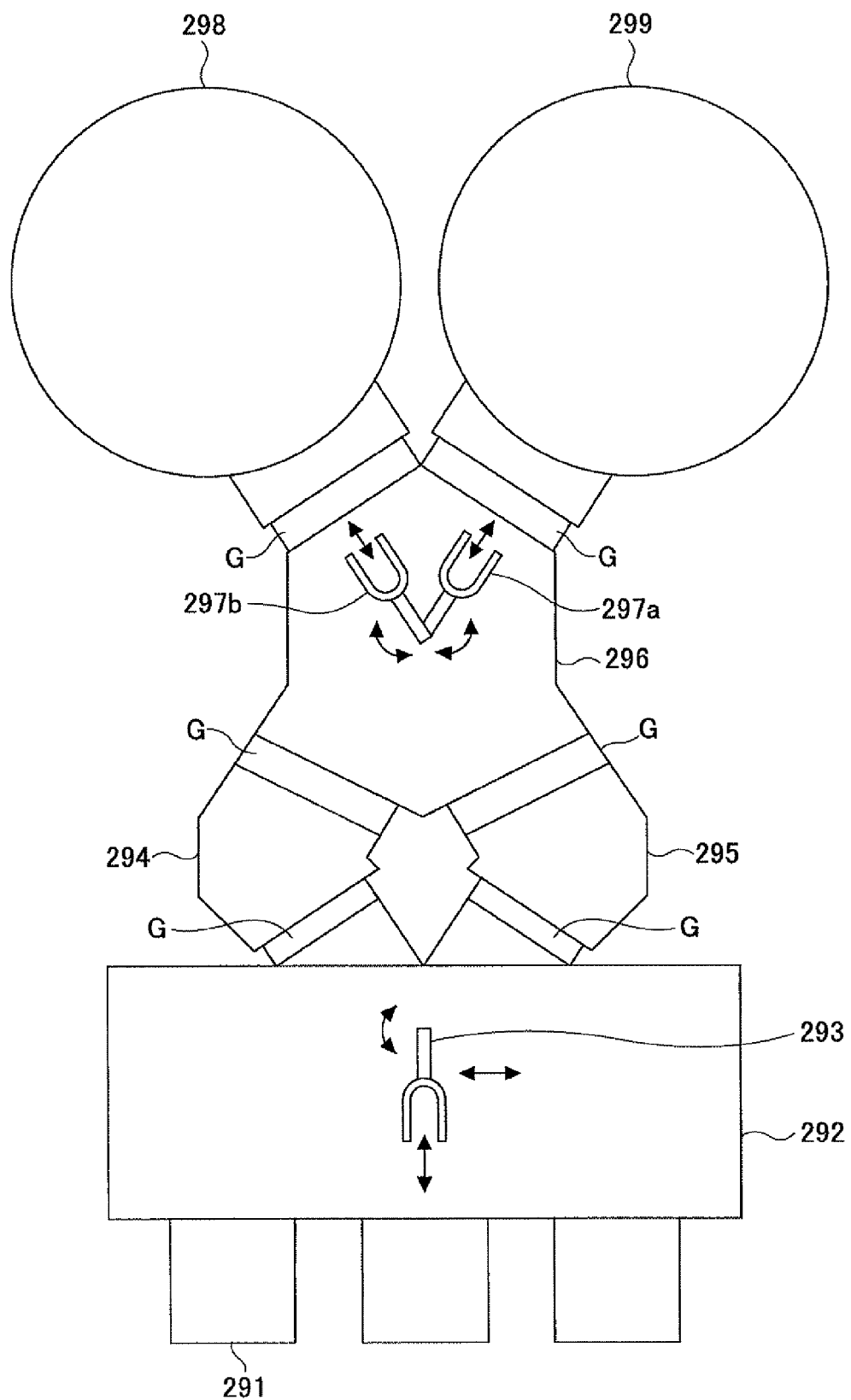
FIG. 47 is a schematic plan view illustrating another example of a substrate processing system using a film deposition apparatus of the present invention.

The film deposition apparatus according to embodiments of the present invention may be integrated into a wafer process apparatus, an example of which is schematically illustrated in FIG. 47. The wafer process apparatus includes an atmospheric transfer chamber 292 in which a transfer arm 293 is provided, load lock chambers (preparation chambers) 294, 295 whose atmosphere is changeable between vacuum and atmospheric pressure, a vacuum transfer chamber 296 in which two transfer arms 297 are provided, and film deposition apparatuses 298, 299 according to embodiments of the present invention. In addition, the wafer process apparatus includes cassette stages (not shown) on which a wafer cassette 291 such as a Front Opening Unified Pod (FOUP) is placed. The wafer cassette 291 is brought onto one of the cassette stages, and connected to a transfer in/out port provided between the cassette stage and the atmospheric transfer chamber 292. Then, a lid of the wafer cassette (FOUP) 291 is opened by an opening/closing mechanism (not shown) and the wafer is taken out from the wafer cassette 291 by the transfer arm 293. Next, the wafer is transferred to the load lock chamber 294 (295). After the load lock chamber 294 (295) is evacuated, the wafer in the load lock chamber 294 (295) is transferred further to one of the film deposition apparatuses 298, 299 through the vacuum transfer chamber 296 by the transfer arm 297a (297b). In the film deposition apparatus 298 (299), a film is deposited on the wafer in such a manner as described above. Because the wafer process apparatus has two film deposition apparatuses 298, 299 that can house five wafers at a time, the ALD (or MLD) mode deposition can be performed at high throughput.

Further, the present invention is not limited to these embodiments, but variations and modifications may be made without departing from the scope of the present invention.

What is claimed is:

1. A film deposition apparatus for depositing a film on a substrate by carrying out a cycle of alternately supplying at least two kinds of reaction gases that react with each other to the substrate to produce a layer of a reaction product in a chamber, the film deposition apparatus comprising:
   a rotation table provided in the chamber, the rotation table having a substrate receiving area for mounting the substrate thereon;
   a first reaction gas supplying part configured to supply a first reaction gas to one surface of the rotation table on which the substrate receiving area is provided;
   a second reaction gas supplying part configured to supply a second reaction gas to the one surface, the second reaction gas supplying part being separated from the first reaction gas supplying part along a circumferential direction of the rotation table;
   a separation area located along the circumferential direction between a first process area to which the first reaction gas is supplied and a second process area to which the second reaction gas is supplied, the separation area including a separation gas supplying part from which a separation gas is supplied;
   a first evacuation channel having an evacuation port between the first process area and the separation area;
   a second evacuation channel having an evacuation port between the second process area and the separation area;
   a first evacuation part connected to the first evacuation channel via a first valve;
   a second evacuation part connected to the second evacuation channel via a second valve;
   a first pressure detecting part interposed between the first valve and the first evacuation part;
   a second pressure detecting part interposed between the second valve and the second evacuation part;
   a process pressure detecting part provided in at least one of the first and second valves; and
   a control part configured to output a control signal for regulating a flow ratio between gases flowing into the first and second evacuation channels and controlling opening of the first and second valves based on a pressure detection value detected from each of the first and second pressure detecting parts, and a pressure detection value detected from the process pressure detecting part, and compare the pressure detection value detected from each of the first and second pressure detecting parts and the pressure detection value detected from the process pressure detecting part, so that each of the pressure inside the chamber and the flow ratio between the gases flowing in the first and second evacuation channels becomes a predetermined value, respectively;
   wherein the separation gas supplying part is provided inside a groove portion that extends in a radial direction of the chamber,
   wherein the chamber includes a ceiling plate having a first ceiling surface and a second ceiling surface positioned higher than the first ceiling surface, the ceiling plate including a convex portion projecting from the second ceiling surface of the ceiling plate,
   wherein the first ceiling surface is positioned closer to the rotation table than the second ceiling surface in a height direction of the film deposition apparatus,
   wherein the separation gas supplied from the separation gas supplying part flows in a space between the first ceiling surface and the rotation table,
   wherein the groove portion is formed in the first ceiling surface,
   wherein when the first ceiling surface is positioned above the substrate receiving area in-between the first reaction gas supplying part and the second reaction gas supplying part, the separating gas is supplied to impede the first and second reaction gases from entering the space while gas adsorbed on the substrate can pass through the space.

2. The film deposition apparatus as claimed in claim 1, further comprising a non-transitory computer-readable medium having a program embodied therein for causing the control part to execute
   a first step of adjusting the opening of the first valve so that a pressure value of the process pressure detecting part becomes a predetermined value, and
   a second step of adjusting the opening of the second valve so that the flow ratio becomes the predetermined value.

3. The film deposition apparatus as claimed in claim 2, wherein the program is configured to cause the control part to repeat the first and second steps within a predetermined number of times until each of the pressure inside the chamber and the flow ratio becomes the predetermined value.

4. The film deposition apparatus as claimed in claim 2, wherein the program is configured to cause the control part to execute a third step of adjusting an evacuation flow ratio of at least one of the first and second evacuation part after executing the second step so that the flow ratio becomes the predetermined value.

5. The film deposition apparatus as claimed in claim 4, wherein the program is configured to cause the control part to repeat the first and second steps within a predetermined number of times until each of the pressure inside the chamber and the flow ratio becomes the predetermined value after executing the third step.

6. The film deposition apparatus as claimed in claim 1, wherein the control part is further configured to output a control signal performing a film deposition process by supplying inert gas from each of the first and second reaction gas supplying parts, adjusting the pressure inside the chamber and the flow ratio, and then switching the inert gas supplied from each of the first and second reaction gas supplying parts to the first reaction gas and the second reaction gas.

7. The film deposition apparatus as claimed in claim 1, wherein the first and second evacuation channels merge and connect to a common evacuation part instead of connecting to the first and second evacuation parts.

8. The film deposition apparatus as claimed in claim 1, wherein the first and second ceiling surfaces are located on both sides of the separation gas supplying part relative to a rotation direction for forming a narrow space between the rotation table and the first and second ceiling surfaces for allowing a separation gas to flow from the separation areas to the first and second process areas.

9. The film deposition apparatus as claimed in claim 1, further comprising:
a center portion area located at a center portion of the chamber for separating atmospheres of the first and second process areas,
wherein the center portion area has an ejection opening that ejects the separation gas to the one surface of the rotation table;
wherein the first and second reaction gases are evacuated from the evacuation ports along with the separation gas diffused on both sides of the separation area and the separation gas ejected from the center portion area.

10. The film deposition apparatus as claimed in claim 9, wherein the center portion area is partitioned into a rotation center part of the rotation table and an upper surface side of the chamber, wherein a separation gas is purged to the center portion area.

11. A film deposition apparatus for depositing a film on a substrate by carrying out a cycle of alternately supplying at least two kinds of reaction gases that react with each other to the substrate to produce a layer of a reaction product in a chamber, the film deposition apparatus comprising:
a rotation table provided in the chamber, the rotation table having a substrate receiving area for mounting the substrate thereon;
a first reaction gas supplying part configured to supply a first reaction gas to one surface of the rotation table on which the substrate receiving area is provided;
a second reaction gas supplying part configured to supply a second reaction gas to the one surface, the second reaction gas supplying part being separated from the first reaction gas supplying part along a circumferential direction of the rotation table;
a separation area located along the circumferential direction between a first process area to which the first reaction gas is supplied and a second process area to which the second reaction gas is supplied, the separation area including a separation gas supplying part from which a separation gas is supplied;
a first evacuation channel having an evacuation port between the first process area and the separation area;
a second evacuation channel having an evacuation port between the second process area and the separation area;
a first evacuation part connected to the first evacuation channel via a first valve;
a second evacuation part connected to the second evacuation channel via a second valve;
a first process pressure detecting part interposed between the first valve and the first evacuation part and configured to detect a pressure of the first evacuation channel;
a second process pressure detecting part interposed between the second valve and the second evacuation part and configured to detect a pressure of the second evacuation channel; and
a control part configured to compare a pressure detection value detected from each of the first and second pressure detecting parts and output a control signal for regulating a flow ratio between gases flowing into the first and second evacuation channels and controlling opening of the first and second valves based on a comparison result of a pressure detection value detected from each of the first and second pressure detecting parts so that each of the pressure inside the chamber and the pressure difference between the first and second process areas becomes a predetermined value, respectively;
wherein the separation gas supplying part is provided inside a groove portion that extends in a radial direction of the chamber,
wherein the chamber includes a ceiling plate having a first ceiling surface and a second ceiling surface positioned higher than the first ceiling surface, the ceiling plate including a convex portion projecting from the second ceiling surface of the ceiling plate,
wherein the first ceiling surface is positioned closer to the rotation table than the second ceiling surface in a height direction of the film deposition apparatus,
wherein the separation gas supplied from the separation gas supplying part flows in a space between the first ceiling surface and the rotation table,
wherein the groove portion is formed in the first ceiling surface,
wherein when the first ceiling surface is positioned above the substrate receiving area in-between the first reaction gas supplying part and the second reaction gas supplying part, the separating gas is supplied to impede the first and second reaction gases from entering the space while gas adsorbed on the substrate can pass through the space.

12. The film deposition apparatus as claimed in claim 11, wherein the control part includes a program for causing the control part to execute
a first step of adjusting the opening of the first valve so that a pressure value of the first process pressure detecting part becomes a predetermined value, and
a second step of adjusting the opening of the second valve so that the pressure difference becomes a predetermined value.

13. The film deposition apparatus as claimed in claim 12, wherein the program is configured to cause the control part to repeat the first and second steps within a predetermined number of times until each of the pressure inside the chamber and the pressure difference becomes the predetermined value.

14. The film deposition apparatus as claimed in claim 12, wherein the program is configured to cause the control part to execute a third step of adjusting an evacuation flow ratio of at least one of the first and second evacuation part after executing the second step so that the pressure difference becomes the predetermined value.

15. The film deposition apparatus as claimed in claim 14, wherein the program is configured to cause the control part to repeat the first and second steps within a predetermined number of times until each of the pressure inside the chamber and the pressure difference becomes the predetermined value after executing the third step.

16. The film deposition apparatus as claimed in claim 11, wherein the control part is configured to output the control signal for performing a film deposition process by supplying inert gas from each of the first and second reaction gas supplying parts, adjusting the pressure inside the chamber and the pressure difference, and then switching the inert gas supplied from each of the first and second reaction gas supplying parts to the first reaction gas and the second reaction gas.

17. The film deposition apparatus as claimed in claim 16, wherein a total flow rate of gas supplied into the chamber before the switching of gases is set to be substantially equal to a total flow rate of gas supplied into the chamber after the switching of gases.

18. A substrate processing apparatus comprising:
 a vacuum transfer chamber including a substrate transfer part;
 the film deposition apparatus claimed in claim 1 for hermetically sealing the vacuum transfer chamber; and
 a preparation chamber that can switch between atmospheres of a vacuum chamber and an atmospheric atmosphere.

19. A film deposition apparatus for depositing a film on a substrate by carrying out a cycle of alternately supplying at least two kinds of reaction gases that react with each other to the substrate to produce a layer of a reaction product in a chamber, the film deposition apparatus comprising:
 a rotation table provided in the chamber, the rotation table having a substrate receiving area for mounting the substrate thereon;
 a first reaction gas supplying part configured to supply a first reaction gas to one surface of the rotation table on which the substrate receiving area is provided;
 a second reaction gas supplying part configured to supply a second reaction gas to the one surface, the second reaction gas supplying part being separated from the first reaction gas supplying part along a circumferential direction of the rotation table;
 a separation area located along the circumferential direction between a first process area to which the first reaction gas is supplied and a second process area to which the second reaction gas is supplied, the separation area including a separation gas supplying part from which a separation gas is supplied;
 first and second ceiling surfaces located on both sides of the separation gas supplying part relative to a rotation direction for forming a narrow space between the rotation table and the first and second ceiling surfaces for allowing the separation gas to flow from the separation area to the first and second process areas;
 a center portion area located at a center part of the chamber, the center portion area having an ejecting port for ejecting the separation gas to the one surface of the rotation table;
 a first evacuation channel having an evacuation port between the first process area and the separation area;
 a second evacuation channel having an evacuation port between the second process area and the separation area;
 a first gauge connected to the first evacuation channel and configured to measure a pressure of the first process area;
 a second gauge connected to the second evacuation channel and configured to measure a pressure of the second process area;
 a first pressure adjustment part configured to adjust the pressure of the first process area based on the pressure measured by first gauge;
 a second pressure adjustment part configured to adjust the pressure of the second process area based on the pressure measured by the second gauge;
 a first evacuation part connected to the first evacuation channel via the first pressure adjustment part; and
 a second evacuation part connected to the second evacuation channel via the second pressure adjustment part;
 a control part configured to compare a pressure detection value detected from each of the first and second process areas and output a control signal for regulating a flow ratio between gases flowing into the first and second evacuation channels and controlling opening of the first and second valves based on a comparison result of a pressure detection value detected from each of the first and second pressure detecting parts so that each of the pressure inside the chamber and the pressure difference between the first and second process areas becomes a predetermined value, respectively;
 wherein the separation gas supplying part is provided inside a groove portion that extends in a radial direction of the chamber,
 wherein the chamber includes a ceiling plate having the first ceiling surface and the second ceiling surface that is positioned higher than the first ceiling surface, the ceiling plate including a convex portion projecting from the second ceiling surface of the ceiling plate,
 wherein the first ceiling surface is positioned closer to the rotation table than the second ceiling surface in a height direction of the film deposition apparatus,
 wherein the separation gas supplied from the separation gas supplying part flows in a space between the first ceiling surface and the rotation table,
 wherein the groove portion is formed in the first ceiling surface,
 wherein when the first ceiling surface is positioned above the substrate receiving area in-between the first reaction gas supplying part and the second reaction gas supplying part, the separating gas is supplied to impede the first and second reaction gases from entering the space while gas adsorbed on the substrate can pass the space.

20. The film deposition apparatus as claimed in claim 19, wherein the evacuation ports of the first and second evacuation channels are provided below the rotation table for evacuating the first and second reaction gases from the first and second process areas via a gap between a circumferential edge of the rotation table and an inner circumferential wall of the chamber.

21. The film deposition apparatus as claimed in claim 19, further comprising:
 a first detoxifier provided downstream of the first evacuation part for detoxifying ejected matter from the first evacuation part; and
 a second detoxifier provided downstream of the second evacuation part for detoxifying ejected matter from the second evacuation part.

22. The film deposition apparatus as claimed in claim 19, wherein the separation area has a higher pressure than the first and second process areas.

23. The film deposition apparatus as claimed in claim 19, wherein the separation gas supplying part has gas ejection ports provided at a rotation center part of the rotation table and at a circumferential edge part extending from one side to the other side of the rotation table.

24. The film deposition apparatus as claimed in claim 19, further comprising:
a heating part for heating the rotation table.

25. The film deposition apparatus as claimed in claim 19, wherein the first and second ceiling surfaces that form the narrow space have a distance of about 50 mm or more along an arc corresponding to a route through which a center of the substrate passes when the rotation table rotates.

26. The film deposition apparatus as claimed in claim 19, wherein the first and second ceiling surfaces at the separation area include a portion located upstream of the separation gas supplying part having an increasingly greater width relative to the rotation direction the closer the portion is to an outer edge part.

27. The film deposition apparatus as claimed in claim 19, wherein the first and second ceiling surfaces at the separation area include a portion located upstream of the separation gas supplying part having a sector shape.

* * * * *